United States Patent
Yamakoshi et al.

(10) Patent No.: US 8,304,820 B2
(45) Date of Patent: Nov. 6, 2012

(54) SEMICONDUCTOR DEVICE UTILIZING DUMMY GATE TO ENHANCE PROCESSING PRECISION

(75) Inventors: Hideaki Yamakoshi, Tokyo (JP);
Hideyuki Yashima, Tokyo (JP);
Shinichiro Abe, Tokyo (JP); Yasuhiro Taniguchi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/304,350

(22) Filed: Nov. 24, 2011

(65) Prior Publication Data

US 2012/0061745 A1     Mar. 15, 2012

Related U.S. Application Data

(63) Continuation of application No. 12/753,075, filed on Apr. 1, 2010, now Pat. No. 8,076,191.

(30) Foreign Application Priority Data

Apr. 2, 2009     (JP) .................................. 2009-090028

(51) Int. Cl.
*H01L 29/76*     (2006.01)

(52) U.S. Cl. ......................................................... 257/288
(58) Field of Classification Search .......................... None
See application file for complete search history.

(56) References Cited

U.S. PATENT DOCUMENTS 7,601,581 B2   10/2009   Taniguchi et al.
7,859,045 B2   12/2010   Nakagawa et al.

FOREIGN PATENT DOCUMENTS

JP     2007-234861 A     9/2007

*Primary Examiner* — Scott B Geyer
(74) *Attorney, Agent, or Firm* — Miles & Stockbridge P.C.

(57) ABSTRACT

Processing of memory cells forming a nonvolatile memory in a semiconductor device. A second polysilicon film is formed in such a manner as to cover a first polysilicon film and a dummy gate electrode. Thus, the second polysilicon film is formed reflecting the shapes of a step difference portion and a gap groove. Particularly, in the second polysilicon film covering the gap groove, a concave part is formed. Subsequently, over the second polysilicon film, an antireflection film is formed. Thus, the antireflection film having high flowability flows from the higher region to the lower region of the step difference portion, but is stored in a sufficient amount in the concave part. Accordingly, the antireflection film is supplied from the concave part so as to compensate for the amount of the antireflection film to flow out therefrom.

8 Claims, 36 Drawing Sheets

SEMICONDUCTOR DEVICE UTILIZING DUMMY GATE TO ENHANCE PROCESSING PRECISION

CROSS-REFERENCE TO RELATED APPLICATIONS

This application is a continuation of application Ser. No. 12/753,075 filed Apr. 1, 2010 (now U.S. Pat. No. 8,076,191). Also, the disclosure of Japanese Patent Application No. 2009-90028 filed on Apr. 2, 2009 including the specification, drawings and abstract is incorporated herein by reference in its entirety.

BACKGROUND OF THE INVENTION

The present invention relates to a manufacturing technology of a semiconductor device. More particularly, it relates to a technology effectively applicable to manufacturing of an electrically rewritable nonvolatile memory.

In Japanese Unexamined Patent Publication No. 2007-234861 (Patent Document 1), for example, there is described a manufacturing step of a semiconductor device shown in FIGS. 20 to 24 of Patent Document 1. Specifically, over a semiconductor substrate 20, a gate insulation film 34 is formed. Over the gate insulation film 34, a polysilicon film 37 and a cap insulation film 38 are formed (FIG. 20 of Patent Document 1). Then, portions of the cap insulation film 38, the polysilicon film 37, and the gate insulation film 34 in a memory cell formation region are removed (FIG. 21 of Patent Document 1). Then, entirely over the main surface of the semiconductor substrate 20, a gate insulation film 26, an electric charge storage film 27, an insulation film 28, a polysilicon film 29, and a cap insulation film 32 are successively formed (FIG. 22 of Patent Document 1).

Subsequently, in the memory cell formation region, a gate electrode 44 of the memory cell is formed (FIG. 23 of Patent Document 1). Then, in a low breakdown voltage MISFET formation region and a high breakdown voltage MISFET formation region, gate electrodes 39 and 40 are formed, respectively.

[Patent Document 1] Japanese Unexamined Patent Publication No. 2007-234861

SUMMARY OF THE INVENTION

As a result of a study by the present inventors, it has been revealed that the technology described in the Patent Document 1 has the following problem. Namely, for forming the gate electrode 44 of the memory cell in the memory cell formation region, a photolithography technology is used. Specifically, there is a step difference portion between a portion of the cap insulation film 32 formed in the memory cell formation region and portions of the cap insulation film 32 formed in the low breakdown voltage MISFET formation region and the high breakdown voltage MISFET formation region (which will be referred to as a peripheral region). Then, with the photolithography technology, over the cap insulation film 32 having the step difference portion, an antireflection film is coated. Over the antireflection film, a resist film is formed. Then, the formed resist film is subjected to exposure/ development processings, thereby to be patterned. The patterning is carried out so that a portion of the resist film is left in a region in which the gate electrode 44 of the memory cell is formed of the memory cell formation region. In FIG. 23 of Patent Document 1, one gate electrode 44 is formed in the memory cell formation region. However, in actuality, a plurality of gate electrodes 44 are formed in the memory cell formation region.

Herein, when the resist film is subjected to an exposure processing via a mask, a portion of the resist film in the region covered with the mask is also applied with an exposure light due to irregular reflection from a film present in a layer underlying the resist film. As a result, patterning according to the design values may become unable to be performed. Thus, by forming an antireflection film in a layer underlying the resist film, irregular reflection from the film formed in a layer underlying the resist film is inhibited. However, as described above, when there are the memory cell formation region and the peripheral region, a step difference portion is formed in the to-be-processed film (e.g., the cap insulation film 32) formed in the memory cell formation region and the peripheral region. Accordingly, the antireflection film to be formed over the cap insulation film 32 is also formed reflecting the step difference portion. At this step, the antireflection film is generally formed with a coating process, and is high in flowability. For this reason, in the vicinity of the step portion, a portion of the antireflection film applied in the higher region of the step difference portion flows to the lower region of the step difference portion, resulting in elimination of the portion of the antireflection film applied in the higher region of the step difference portion. The present inventors newly found this fact. This results in that the antireflection film has not been sufficiently formed in the higher region of the step difference portion. As a result, an exposure light incident upon this region undergoes irregular reflection, leading to a high risk of occurrence of unintended sensitization. Specifically, the step difference portion is formed in the boundary region between the memory cell formation region and the peripheral region. Irregular reflection in the vicinity of the step difference portion most affects the gate electrode 44 formed in the outermost peripheral region of the memory cell formation region. In other words, in the gate electrode 44 formed in the outermost periphery of the memory cell formation region, unintended sensitization is caused to the patterned resist film. As a result, the dimensions of the pattern of the resist film become smaller than the design dimensions of the gate electrode 44. This results in occurrence of a phenomenon that the gate length of the gate electrode 44 formed in the outermost periphery of the memory cell formation region becomes smaller than the design value. Therefore, there occurs a problem that the processing precision of the memory cell is deteriorated.

It is an object of the present invention to provide a technology capable of improving the processing precision of a memory cell (specifically, a memory gate electrode of a memory cell) forming a nonvolatile memory in a semiconductor device including the nonvolatile memory.

The foregoing and other objects and novel features of the present invention will be apparent from the description of this specification and the accompanying drawings.

Summaries of the representative ones of the inventions disclosed in the present application will be described in brief as follows.

A method for manufacturing a semiconductor device in accordance with a typical embodiment relates to a method for manufacturing a semiconductor device having, on a semiconductor substrate, a first region, the first region including therein a memory cell formation region having a plurality of memory cells formed therein. In this case, the method for manufacturing a semiconductor device includes the steps of: (a) forming a first insulation film over the semiconductor substrate; (b) forming a first conductive film over the first insulation film; (c) patterning the first conductive film, and thereby forming a pair of first dummy gate pairs being in the first region and interposing the memory cell formation region, and extending in a first direction, and a pair of second dummy gate pairs being in the first region and interposing the memory cell formation region, and extending in a second direction crossing with the first direction, and further leaving a portion of the first conductive film formed outside the first region. Then, the method includes the steps of: (d) after the step (c), forming a first well of a first conductivity type in the semiconductor substrate; and (e) after the step (d), forming a second insulation film over the semiconductor substrate including over the first dummy gate pairs and the second dummy gate pairs. Further, the method includes the steps of; (f) forming a second conductive film over the second insulation film; (g) forming an antireflection film over the second conductive film; (h) forming a first resist film over the antireflection film; and (i) patterning the first resist film. Subsequently, the method includes a step (j) of processing the second conductive film using the first resist film patterned as a mask, and thereby forming a memory gate electrode in each of the memory cells.

Further, a method for manufacturing a semiconductor device in accordance with a typical embodiment relates to a method for manufacturing a semiconductor device having, on a semiconductor substrate, a first region, the first region including therein a memory cell formation region having a plurality of memory cells formed therein, and a peripheral region including a plurality of MISFET's formed therein outside the first region. In this case, the method for manufacturing a semiconductor device includes the steps of: (a) forming a first well of a first conductivity type and a second well of a second conductivity type opposite to the first conductivity type in a portion of the semiconductor substrate in the peripheral region; and (b) forming a first insulation film over the semiconductor substrate in the first region and the peripheral region, and forming a first gate insulation film including the first insulation film in the peripheral region. Then, the method includes the steps of; (c) forming a first conductive film over the first insulation film; and (d) patterning the first conductive film, and thereby forming a pair of first dummy gate pairs being in the first region and interposing the memory cell formation region, and extending in a first direction, and a pair of second dummy gate pairs being in the first region and interposing the memory cell formation region, and extending in a second direction crossing with the first direction, and further leaving a portion of the first conductive film formed in the peripheral region outside the first region. Further, the method includes the steps of; (e) after the step (d), forming a third well of the first conductivity type in the semiconductor substrate; (f) after the step (e), forming a second insulation film over the semiconductor substrate including over the first dummy gate pairs and the second dummy gate pairs; and (g) forming a second conductive film over the second insulation film. Then, the method includes the steps of; (h) forming an antireflection film over the second conductive film; (i) forming a first resist film over the antireflection film; and (j) patterning the first resist film. Subsequently, the method includes the steps of; (k) processing the second conductive film using the first resist film patterned as a mask, and thereby forming a memory gate electrode in each of the memory cells; and (l) after the step (k), processing the first conductive film formed in the peripheral region, and thereby forming a gate electrode in each of the MISFET's.

Effects obtainable by the representative ones of the inventions disclosed in the present application will be described in brief as follows.

In a semiconductor device including a nonvolatile memory, the processing precision of the memory cell (specifically, the memory gate electrode of the memory cell) forming the nonvolatile memory can be improved.

DETAILED DESCRIPTION OF THE PREFERRED EMBODIMENTS

In the following embodiments, the description may be divided into a plurality of sections or embodiments for convenience, if required. However, unless otherwise specified, these are not independent of each other, but, are in a relation such that one is a modified example, details, a supplementary explanation, or the like of apart or the whole of the other.

Whereas, in the following embodiments, when the number of elements or the like (including the number, numerical value, quantity, range, or the like) is mentioned, unless otherwise specified, except when the value is theoretically limited to a specific number, and except other cases, the value is not limited to the specific number, and may be a numerical value of more than the specific number, or may be a number of less than the specific number.

Further, in the following embodiments, it is naturally understood that the constitutional elements (also including an element step and the like) are not necessarily essential, unless otherwise specified, except for the case where they can be considered apparently essential in principle, and except other cases.

Likewise, in the following embodiments, when the shape, the positional relation, and the like of the constitutional elements or the like are mentioned, those substantially close to or similar to the shape and the like are included, unless otherwise specified, unless otherwise considered apparently in principle, and except other cases. The same is also true of the numerical value and range.

Whereas, throughout all the drawings for illustrating Embodiments, the same members are given in principle the same reference signs and numerals, and a repetitive description thereon will be omitted. Incidentally, for easy understanding of the drawings, even a plan view may be hatched.

Figure 1:
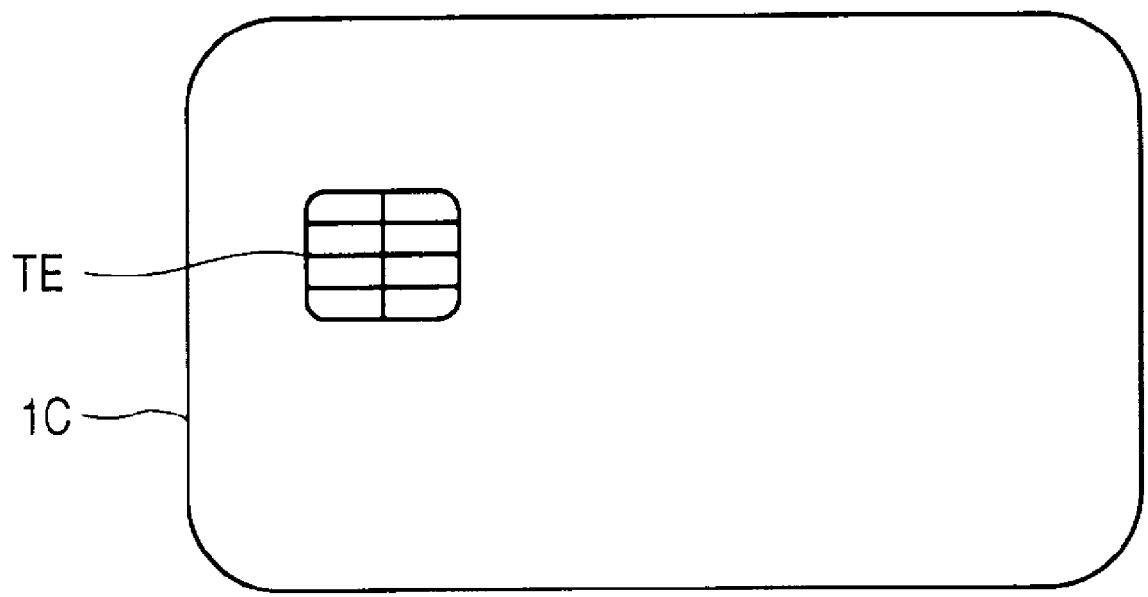
FIG. 1 is a view showing an outward appearance configuration of an IC card in Embodiment 1 of the present invention.

(Embodiment 1) FIG. 1 is a view showing an outward appearance configuration of an IC card in Embodiment 1. As shown in FIG. 1, an IC card 1C in Embodiment 1 is in the shape of a rectangle, and a terminal TE is formed on the surface of the IC card 1C. A semiconductor chip is embedded in the inside of the IC card 1C. The embedded semiconductor chip and the terminal TE are electrically coupled with each other. The IC card 1C receives power supply from a reader/writer present in the outside of the IC card 1C, and performs data communication with the reader/writer. The terminal TE formed in the IC card 1C includes a supply voltage terminal, a ground terminal, a reset terminal, an input/output terminal, and a clock terminal.

In Embodiment 1, a contact type IC card performing data communication with the reader/writer via the terminal TE is taken as an example. However, the present invention is also applicable to a non-contact type IC card configured in consideration of the convenience of an IC card user. The non-contact type IC card is an IC card including no terminal TE formed therein, and performing power supply and data communication with a reader/writer utilizing an electromagnetic induction phenomenon.

Figure 2:
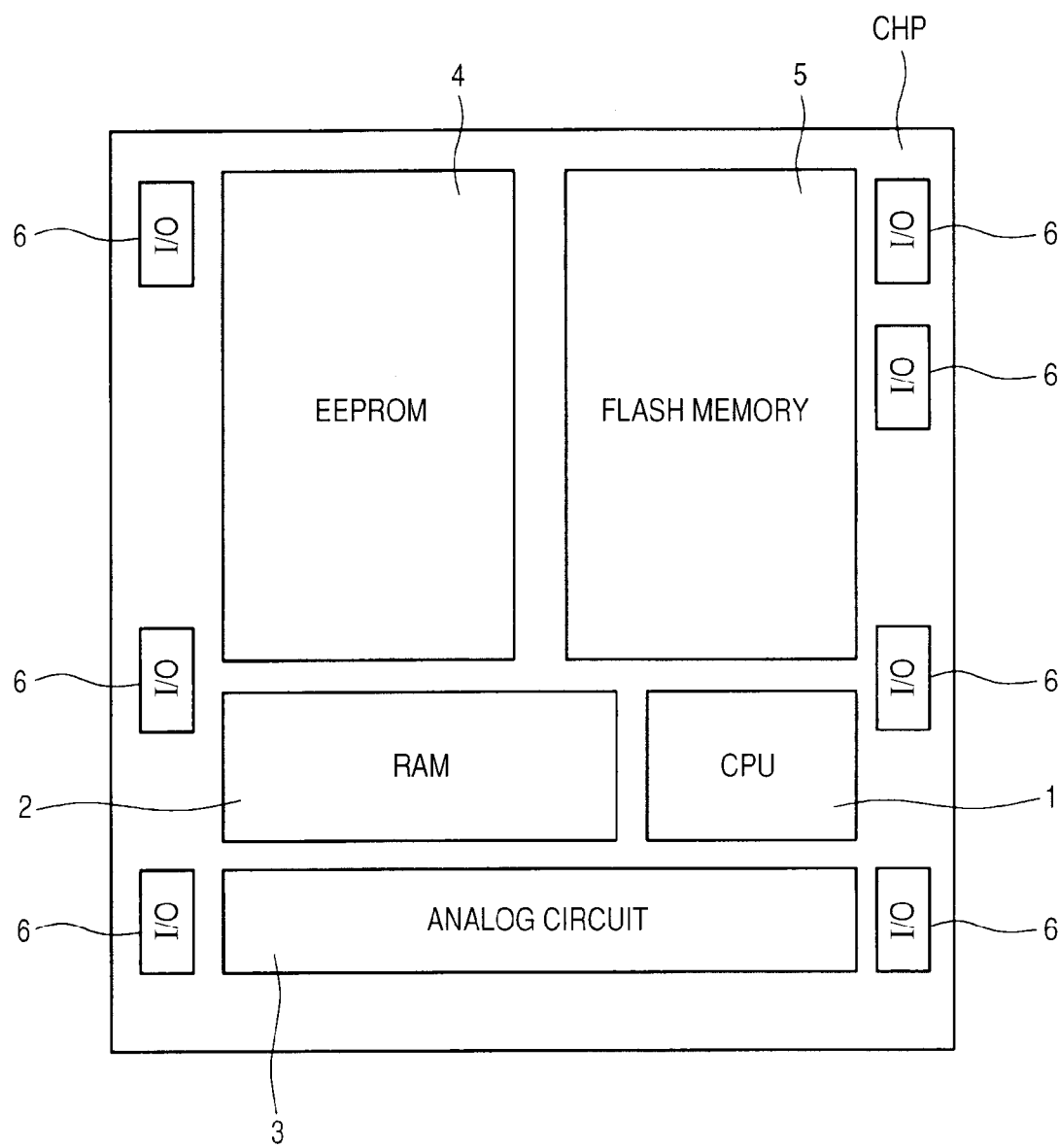
FIG. 2 is a view showing a layout configuration of a semiconductor chip in Embodiment 1.

Subsequently, a description will be given to the layout configuration of the semiconductor chip embedded in the inside of the IC card 1C. FIG. 2 is a view showing a layout configuration of a semiconductor chip CHP in Embodiment 1. In FIG. 2, the semiconductor chip CHP has a CPU (Central Processing Unit) 1, a RAM (Random Access Memory) 2, an analog circuit 3, an EEPROM (Electrically Erasable Programmable Read Only Memory) 4, a flash memory 5, and an I/O (Input/Output) circuit 6.

The CPU (circuit) 1 is also called a central processing unit, and corresponds to the heart of a computer or the like. The CPU 1 reads and decodes an instruction from a storage device, and performs diverse operations and controls based thereon.

The RAM (circuit) 2 is a memory capable of reading storage information randomly, namely, storage information stored on demand, and writing another storage information, and is also called a memory capable of performing writing and reading on demand. The RAM's as IC memories include two kinds of a DRAM (Dynamic RAM) using a dynamic circuit and a SRAM (Static RAM) using a static circuit. The DRAM is a random access memory requiring a storage holding operation, while the SRAM is a random access memory not requiring a storage holding operation.

The analog circuit 3 is a circuit handling temporally continuously changing voltage or current signals, namely, analog signals, and includes, for example, an amplification circuit, a conversion circuit, a modification circuit, an oscillation circuit, and a power source circuit.

The EEPROM 4 and the flash memory 5 are each one kind of nonvolatile memory capable of electrically erasing both the write operation and the erase operation, and is also called an electrically erasable programmable read-only memory. The memory cells of the EEPROM 4 and the flash memory 5 include, for example, MONOS (Metal Oxide Nitride Oxide Semiconductor) type transistors and MNOS (Metal Nitride Oxide Semiconductor) type transistors for storage (memory). For the write operations and the erase operations of the EEPROM 4 and the flash memory 5, for example, Fowler-Nordheim type tunneling phenomenon is utilized. Incidentally, a write operation or an erase operation can also be executed by using hot electrons or hot holes. The EEPROM 4 and the flash memory 5 are different from each other in the following point: the EEPROM 4 is a nonvolatile memory capable of performing erasure on a byte-by-byte basis, while the flash memory 5 is a nonvolatile memory capable of performing erasure, for example, on a word line-by-word line basis. In general, in the flash memory 5, there is stored a program or the like for executing various processings in the CPU 1. In contrast, in the EEPROM 4, there are stored various data high in rewriting frequency. For example, taking a semiconductor chip for an IC card of a cellular phone, in the EEPROM 4, data such as a phone number, billing information, and call notes are stored.

The I/O circuit 6 is an input/output circuit, and is a circuit for performing output of data from the inside of the semiconductor chip CHP to a device coupled to the outside of the semiconductor chip CHP, and input of data from the device coupled to the outside of the semiconductor chip CHP to the inside of the semiconductor chip CHP.

Figure 3:
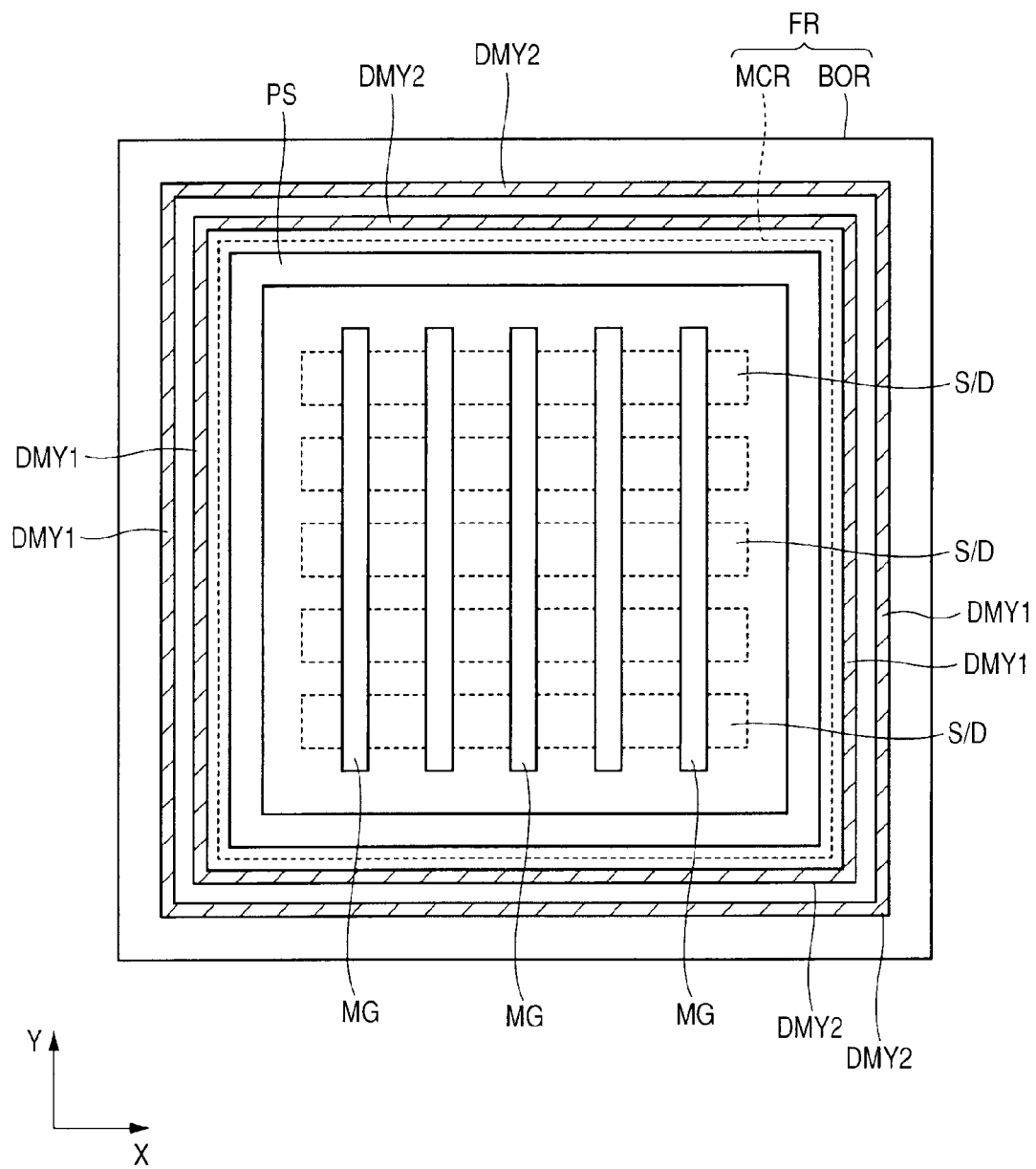
FIG. 3 is a view schematically showing a memory cell array forming a flash memory.

Then, for example, a description will be given to a configuration of the flash memory 5 formed in the semiconductor chip CHP. FIG. 3 is a view schematically showing a memory cell array forming the flash memory 5. In FIG. 3, there are shown a memory cell formation region MCR, and a boundary region BOR formed on the outside of the memory cell formation region MCR. A combined region of the memory cell formation region MCR and the boundary region BOR is defined as a first region FR. Then, although not shown in FIG. 3, there exists a peripheral circuit formation region including a peripheral circuit formed therein on the outside of the first region FR.

First, in FIG. 3, in the memory cell formation region MCR, a plurality of memory cells are formed. Specifically, a plurality of memory gate electrodes MG (word lines) extend along a Y axis direction. Then, a plurality of source regions/drain regions S/D extend in an X axis direction orthogonal to the Y axis direction. A memory cell is formed in each region of intersection of the memory gate electrodes MG and the source regions/drain region S/D. Therefore, in FIG. 3, a plurality of memory cells are arranged in an array (in a matrix). The region including a plurality of memory cells arranged in an array therein corresponds to the storage unit of the flash memory 5. Each individual memory cell is a circuit for storing 1 bit of unit information, and includes a MONOS type transistor serving as a storage unit. On the outside of the region including a plurality of memory cells formed therein, a power supply region PS is formed. From the power supply region PS, a potential is supplied to a well (not shown) common to respective memory cells.

Then, on the outside of the memory cell formation region MCR, the boundary region BOR is formed. In Embodiment 1, in the boundary region BOR, there are formed dummy gate electrodes (dummy gates) DMY1 and dummy gate electrodes DMY2. The dummy gate electrodes (dummy gates) DMY1 and the dummy gate electrodes DMY2 show a dummy pattern not functioning as a gate electrode. In FIG. 3, two pairs of the dummy gate electrodes DMY1 are formed in such a manner as to interpose the memory cell formation region MCR therebetween. Namely, the dummy gate electrodes DMY1 are formed in two pairs in such a manner as to interpose the memory cell formation region MCR from the left and right sides thereof. Similarly, the dummy gate electrodes DMY2 are formed in two pairs in such a manner as to interpose the memory cell formation region MCR therebetween from top and bottom thereof. Herein, the two pairs of the dummy gate electrodes DMY1 are mentioned. However, for example, the inside dummy gate electrode DMY1 and the outside dummy gate electrode DMY1 can also be regarded as one dummy gate electrode having an opening at the central part thereof. In this case, it can also be said that the memory cell formation region MCR is interposed from left side and right side between a pair of the dummy gate electrodes each having an opening at the central part. Similarly, for example, the inside dummy gate electrode DMY2 and the outside dummy gate electrode DMY2 can also be regarded as one dummy gate electrode having an opening at the central part. Also in this case, it can also be said that the memory cell formation region MCR is interposed from top and bottom between a pair of the dummy gate electrodes each having an opening at the central part. The dummy electrode DMY1 and the dummy gate electrode DMY2 are coupled to each other. Thus, the periphery of the memory cell formation region MCR is surrounded by the mutually coupled dummy gate electrodes DMY1 and dummy gate electrodes DMY2.

Although not shown in FIG. 3, in the peripheral circuit formation region on the outside of the first region, there are formed peripheral circuits forming a driving circuit for driving the memory cell, the CPU 1, the RAM 2, and the analog circuit 3. Specifically, the peripheral circuit includes, for example, an n channel type MISFET and a p channel type MISFET.

Figure 4:
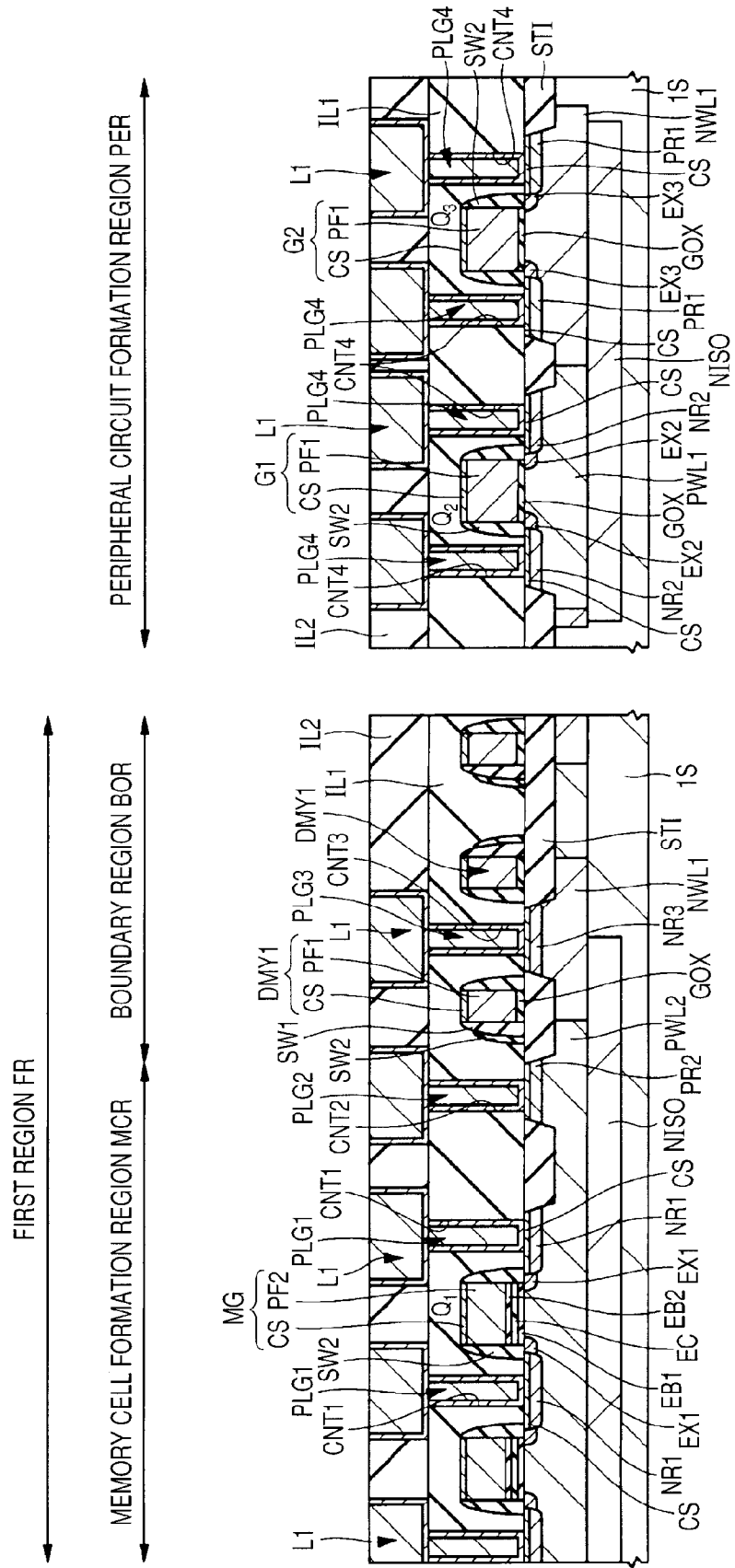
FIG. 4 is a cross-sectional view showing a configuration of a semiconductor device in Embodiment 1.

Subsequently, a description will be given to configurations of a MONOS type transistor $Q_1$ formed in the memory cell formation region MCR in the first region FR, the dummy gate electrode DMY1 formed in the boundary region BOR in the first region FR, and an n channel type MISFET $Q_2$ and a p channel type MISFET $Q_3$ formed in the peripheral circuit formation region PER, as shown in FIG. 4.

First, in FIG. 4, a description will be given to the configuration of the MONOS type transistor $Q_1$ forming the memory cell. Over a semiconductor substrate 1S, an element isolation region STI for isolating elements is formed. In an active region isolated by the element isolation region STI, the MONOS type transistor $Q_1$ is formed. In a portion of the semiconductor substrate 1S in the memory cell formation region MCR, a well isolation layer NISO is formed. Over the well isolation layer NISO, a p type well PWL2 is formed. In the semiconductor substrate 1S and the p type well PWL2, p type impurities such as boron have been introduced. On the other hand, in the well isolation layer NISO, n type impurities such as phosphorus or arsenic have been introduced. Over the p type well PWL2 formed in the semiconductor substrate 1S, the MONOS type transistor $Q_1$ is formed.

Specifically, over the p type well PWL2 formed in the semiconductor substrate 1S, a first potential barrier film EB1 is formed, and over the first potential barrier film EB1, an electric charge storage film EC is formed. Then, over the electric charge storage film EC, a second potential barrier film EB2 is formed. Over the second potential barrier film EB2, a memory gate electrode MG including a conductive film is formed. The memory gate electrode MG includes, for example, a lamination film of a polysilicon film PF2 and a cobalt silicide film CS in order to achieve a lower resistance. Incidentally, in Embodiment 1, as a silicide film, a cobalt silicide film CS is shown, but is not limited thereto. Another film such as a nickel silicide or platinum silicide film can also be used. The same is also true of the cobalt silicide film CS in the description below. On the sidewalls on opposite sides of the memory gate electrode MG, for example, sidewalls SW2 including an insulation film are formed in order to form a LDD (Lightly Doped Drain) structure.

In a portion of the semiconductor substrate 1S immediately under each sidewall SW2, a shallow n type impurity diffusion region EX1 is formed as a semiconductor region. On the outside of the shallow n type impurity diffusion region EX1, a deep n type impurity diffusion region NR1 is formed. Then, over the surface of the deep n type impurity diffusion region NR1, the cobalt silicide film CS for a lower resistance is formed.

In the MONOS type transistor $Q_1$ configured as described above, the first potential barrier film EB1 is formed of, for example, a silicon oxide film. The first potential barrier film EB1 functions as a potential barrier film for inhibiting electric charges accumulated in the electric charge storage film EC from leaking to the semiconductor substrate 1S, and also functions as a tunneling insulation film. Namely, the MONOS type transistor $Q_1$ causes injection of electrons into the electric charge storage film EC via the first potential barrier film EB1 from the semiconductor substrate 1S, and causes emission of electrons accumulated in the electric charge storage film EC into the semiconductor substrate 1S, thereby to perform storage and erasure of data. For this reason, the first potential barrier film EB1 also functions as a tunneling insulation film. Incidentally, the potential barrier film EB1 can be formed of not only a silicon oxide film but also a silicon oxide film including nitrogen introduced therein.

Then, the electric charge storage film EC formed over the potential barrier film EB1 has a function of accumulating electric charges. Specifically, in Embodiment 1, the electric charge storage film EC is formed of a silicon nitride film. The storage unit of the memory cell in Embodiment 1 stores information in the following manner: the current flowing through the inside of a portion of the semiconductor substrate 1S under the memory gate electrode MG is controlled depending upon the presence or absence of electric charges accumulated in the electric charge storage film EC. In other words, information is stored by utilizing a change in threshold value voltage of the current flowing through the inside of a portion of the semiconductor substrate 1S under the memory gate electrode MG depending upon the presence or absence of electric charges accumulated in the electric charge storage film EC.

In Embodiment 1, as the electric charge storage film EC, an insulation film having trap levels is used. As one example of the insulation film having trap levels, a silicon nitride film can be mentioned. However, not limited to a silicon nitride film, there may be used a high-k film having a higher dielectric constant than that of a silicon nitride film, such as an aluminum oxide (alumina) film, a hafnium oxide film, or a tantalum oxide film. When an insulation film having trap levels is used as the electric charge storage film EC, electric charges are trapped at the trap levels formed in the insulation film. By trapping electric charges at the trap levels in this manner, the electric charges are accumulated in the insulation film.

Conventionally, as the electric charge storage film EC, a polysilicon film has been mainly used. However, in the case where a polysilicon film is used as the electric charge storage film EC, when there are defects in some parts of the insulation film surrounding the electric charge storage film EC, all the electric charges accumulated in the electric charge storage film EC may come out due to abnormal leakage because the electric charge storage film EC is a conductive film.

Under such circumstances, in Embodiment 1, as the electric charge storage film EC, a silicon nitride film which is an insulation film is used. In this case, the electric charges contributing to data storage are accumulated at the discrete trap levels present in the silicon nitride film. Therefore, even when a defect occurs in a part of the insulation film surrounding the electric charge storage film EC, the electric charges are accumulated at the discrete trap levels of the electric charge storage film EC, which prevents all the electric charges from coming out of the electric charge storage film EC. For this reason, according to the MONOS type transistor $Q_1$ in Embodiment 1, it is possible to improve the reliability of data holding.

From such a reason, as the electric charge storage film EC, not limited to a silicon nitride film, such a film as to include discrete trap levels is used. This can improve the data holding characteristic. Further, in Embodiment 1, as the electric charge storage film EC, a silicon nitride film excellent in data holding characteristic is used. For this reason, it is possible to reduce the film thicknesses of the potential barrier film EB1 and the potential barrier film EB2 provided for preventing leakage of electric charges from the electric charge storage film EC. This advantageously results in reduction of the voltage for driving the memory cell. Alternatively, as the electric charge storage film EC, there may be used silicon nanodots obtained by forming silicon into a plurality of particles.

Each sidewall SW2 is formed in order to form the source region and the drain region which are semiconductor regions of the MONOS type transistor $Q_1$ into the LDD structure. Namely, the source region and the drain region of the MONOS type transistor $Q_1$ are each formed of a shallow n type impurity diffusion region EX1 and a deep n type impurity diffusion region NR1. In this case, the impurity concentration of the shallow n type impurity diffusion region EX1 is lower than the impurity concentration of the deep n type impurity diffusion region NR1. Therefore, by forming the source region and the drain region under the sidewalls SW2 into low-concentration shallow n type impurity diffusion regions EX1, it is possible to inhibit the electric field concentration under the ends of the memory gate electrode MG.

In the foregoing manner, the MONOS type transistor $Q_1$ is formed in the memory cell formation region MCR. Further, in the outside region of the memory cell formation region MCR including the MONOS type transistor $Q_1$ formed therein, and in the neighboring region of the boundary region BOR, a well power supply region is formed. Specifically, in FIG. 4, in a region intermediate between the region including the MONOS type transistor $Q_1$ formed therein and the element isolation region STI, a p type semiconductor region PR2 is formed. The p type semiconductor region PR2 is formed in the p type well PWL2, so that the p type well PWL2 and the p type semiconductor region PR2 are electrically coupled. Further, over the surface of the p type semiconductor region PR2, a cobalt silicide film CS is formed. Thus, in the memory cell formation region MCR, there are formed the MONOS type transistor $Q_1$ and the well power supply region.

In such a manner as to cover the memory cell formation region MCR, for example, an interlayer insulation film IL1 including a silicon oxide film is formed. Then, a contact hole CNT1 and a contact hole CNT2 are formed in such as manner as to penetrate through the interlayer insulation film IL1. The contact hole CNT1 is formed in such a manner as to reach the source region and the drain region of the MONOS type transistor $Q_1$. In the contact hole CNT1, a plug PLG1 is formed. The plug PLG1 is formed by embedding a barrier conductor film including, for example, a titanium/titanium nitride film, and a tungsten film in the contact hole CNT1. On the other hand, the contact hole CNT2 is formed in such a manner as to reach the p type semiconductor region PR2 of the well power supply region. The plug PLG2 is also formed by embedding a barrier conductor film including, for example, a titanium/titanium nitride film, and a tungsten film in the contact hole CNT2 as with the plug PLG1.

Then, over the interlayer insulation film IL1 including the plug PLG1 and the plug PLG2 formed therein, an interlayer insulation film IL2 is formed. The interlayer insulation film IL2 is also formed of, for example, a silicon oxide film. In the interlayer insulation film IL2, wiring grooves are formed. Wiring L1 is formed in such a manner as to fill the wiring grooves. The wiring L1 is formed by embedding the barrier conductor film including, for example, a tantalum/tantalum nitride film, and a copper film in the wiring grooves. This results in that the source region and the drain region of the MONOS type transistor $Q_1$ are electrically coupled with the wiring L1 via the plug PLG1. Similarly, the p type semiconductor region PR2 which is the well power supply region is electrically coupled with the wiring L1 via the plug PLG2. As a result, the p type well PWL2 electrically coupled with the p type semiconductor region PR2 is supplied with a prescribed potential via the wiring L1 and the plug PLG2. The p type semiconductor region PR2 which is the well power supply region is formed in the memory cell formation region MCR. In other words, in a region surrounded by the dummy gate electrodes (the dummy gate electrodes DMY1 and the dummy gate electrodes DMY2 of FIG. 3), the p type semiconductor region PR2 and the plug PLG2 are formed.

Then, a description will be given to the configuration of the dummy gate electrodes DMY1 formed in the boundary region BOR. In FIG. 4, in a portion of the semiconductor substrate 1S in the boundary region BOR, the element isolation regions STI are formed. Over the element isolation regions STI, the dummy gate electrodes DMY1 are formed via the gate insulation film GOX. The dummy gate electrodes DMY1 are formed over the two element isolation regions STI interposing the active region therebetween. Namely, the active region is formed between the two dummy gate electrodes DMY1. In the active region, an n type semiconductor region NR3 is formed. It can also be said as follows: the two dummy gate electrodes DMY1 are regarded as one dummy gate electrode, and an opening is formed in the central part of the one dummy gate electrode, and the n type semiconductor region NR3 is exposed through the opening.

The dummy gate electrode DMY1 is formed of the polysilicon film PF1 and the cobalt silicide film CS. On the sidewall of the dummy gate electrode DMY1, a sidewall SW1 and a sidewall SW2 are formed. Then, on the surface of the n type semiconductor region NR3, the cobalt silicide film CS is formed. The n type semiconductor region NR3 is formed in the n type well NWL1. The n type well NWL1 is electrically coupled with the well isolation layer NISO.

In such a manner as to cover the boundary region BOR, for example, the interlayer insulation film IL1 including a silicon oxide film is formed. A contact hole CNT3 is formed in such a manner as to penetrate though the interlayer insulation film IL1. The contact hole CNT3 is formed in such a manner as to reach the n type semiconductor region NR3 (cobalt silicide film CS). In the contact hole CNT3, a plug PLG3 is formed. The plug PLG3 is formed by embedding a barrier conductor film including, for example, a titanium/titanium nitride film, and a tungsten film in the contact hole CNT3.

Then, over the interlayer insulation film IL1 including the plug PLG3 formed therein, an interlayer insulation film IL2 is formed. The interlayer insulation film IL2 is also formed of, for example, a silicon oxide film. In the interlayer insulation film IL2, wiring grooves are formed. The wiring L1 is formed in such a manner as to fill the wiring grooves. The wiring L1 is formed by embedding the barrier conductor film including, for example, a tantalum/tantalum nitride film, and a copper film in the wiring grooves. This results in that the n type semiconductor region NR3 is electrically coupled to the wiring L1 via the plug PLG 3. As a result, the n type well NWL1 and the well isolation layer NISO electrically coupled with the n type semiconductor region NR3 are supplied with a prescribed potential via the wiring L1 and the plug PLG3.

Subsequently, a description will be given to the configurations of the n channel type MISFET $Q_2$ and the p channel type MISFET $Q_3$ formed in the peripheral circuit formation region PER. In the peripheral circuit formation region PER, the element isolation region STI for isolating elements is formed in the semiconductor substrate 1S. In addition, in the inside of the semiconductor substrate 1S, the well isolation layer NISO is formed. Then, out of the active regions divided by the element isolation region STI, in a region for forming the n channel type MISFET $Q_2$ therein (in the semiconductor substrate 1S), a p type well PWL1 is formed. In a region for forming the p channel type MISFET $Q_3$ therein (in the semiconductor substrate 1S), an n type well NWL1 is formed.

For the n channel type MISFET $Q_2$, over the p type well PWL1 formed in the semiconductor substrate 1S, a gate insulation film GOX is formed. Over the gate insulation film GOX, a gate electrode G1 is formed. The gate insulation film GOX is formed of, for example, a silicon oxide film. The gate electrode G1 is formed of, for example, a lamination film of the polysilicon film PF1 and the cobalt silicide film CS in order to achieve a lower resistance.

On the sidewalls on opposite sides of the gate electrode G1, sidewalls SW2 are formed. In a portion of the semiconductor substrate 1S under each of the sidewalls SW2, a shallow n type impurity diffusion region EX2 is formed as a semiconductor region. The sidewall SW2 is formed of an insulation film such as a silicon oxide film. Then, on the outside of the shallow n type impurity diffusion region EX2, a deep n type impurity diffusion region NR2 is formed. On the surface of the deep n type impurity diffusion region NR2, the cobalt silicide film CS is formed.

The sidewalls SW2 are formed in order to form the source region and the drain region which are the semiconductor regions of the n channel type transistor $Q_2$ into a LDD structure. Namely, the source region and the drain region of the n channel type transistor $Q_2$ are each formed of the shallow n type impurity diffusion regions EX2 and the deep n type impurity diffusion regions NR2. In this case, the impurity concentration of the shallow n type impurity diffusion region EX2 is lower than the impurity concentration of the deep n type impurity diffusion region NR2. Therefore, by forming the source region and the drain region under the sidewalls SW2 into low-concentration shallow n type impurity diffusion regions EX2, it is possible to inhibit the electric field concentration under the ends of the gate electrode G1.

Then, for the p channel type MISFET $Q_3$, over the n type well NWL1 formed in the semiconductor substrate 1S, the gate insulation film GOX is formed. Over the gate insulation film GOX, the gate electrode G2 is formed. The gate insulation film GOX is formed of, for example, a silicon oxide film. The gate electrode G2 is formed of, for example, a lamination film of the polysilicon film PF1 and the cobalt silicide film CS in order to achieve a lower resistance.

On the sidewalls on opposite sides of the gate electrode G2, the sidewalls SW2 are formed. In a portion of the semiconductor substrate 1S under each of the sidewalls SW2, a shallow p type impurity diffusion region EX3 is formed as a semiconductor region. The sidewall SW2 is formed of an insulation film such as a silicon oxide film. Then, on the outside of the shallow p type impurity diffusion region EX3, a deep p type impurity diffusion region PR1 is formed. On the surface of the deep p type impurity diffusion region PR1, the cobalt silicide film CS is formed.

The sidewalls SW2 are formed in order to form the source region and the drain region which are the semiconductor regions of the p channel type transistor $Q_3$ into a LDD structure. Namely, the source region and the drain region of the p channel type transistor $Q_3$ are formed of the shallow p type impurity diffusion regions EX3 and the deep p type impurity diffusion regions PR1. In this case, the impurity concentration of the shallow p type impurity diffusion region EX3 is lower than the impurity concentration of the deep p type impurity diffusion region PR1. Therefore, by forming the source region and the drain region under the sidewalls SW2 into low-concentration shallow p type impurity diffusion regions EX3, it is possible to inhibit the electric field concentration under the ends of the gate electrode G2.

In the foregoing manner, in the peripheral circuit formation region PER, the n channel type transistor $Q_2$ and the p channel type transistor $Q_3$ are formed. In such a manner as to cover the peripheral circuit formation region PER, an interlayer insulation film IL1 including, for example, a silicon oxide film is formed. In such a manner as to penetrate through the interlayer insulation film IL1, contact holes CNT4 are formed. The contact holes CNT4 are formed in such a manner as to reach the source region and the drain region of the n channel type transistor $Q_2$ and the source region and the drain region of the p channel type transistor $Q_3$. In each of the contact holes CNT4, a plug PLG4 is formed. The plug PLG4 is formed by embedding a barrier conductor film including, for example, a titanium/titanium nitride film, and a tungsten film in the contact hole CNT4.

Then, over the interlayer insulation film IL1 including the plugs PLG4 formed therein, the interlayer insulation film IL2 is formed. The interlayer insulation film IL2 is also formed of, for example, a silicon oxide film. In the interlayer insulation film IL2, wiring grooves are formed. Wiring L1 is formed in such a manner as to fill the wiring grooves. The wiring L1 is formed by embedding a barrier conductor film including, for example, a tantalum/tantalum nitride film, and a copper film in the wiring grooves. This results in that the source region and the drain region of the n channel type transistor $Q_2$, and the source region and the drain region of the p channel type transistor $Q_3$ are electrically coupled with the wiring L1 via the plugs PLG4.

The semiconductor device in Embodiment 1 is configured as described above. Then, a description will be given to the operation of the memory cell (MONOS type transistor $Q_1$) formed in the memory cell formation region MCR by reference to the accompanying drawings.

Figure 5:
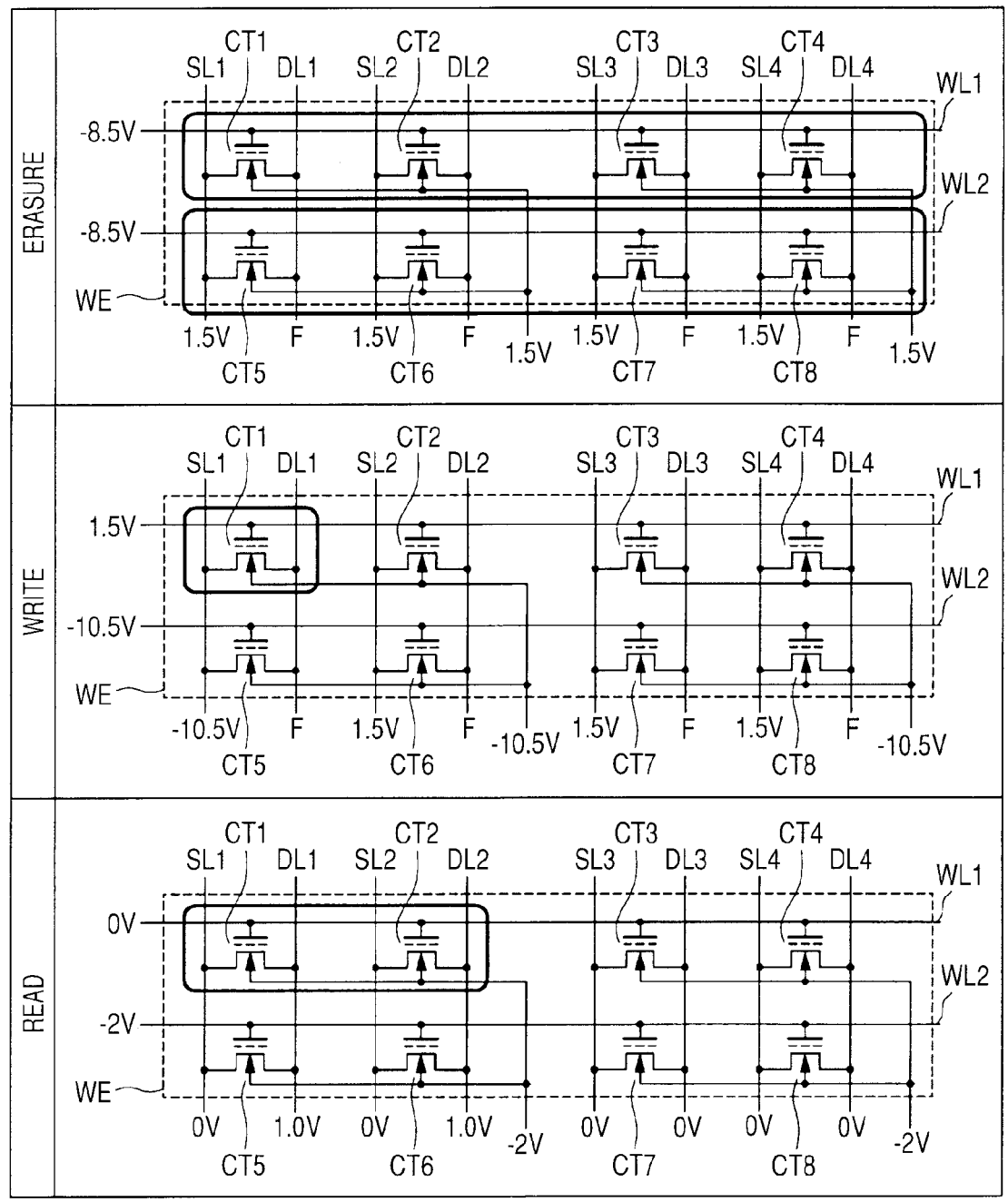
FIG. 5 is a view showing the operation conditions of the flash memory.

FIG. 5 is an illustrative view showing one example of the memory array structure and the operation conditions (1 cell/1 transistor) of the flash memory 5 shown in FIG. 2. Each memory cell shown in FIG. 5 includes only a MONOS type transistor for accumulating electric charges. Namely, the memory cells each include the MONOS type transistor $Q_1$ shown in FIG. 4, and respectively form the cell transistors CT1 to CT8 as shown in FIG. 5. The gate electrodes of the cell transistors CT1 to CT8 are coupled to word lines WL1 and WL2, and the source regions thereof are coupled to source lines SL1 to SL4. Whereas, the drain regions of the cell transistors CT1 to CT8 are coupled to data lines DL1 to DL4. Further, the back gates of the cell transistors CT1 to CT8 are respectively coupled to a well WE.

FIG. 5 shows, but is not limited to, a case where memory cells are arrayed in 2 rows and 4 columns, for facilitation of illustration. In actuality, further more memory cells are arrayed in a matrix to form a memory array. In this case, erasure of memory cells is carried out on a word line-by-word line basis.

Subsequently, by reference to FIG. 5, a description will be given to the erasure operation, the write operation, and the read operation of the memory cells. First, the erasure operation will be described. For example, a consideration will be given to a case where as the memory cells from which data is erased (selected memory cells), data accumulated in the cell transistors CT1 to CT8 is erased. In this case, the potential of the well WE is set at 1.5 V, and the potential of the word lines WL1 and WL2 is set at −8.5 V. Then, the potential of the source lines SL1 to SL4 is set at 1.5 V, and the potential of the data lines DL1 to DL4 is set in the floating state. As a result, the electric charges accumulated in the electric charge storage films (silicon nitride films) of the cell transistors CT1 to CT8 are drawn toward the well WE, so that the data is erased.

Then, the write operation will be described. A consideration will be given to, for example, a case where as the memory cell to which data is written (selected memory cell), data is written to the cell transistor CT1. In this case, the potential of the well WE is set at −10.5 V, and the potential of the word line WL1 is set at 1.5 V. Then, the potential of the source lines SL1 to SL4 is set at −10.5 V, and the potential of the data lines DL1 to DL4 is set in the floating state. As a result, electric charges are injected into the electric charge storage film of the cell transistor CT1. At this step, for other memory cells (non-selected memory cells) CT2 to CT8 to which writing is not to be performed, the potential of the well WE is set at −10.5 V, and the potential of the word line WL2 is set at −10.5 V. Then, the potential of the source lines SL1 to SL4 is set at −10.5 V, and the potential of the data lines DL1 to DL4 is set in the floating state. As a result, electric charges are not injected into the electric charge storage films of the cell transistors CT2 to CT8. Accordingly, for the cell transistors CT2 to CT8, writing of data is not performed.

Then, the read operation will be described. For example, a consideration will be given to the following case: Data "1" is written in the cell transistor CT1, and the threshold value voltage of the cell transistor CT1 is high; On the other hand, data "0" is stored in the cell transistor CT2, and the threshold value voltage of the cell transistor CT2 is low; In this state, data of the cell transistors CT1 and CT2 is read. In this case, the potential of the well WE is set at −2 V, and the potential of the word line WL1 is set at 0 V. Whereas, the potential of the source lines SL1 and SL2 is set at 0 V, and the potential of the data lines DL1 and DL2 is set at 0 V. As a result, data of the cell transistors CT1 and CT2 is read. At this step, the threshold value voltage of the cell transistor CT1 is high. On the other hand, the threshold value voltage of the cell transistor CT2 is low. For this reason, the potential of the data line DL1 does not vary. On the other hand, the potential of the data line DL2 is reduced. As a result, the data stored in the cell transistors CT1 and CT2 can be read. Incidentally, for other memory cell transistors CT3 to CT8 to which reading is not to be performed, the potential of the well WE is set at −2 V, and the potential of the word line WL2 is set at −2 V. Then, the potential of the source lines SL3 and SL4 is set at 0 V, and the potential of the data lines DL3 and DL4 is set at 0 V. As a result, the cell transistors CT3 to CT8 are not turned ON. In the foregoing manner, it is possible to operate the memory cells (MONOS type transistors) formed in the memory cell formation region MCR.

Then, a description will be given to a method for manufacturing a semiconductor device in Embodiment 1. First, the problems in the technology studied by the present inventors will be described. Then, the method for manufacturing a semiconductor device in Embodiment 1 will be described.

Figure 6:
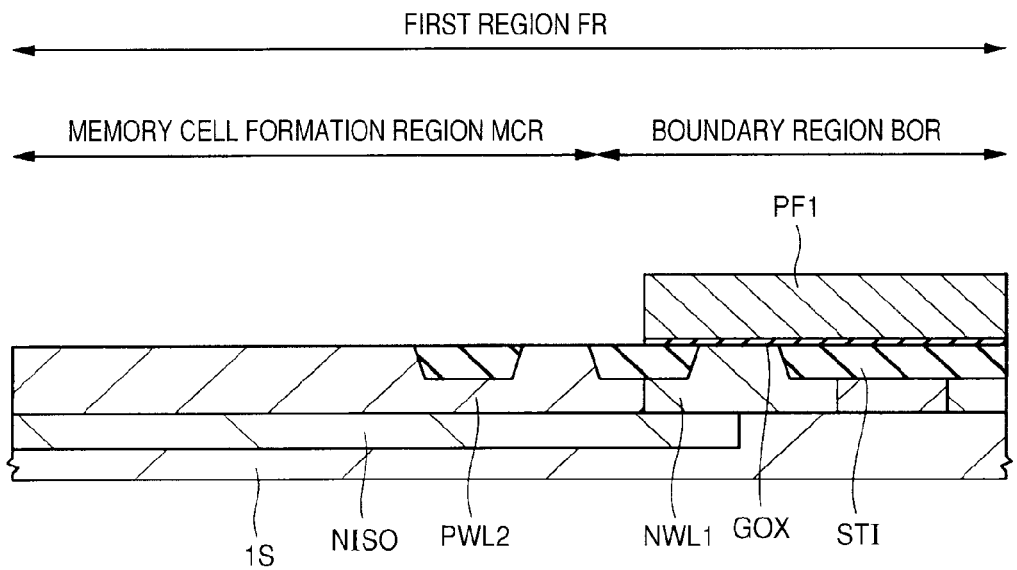
FIG. 6 is a cross-sectional view showing a manufacturing step of a semiconductor device in a technology studied by the present inventors.

Below, the problems in the technology studied by the present inventors will be described by reference to FIGS. 6 to 10. FIGS. 6 to 10 each show the first region FR (the memory cell formation region MCR and the boundary region BOR). First, as shown in FIG. 6, in the semiconductor substrate 1S, the element isolation region STI is formed. Then, in the semiconductor substrate 1S, the well isolation layer NISO, the p type well PWL2, and the n type well NWL1 are formed by using a photolithography technology and an ion implantation method. Then, over the semiconductor substrate 1S, the gate insulation film GOX including, for example, a silicon oxide film is formed. Over the gate insulation film GOX, the polysilicon film PF1 is formed. The polysilicon film PF1 can be formed by using, for example, a CVD (Chemical Vapor Deposition) process.

The polysilicon film PF1 is formed entirely over the main surface of the semiconductor substrate 1S. Therefore, over the first region FR including the memory cell formation region MCR and the boundary region BOR, the polysilicon film PF1 is formed. Then, by using the photolithography technology and the etching technology, the polysilicon film PF1 is patterned. Patterning of the polysilicon film PF1 is carried out in such a manner as to remove a portion of the polysilicon film PF1 formed in the memory cell formation region MCR. As a result, as shown in FIG. 6, the portion of the polysilicon film PF1 in the memory cell formation region MCR is removed, whereas, a portion of the polysilicon film PF1 remains in the boundary region BOR. This causes a step difference portion due to the polysilicon film PF1 between the memory cell formation region MCR and the boundary region BOR.

Figure 7:
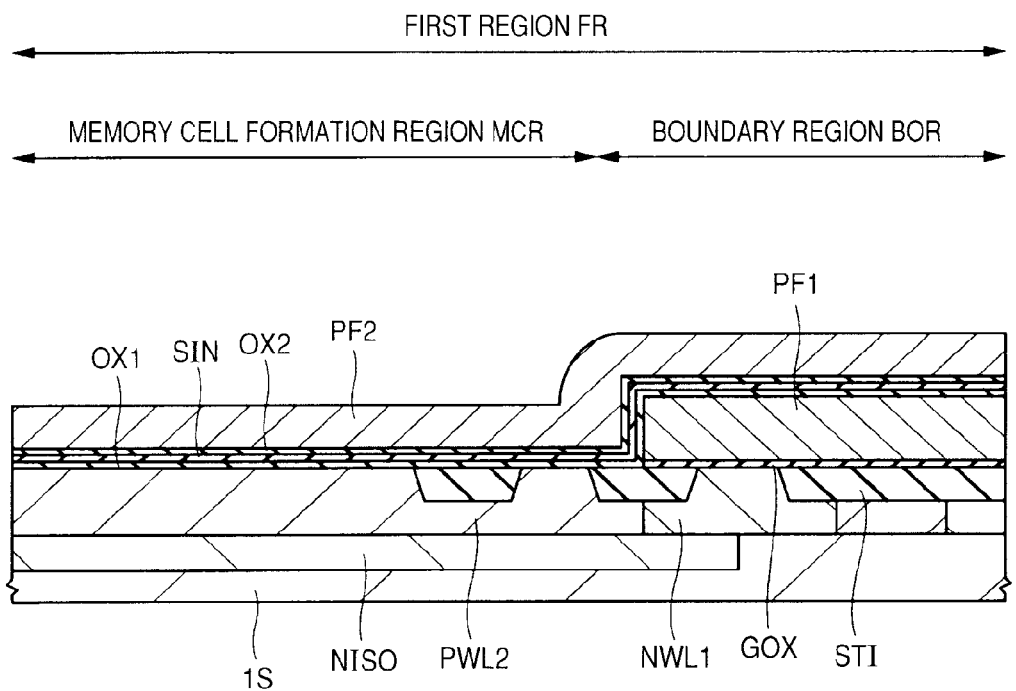
FIG. 7 is a cross-sectional view showing a manufacturing step of the semiconductor device subsequent to FIG. 6.

Subsequently, as shown in FIG. 7, over the main surface of the semiconductor substrate 1S, a silicon oxide film OX1, a silicon nitride film SIN, and a silicon oxide film OX2 are successively formed. Then, over the silicon oxide film OX2, a polysilicon film PF2 is formed. The polysilicon film PF2 can also be formed by, for example, a CVD process. The polysilicon film PF2 is formed across the memory cell formation region MCR and the boundary region BOR. This results in that the polysilicon film PF2 is formed reflecting the step difference portion formed between the memory cell formation region MCR and the boundary region BOR.

Figure 8:
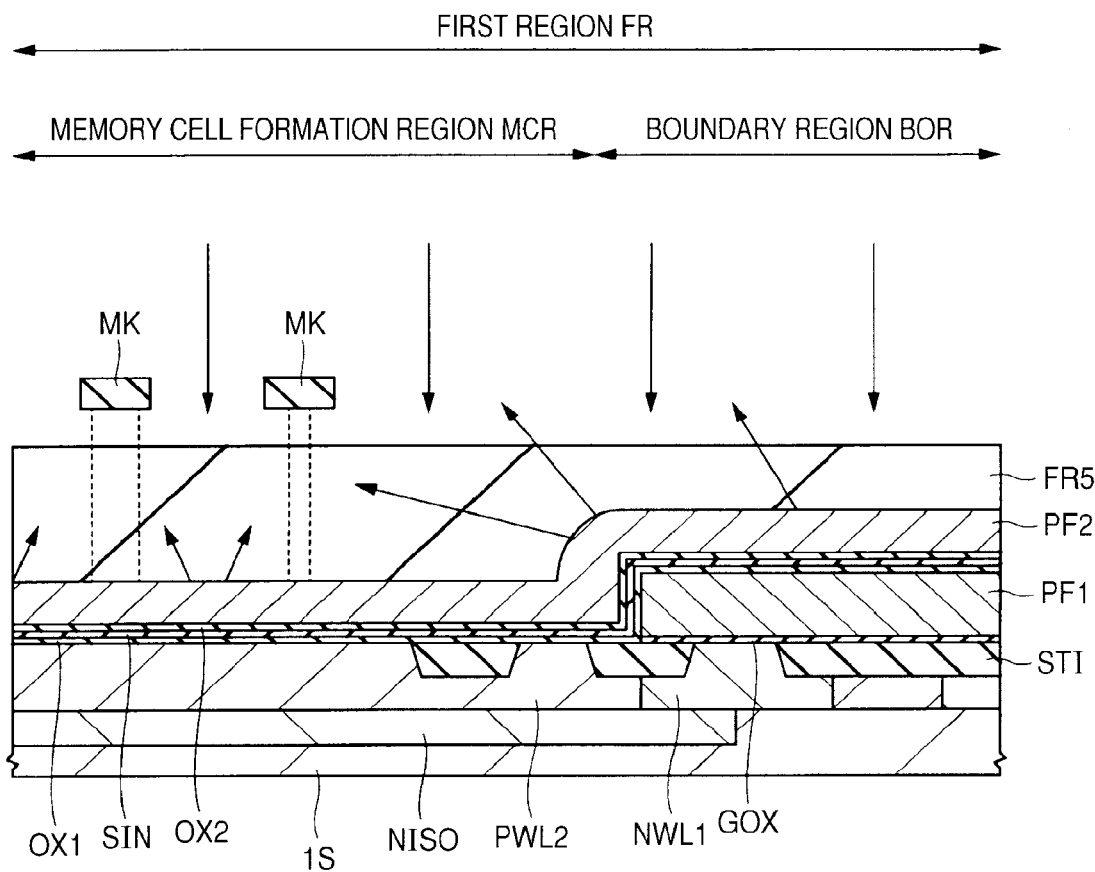
FIG. 8 is a cross-sectional view showing a manufacturing step of the semiconductor device subsequent to FIG. 7.

Then, as shown in FIG. 8, over the polysilicon film PF2, a resist film FR5 is formed. Then, the resist film FR5 is subjected to an exposure processing. Specifically, an exposure light is applied to the resist film FR5 via a mask MK. The mask MK is a mask for processing a memory gate electrode to be formed in the memory cell formation region MCR. At this step, in order to process the memory gate electrode according to the design values, desirably, an exposure light is applied to only a portion of the resist film FR5 present in a region including no mask MK formed therein, and an exposure light is blocked from a portion of the resist film present in a region including a mask MK formed therein. However, as shown in FIG. 8, the exposure light applied to the resist film FR5 is irregularly reflected by the polysilicon film PF2 formed in a layer underlying the resist film FR5, and the like. When the irregularly reflected exposure light reaches the portion of the resist film FR5 shielded from light by the mask MK, the exposure light resulting from irregular reflection is also applied to the portion of the resist film FR5 to be shielded from light by the mask MK, resulting in photosensitization. The resist film FR5 thus subjected to an exposure processing is subjected to a development processing, so that the resist film FR5 is patterned. The patterning of the resist film FR5 does not result in patterning according to the design values due to exposure to an unintended region by irregular reflection. As a result, the shape of the memory gate electrode formed by processing the polysilicon film PF2 also deviates from the design values, resulting in deterioration of the processing precision of the memory gate electrode.

Figure 9:
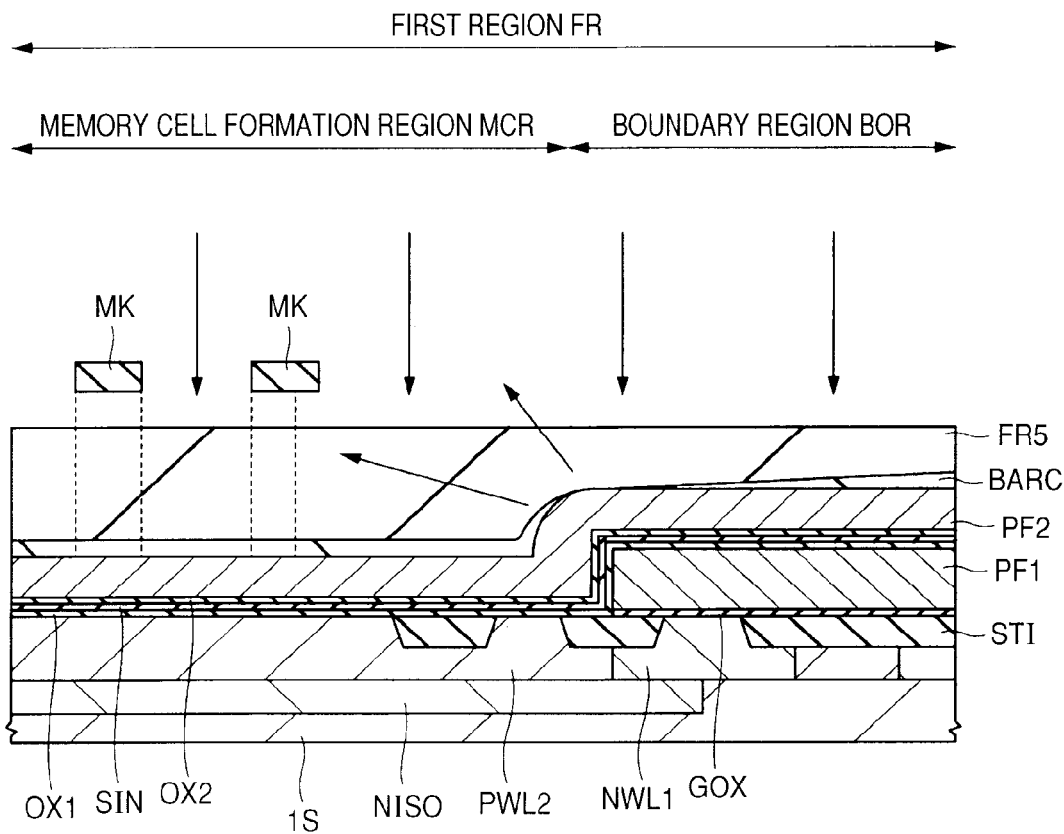
FIG. 9 is a cross-sectional view showing a manufacturing step of the semiconductor device including an antireflection film formed therein in place of FIG. 8.

Under such circumstances, in order to prevent irregular reflection from the underlayer film formed in a layer underlying the resist film FR5 during exposure, the following is carried out: an antireflection film is formed over the underlayer film; and over the antireflection film, the resist film FR5 is formed. As shown in FIG. 9, over the polysilicon film PF2, an antireflection film BARC is formed, and over the antireflection film BARC, the resist film FR5 is formed. As a result, during the exposure processing via the mask MK, irregular reflection form the film formed in a layer underlying the resist film FR can be inhibited by the antireflection film BARC. This can improve the patterning precision of the resist film FR5, which can improve the processing precision of the memory gate electrode.

However, even when the antireflection film BARC is formed in a layer underlying the resist film FR5, with the technology studied by the present inventors, the following situation occurs: a step difference portion is formed between the memory cell formation region MCR and the boundary region BOR; for this reason, irregular reflection due to exposure light cannot be prevented effectively. Namely, the antireflection film BARC formed in a layer underlying the resist film FR5 is generally formed with a coating process. For this reason, when there is a step difference portion in the polysilicon film PF2 which is the underlayer film, a portion of the antireflection film BARC formed in the higher region of the step difference portion flows to the lower region of the step difference portion, resulting in elimination of the portion of the antireflection film BARC applied in the higher region of the step difference portion. In other words, the portion of the antireflection film BARC formed in the higher region in the vicinity of the step difference portion flows to the lower region. This results in a situation in which at the upper part of the step difference portion, the antireflection film BARC is not being formed despite the antireflection film BARC has been formed. Accordingly, the exposure light applied to the upper part of the step difference portion undergoes irregular reflection. As a result, the irregularly reflected exposure light is applied to a portion of the resist film FR5 in a region shielded from light by the mask MK, so that unintended exposure (photosensitization) is carried out. Therefore, even in the case where the antireflection film BARC is formed in a layer underlying the resist film FR5, when a step difference portion is formed in the underlayer film (polysilicon film PF2), the effect of the antireflection film BARC is reduced.

The resist film FR5 thus subjected to an exposure processing is subjected to a development processing, so that the resist film FR5 is patterned. The patterning of the resist film FR5 does not result in patterning according to the design values due to exposure to an unintended region by irregular reflection. As a result, the shape of the memory gate electrode formed by processing the polysilicon film PF2 also deviates from the design values, resulting in deterioration of the processing precision of the memory gate electrode.

Figure 10:
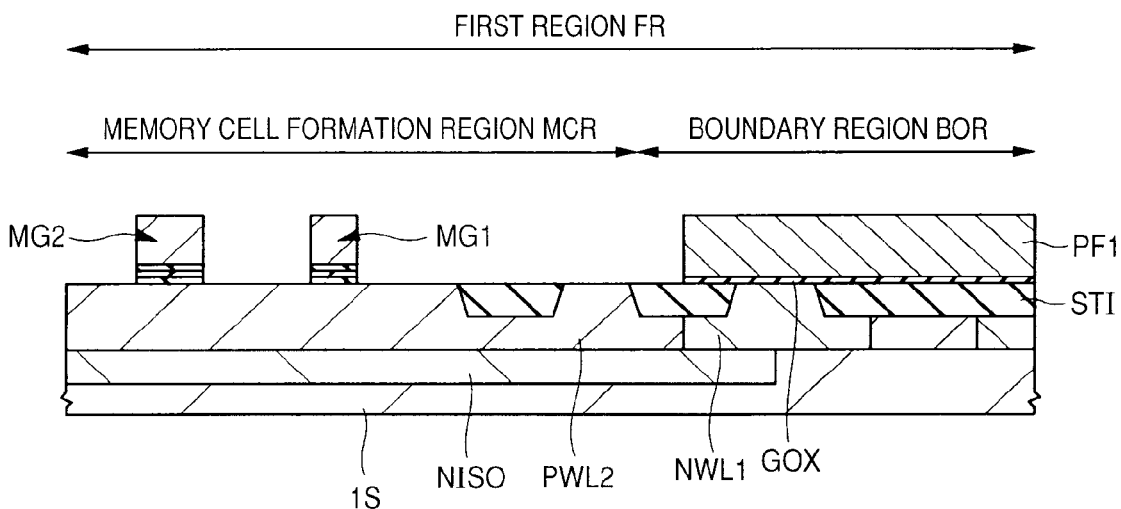
FIG. 10 is a cross-sectional view showing a manufacturing step of the semiconductor device subsequent to FIG. 9.

Specifically, as shown in FIG. 10, the processing precision of the memory gate electrodes MG1 and MG2 to be processed is deteriorated. For example, in FIG. 10, the two memory gate electrodes MG1 and MG2 are formed. However, there occurs a phenomenon in which the gate width of the memory gate electrode MG1 formed on the outermost periphery is reduced than the gate width of the memory gate electrode MG2 formed on the inner side by irregular reflection from the step difference portion. From the description up to this point, even when the antireflection film BARC is formed in a layer underlying the resist film FR5, the following occurs: when there is a step difference portion in the underlayer film (polysilicon film PF2), a portion of the antireflection film BARC flows in the vicinity of the step difference portion. For this reason, even when the antireflection film BARC is formed in a layer underlying the resist film FR5, the effects of the antireflection film BARC are substantially reduced in the step difference region. This makes it impossible to inhibit irregular reflection of the exposure light. Therefore, the memory gate electrode MG1 formed in a region close to the step difference region is most affected by irregular reflection, resulting in deterioration of the processing precision. In short, the processing precision of the memory gate electrode MG1 formed in a region close to the boundary between the memory cell formation region MCR and the boundary region BOR is affected by irregular reflection. In other words, the processing precision of the memory gate electrode MG1 formed in the outermost periphery of the memory cell formation region MCR is largely affected by irregular reflection from the underlayer film formed in a layer underlying the resist film FR5.

Herein, focusing attention on the fact that the function of the antireflection film BARC is reduced by the effect of the step difference portion, it can be considered that the step difference portion formed in the polysilicon film PF2 which is the underlayer film is eliminated. However, for the reasons shown below, with the technology studied by the present inventors, a step difference portion is formed in the polysilicon film PF2 which is the underlayer film. This will be described. First, with the technology studied by the present inventors, it is assumed as follows: MONOS type transistors are formed in the memory cell formation region MCR, and MISFET's are formed in the peripheral circuit formation region. Therefore, in the memory cell formation region MCR, the memory gate electrode of the MONOS type transistor is formed, and in the peripheral circuit formation region, the gate electrode of the MISFET is formed. For this reason, with the technology studied by the present inventors, first, the polysilicon film PF1 for processing gate electrodes of the MISFET formed in the peripheral circuit formation region is formed. Then, in the memory cell formation region MCR, the polysilicon film PF2 for processing memory gate electrodes of MONOS type transistors is formed. In other words, the two films of the polysilicon film PF1 for processing gate electrodes of MISFET's and the polysilicon film PF2 for processing memory gate electrodes of MONOS type transistors are required. At this step, first, the polysilicon film PF1 for processing gate electrodes of MISFET's is formed over the semiconductor substrate 1S. Then, a portion of the polysilicon film PF1 formed in the memory cell formation region MCR is removed (see FIG. 6). This causes a step difference portion between the memory cell formation region MCR and the boundary region BOR. Then, over the semiconductor substrate 1S including the memory cell formation region MCR, the polysilicon film PF2 is formed. This results in that the polysilicon film PF2 is formed reflecting the step difference in the underlayer.

At this step, the following can be considered: first, the polysilicon film PF2 for processing memory gate electrodes is formed, thereby to process the memory gate electrode; then, over the semiconductor substrate 1S, the polysilicon film PF1 for processing gate electrodes of MISFET's forming the peripheral circuit is formed. In this case, the polysilicon film PF2 for processing memory gate electrodes is formed over a portion of the semiconductor substrate 1S including no step difference portion. In addition, before forming the polysilicon film PF1 for processing gate electrodes of MISFET's forming the peripheral circuit, memory gate electrodes are processed. For this reason, during processing of the memory gate electrodes, a step difference portion is not formed in the underlayer film (polysilicon film PF2) of the resist film FR5. This conceivably can inhibit the phenomenon of flowing out of the antireflection film BARC due to the step difference portion. Accordingly, the antireflection film BARC is almost uniformly formed in a layer underlying the resist film FR5. This conceivably can inhibit the effects of irregular reflection from the underlayer film (polysilicon film PF2) formed in a layer underlying the resist film FR5.

However, in the case where, first, the memory gate electrodes are formed, and then, the polysilicon film PF1 for processing gate electrodes of MISFET's forming the peripheral circuit is formed, the following disadvantages occur. For example, it results in that, in the foregoing manufacturing process, there is a step of forming the gate insulation film of the MISFET's forming the peripheral circuit after formation of the memory gate electrodes. This step is carried out by, for example, a thermal oxidation process. In this thermal oxidation step, bird's beaks occur in the memory gate electrodes. When bird's beaks occur in the memory gate electrodes, characteristic deterioration occurs in the MONOS type transistors. For this reason, it is not desirable that the polysilicon film PF1 for processing gate electrodes of MISFET's forming the peripheral circuit is formed after formation of the memory gate electrodes. From the description up to this point, with the technology studied by the present inventors, first, over the semiconductor substrate 1S, the polysilicon film PF1 for processing gate electrodes of MISFET's forming the peripheral circuit is formed; and then, a portion of the polysilicon film PF1 formed in the memory cell formation region MCR is removed. Then, over the semiconductor substrate is including the memory cell formation region MCR, the polysilicon film PF2 for processing memory gate electrodes is formed. In such a manufacturing process, there is a step of forming the gate insulation film of MISFET's forming the peripheral circuit before formation of the memory gate electrodes. This results in an advantage of being capable of inhibiting the occurrence of bird's beaks in the memory gate electrodes.

However, adoption of such a manufacturing process results in the following procedure: over the semiconductor substrate 1S, the polysilicon film PF1 for processing gate electrodes of MISFET's forming the peripheral circuit is formed; and then, a portion of the polysilicon film PF1 formed in the memory cell formation region MCR is removed. This causes a step difference portion between the memory cell formation region MCR and the boundary region BOR. Then, the polysilicon film PF2 for processing memory gate electrodes is formed reflecting the step difference portion. Further, over the polysilicon film PF2, the antireflection film BARC is coated. As a result, as described above, with the technology studied by the present inventors, a problem of reduction of the effects of the antireflection film BARC due to the step difference portion becomes revealed.

Under such circumstances, with the semiconductor manufacturing method in Embodiment 1, as with the technology studied by the present inventors, it is assumed as follows: over the semiconductor substrate 1S, the polysilicon film PF1 for processing gate electrodes of MISFET's forming the peripheral circuit is formed; and a portion of the polysilicon film PF1 formed in the memory cell formation region MCR is removed; and then, over the semiconductor substrate 1S including the memory cell formation region MCR, the polysilicon film PF2 for processing memory gate electrodes is formed. In this case, with the technology studied by the present inventors, deterioration of the processing precision of the memory gate electrodes caused by elimination of the antireflection film BARC due to the step difference portion becomes a problem. However, in Embodiment 1, the following idea is implemented. The method for manufacturing a semiconductor device in Embodiment 1, to which the idea has been applied, will be described by reference to the accompanying drawings. In Embodiment 1, a description will be given by showing the first region FR (the memory cell formation region MCR and the boundary region BOR), and the peripheral circuit formation region PER on the outside of the first region FR.

Figure 11:
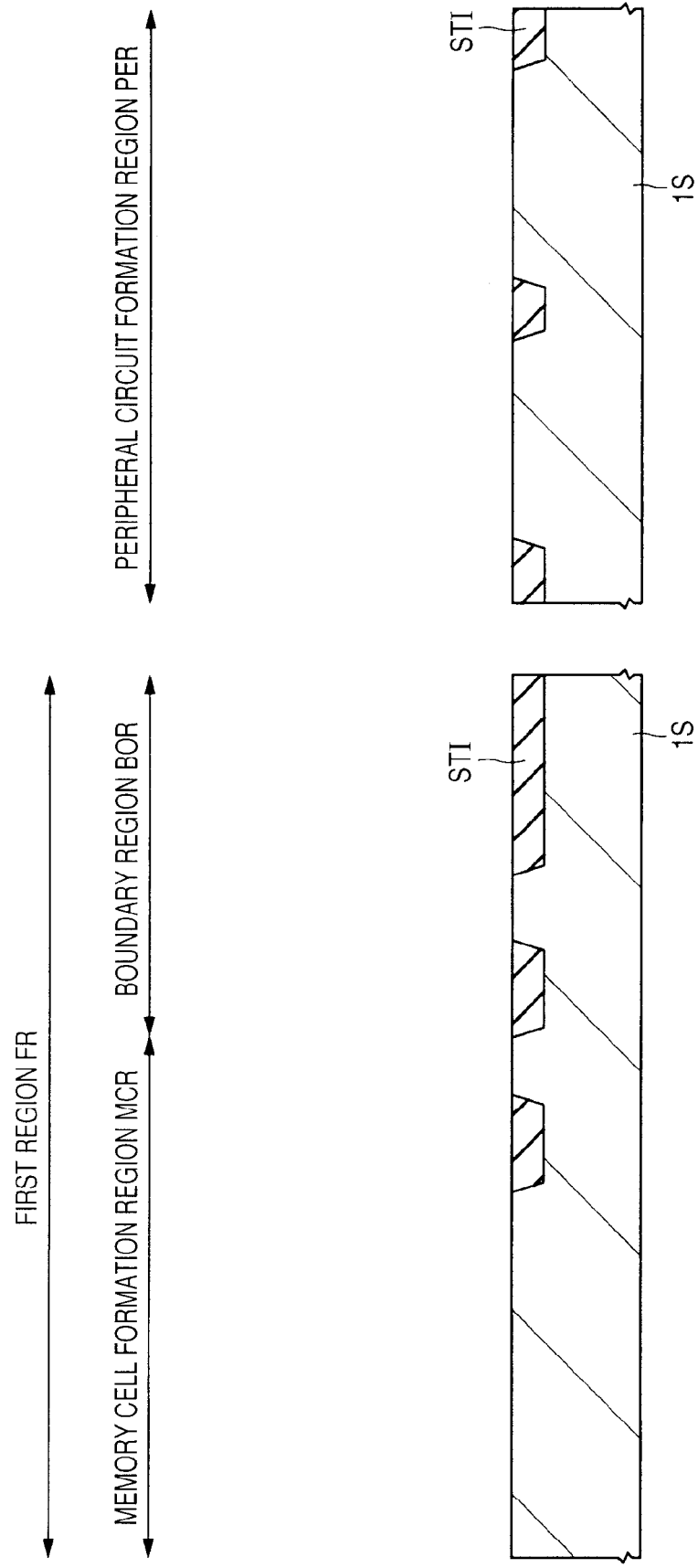
FIG. 11 is a cross-sectional view showing a manufacturing step of the semiconductor device in Embodiment 1 of the present invention.

First, as shown in FIG. 11, a semiconductor substrate 1S including a silicon single crystal including p type impurities such as boron (B) introduced therein is prepared. At this step, the semiconductor substrate 1S is in the form of a semiconductor wafer in the shape of generally a disk. Then, the element isolation region STI for isolating active regions of the semiconductor substrate 1S is formed. The element isolation region ST1 is provided in order to prevent elements from interfering with each other. The element isolation region STI can be formed using, for example, the LOCOS (Local Oxidation of silicon) method or the STI (shallow trench isolation) method. For example, with the STI method, the element isolation region STI is formed in the following manner. Namely, in the semiconductor substrate 1S, element isolation grooves are formed using the photolithography technology and the etching technology. Then, a silicon oxide film is formed in such a manner as to fill the element isolation grooves over the semiconductor substrate 1S. Then, by the chemical mechanical polishing (CMP) method, unnecessary portions of the silicon oxide film formed over the semiconductor substrate 1S are removed. As a result, it is possible to form the element isolation region STI including the silicon oxide film embedded only in the element isolation grooves.

Figure 12:
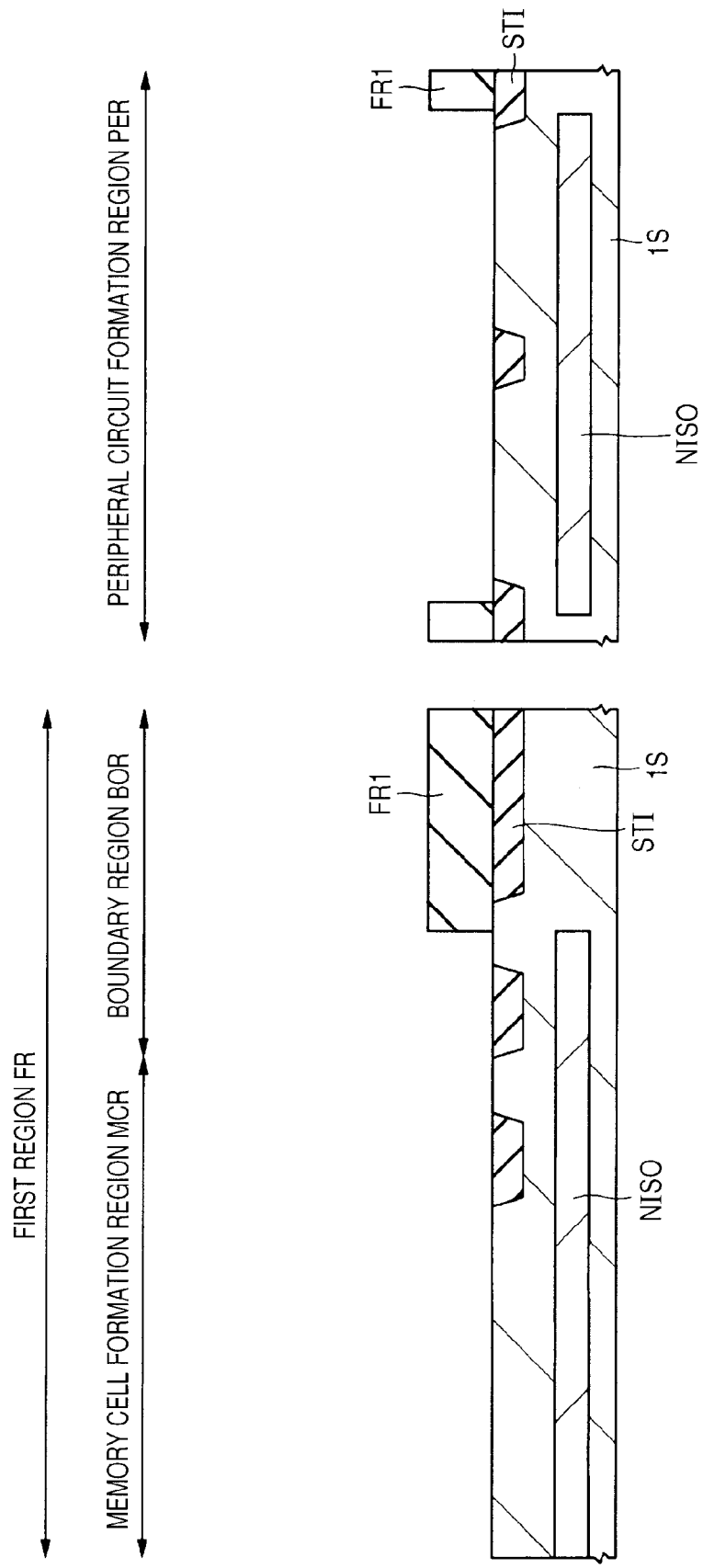
FIG. 12 is a cross-sectional view showing a manufacturing step of the semiconductor device subsequent to FIG. 11.

Subsequently, as shown in FIG. 12, over the semiconductor substrate 1S, the resist film FR1 is formed. Then, the resist film FR1 is subjected to exposure and development processings, so that the resist film FR1 is patterned. Patterning of the resist film FR1 is carried out so that the resist film FR1 does not remain in the memory cell formation region MCR through a portion of the region including no element isolation region STI formed therein in the boundary region BOR, and so that the resist film FR1 does not remain in the peripheral circuit formation region PER. By the ion implantation method using the resist film FR1 thus patterned as a mask, the well isolation layer NISO is formed in the semiconductor substrate 1S. The well isolation layer NISO is a semiconductor region formed by introducing n type impurities such as phosphorus or arsenic into the semiconductor substrate 1S. The well isolation layer NISO is formed in the memory cell formation region MCR and the peripheral circuit formation region PER.

Figure 13:
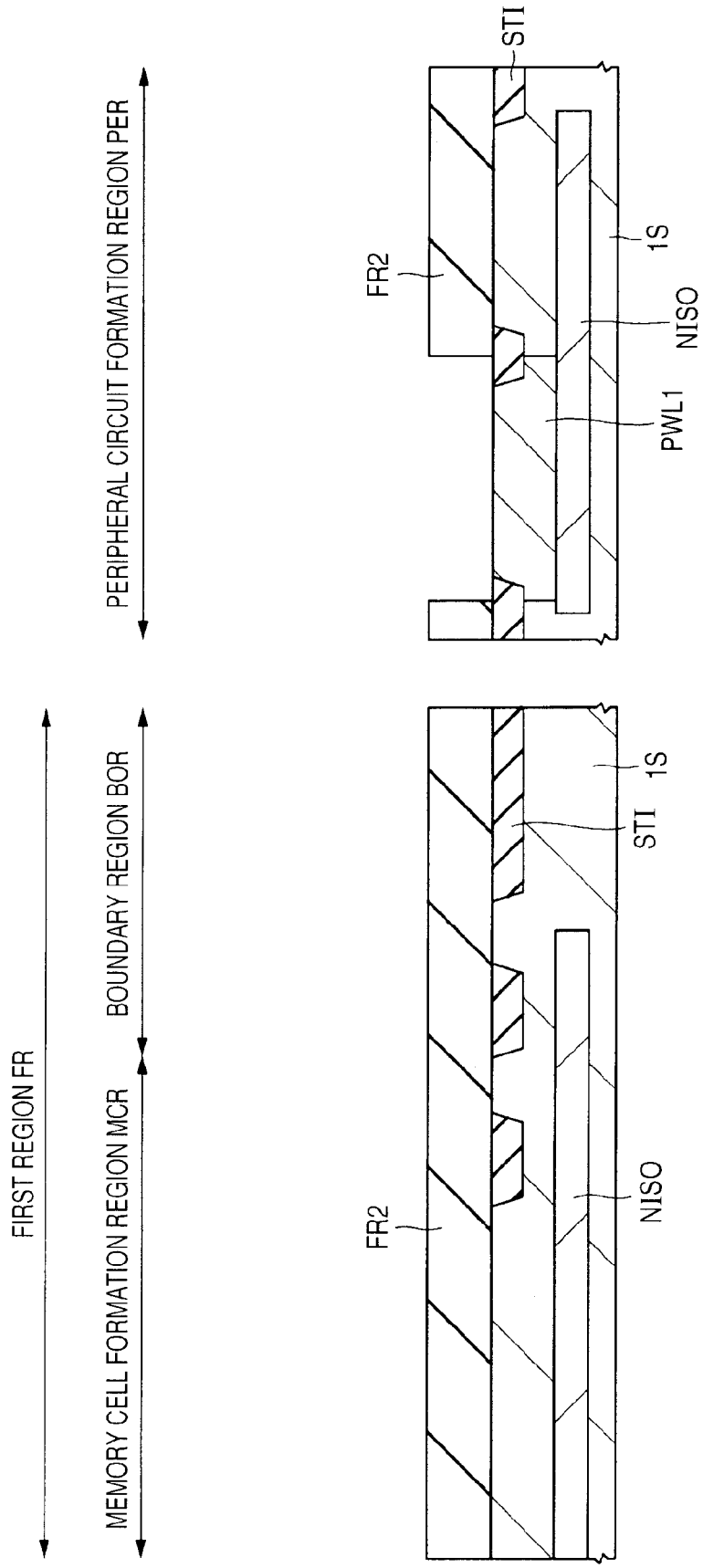
FIG. 13 is a cross-sectional view showing a manufacturing step of the semiconductor device subsequent to FIG. 12.

Then, as shown in FIG. 13, over the semiconductor substrate 1S, the resist film FR2 is formed. Then, the resist film FR2 is subjected to exposure and development processings, so that the resist film FR2 is patterned. Patterning of the resist film FR2 is carried out so that the resist film FR3 remains in the memory cell formation region MCR, the boundary region BOR, and the p channel type MISFET formation region of the peripheral circuit formation region PER, and so that the resist film FR2 does not remain in the n channel type MISFET formation region of the peripheral circuit formation region PER. By the ion implantation method using the resist film FR2 thus patterned as a mask, the p type well PWL1 is formed in the semiconductor substrate 1S. The p type well PWL1 is a semiconductor region formed by introducing p type impurities such as boron into the semiconductor substrate 1S. The p type well PWL1 is formed in the n channel type MISFET formation region of the peripheral circuit formation region PER.

Figure 14:
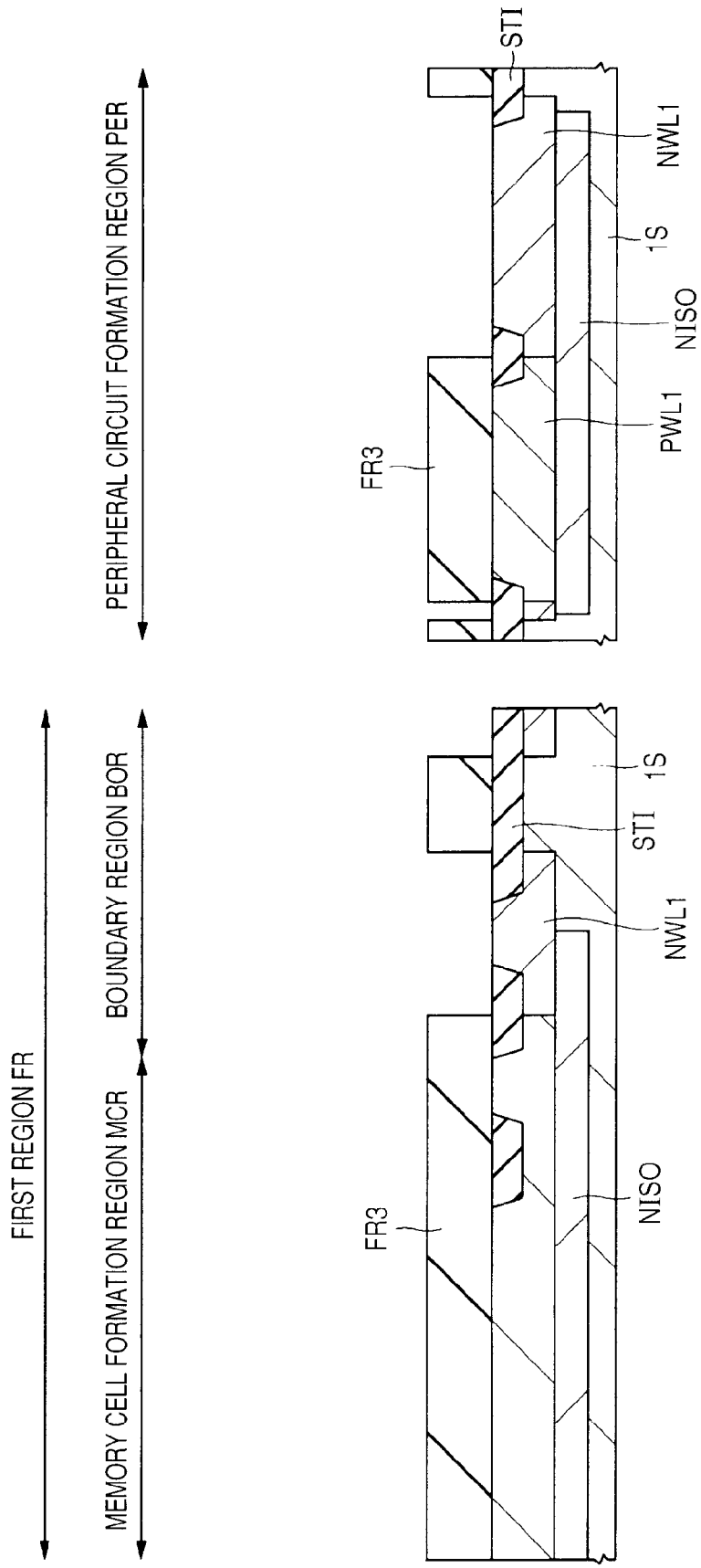
FIG. 14 is a cross-sectional view showing a manufacturing step of the semiconductor device subsequent to FIG. 13.

Subsequently, as shown in FIG. 14, over the semiconductor substrate 1S, the resist film FR3 is formed. Then, the resist film FR3 is subjected to exposure and development processings, so that the resist film FR3 is patterned. Patterning of the resist film FR3 is carried out so that the resist film FR3 remains in the memory cell formation region MCR, a portion of the boundary region BOR, and the n channel type MISFET formation region of the peripheral circuit formation region PER, and so that the resist film FR3 does not remain in a portion of the boundary region BOR including a region with no element isolation region STI formed therein in the boundary region BOR, and the p channel type MISFET formation region of the peripheral circuit formation region PER. By the ion implantation method using the resist film FR3 thus patterned as a mask, the n type well NWL1 is formed in the semiconductor substrate 1S. The n type well NWL1 is a semiconductor region formed by introducing p type impurities such as phosphorus or arsenic into the semiconductor substrate 1S. The n type well NWL1 is formed in a portion of the boundary region BOR, and the p channel type MISFET formation region of the peripheral circuit formation region PER. At this step, in a portion of the boundary region BOR, the n type well NWL1 is formed. However, the n type well NWL1 is formed in such a manner as to be coupled with the well isolation layer NISO formed in the deeper region. Namely, the n type well NWL1 formed in the boundary region BOR is electrically coupled with the well isolation layer NISO.

Figure 15:
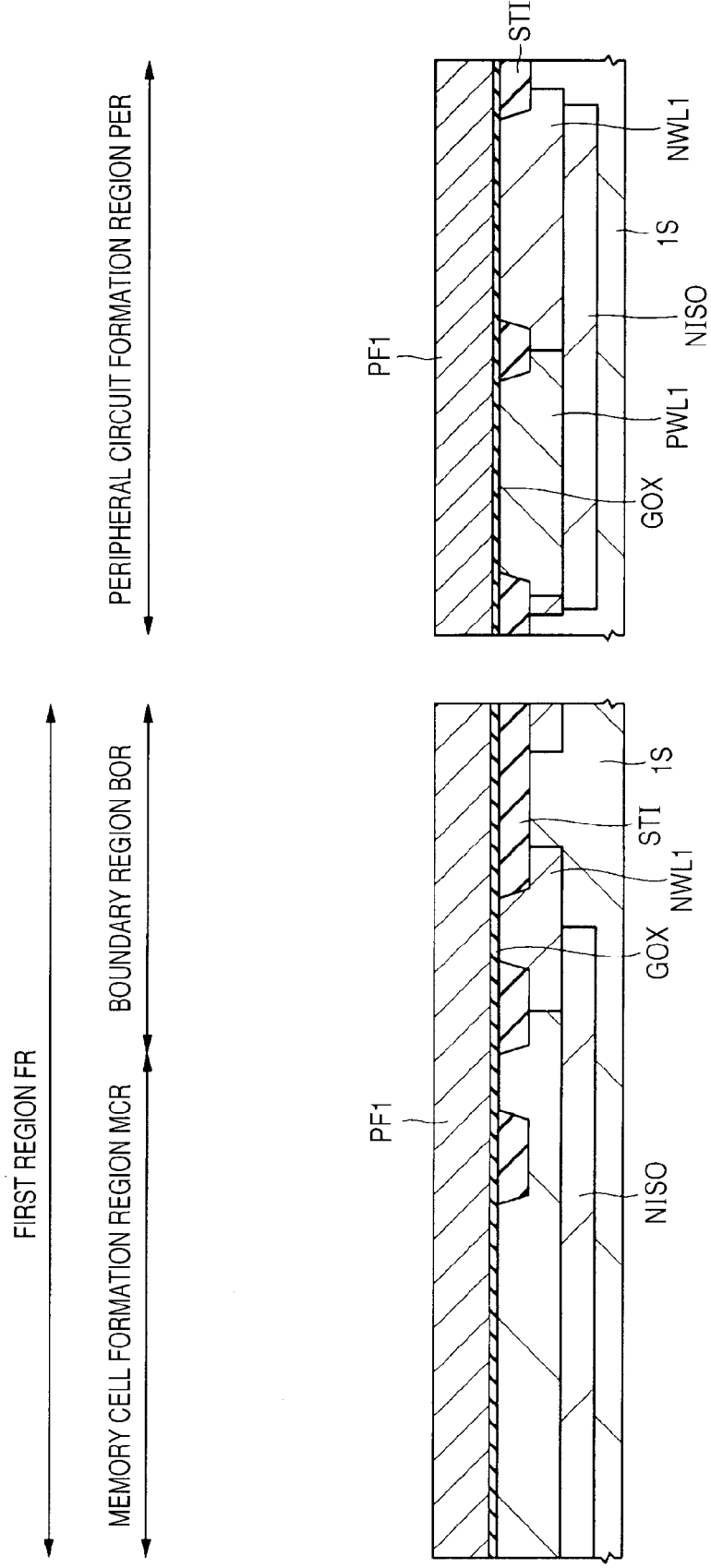
FIG. 15 is a cross-sectional view showing a manufacturing step of the semiconductor device subsequent to FIG. 14.

Then, as shown in FIG. 15, over the semiconductor substrate 1S, the gate insulation film GOX is formed. The gate insulation film GOX is a film resulting in the gate insulation film of MISFET's formed in the peripheral circuit formation region PER. Therefore, the gate insulation film GOX can be formed of, for example, a silicon oxide film, and can be formed by using, for example, a thermal oxidation method. However, the gate insulation film GOX is not limited to the silicon oxide film, and can be variously changed. For example, the gate insulation film GOX may be a silicon oxynitride (SiON) film. Namely, it may be configured such that nitrogen is segregated at the interface between the gate insulation film GOX and the semiconductor substrate 1S. The silicon oxynitride film exhibits higher effects of inhibiting occurrence of interface levels in the film, and reducing electron traps as compared with the silicon oxide film. Therefore, the hot carrier resistance of the gate insulation film GOX can be improved, and the insulation resistance can be improved. Further, the silicon oxynitride film is more resistant to penetration therethrough by impurities than the silicon oxide film. For this reason, by using a silicon oxynitride film for the gate insulation film GOX, it is possible to inhibit variations in threshold value voltage caused by diffusion of impurities in the gate electrode toward the semiconductor substrate 1S. The silicon oxynitride film may be formed in the following manner. For example, the semiconductor substrate 1S is heat treated in an atmosphere containing nitrogen such as NO, $NO_2$, or $NH_3$. Alternatively, the same effects can be obtained in the following manner. The gate insulation film GOX including a silicon oxide film is formed over the surface of the semiconductor substrate 1S. Then, the semiconductor substrate 1S is heat treated in an atmosphere containing nitrogen, thereby to segregate nitrogen at the interface between the gate insulation film GOX and the semiconductor substrate 1S.

Alternatively, the gate insulation film GOX may be formed of, for example, a high-k film with a higher dielectric constant than that of the silicon oxide film. Conventionally, from the viewpoints of high insulation resistance, and excellent stability in electric or physical properties, and the like of the silicon-silicon oxide interface, a silicon oxide film is used as the gate insulation film GOX. However, with a size reduction of elements, the film thickness of the gate insulation film GOX has come to be required to be very small. When such a thin silicon oxide film is used as the gate insulation film GOX, electrons flowing through the channel of each MISFET tunnel through the barrier formed by the silicon oxide film. Namely, there occurs a so-called tunneling current.

Under such circumstances, a high-k film has come into use which can be increased in physical film thickness even with the same volume by using a material having a higher dielectric constant than that of a silicon oxide film. With the high-k film, the physical film thickness can be increased even with the same volume. Therefore, the leakage current can be reduced.

For example, as the high-k film, there is used a hafnium oxide film ($HfO_2$ film) which is one of hafnium oxides. However, in place of the hafnium oxide film, there can also be used another hafnium type insulation film such as a hafnium aluminate film, a HfON film (hafnium oxynitride film), a HfSiO film (hafnium silicate film), a HfSiON film (hafnium silicon oxynitride film), or a HfAlO film. Further, there can also be used a hafnium type insulation film obtained by introducing an oxide such as tantalum oxide, niobium oxide, titanium oxide, zirconium oxide, lanthanum oxide, or yttrium oxide into the hafnium type insulation film. The hafnium type insulation film is, as with the hafnium oxide film, higher in dielectric constant than a silicon oxide film and a silicon oxynitride film, and hence can produce the same effects as in the case where a hafnium oxide film is used.

Figure 16:
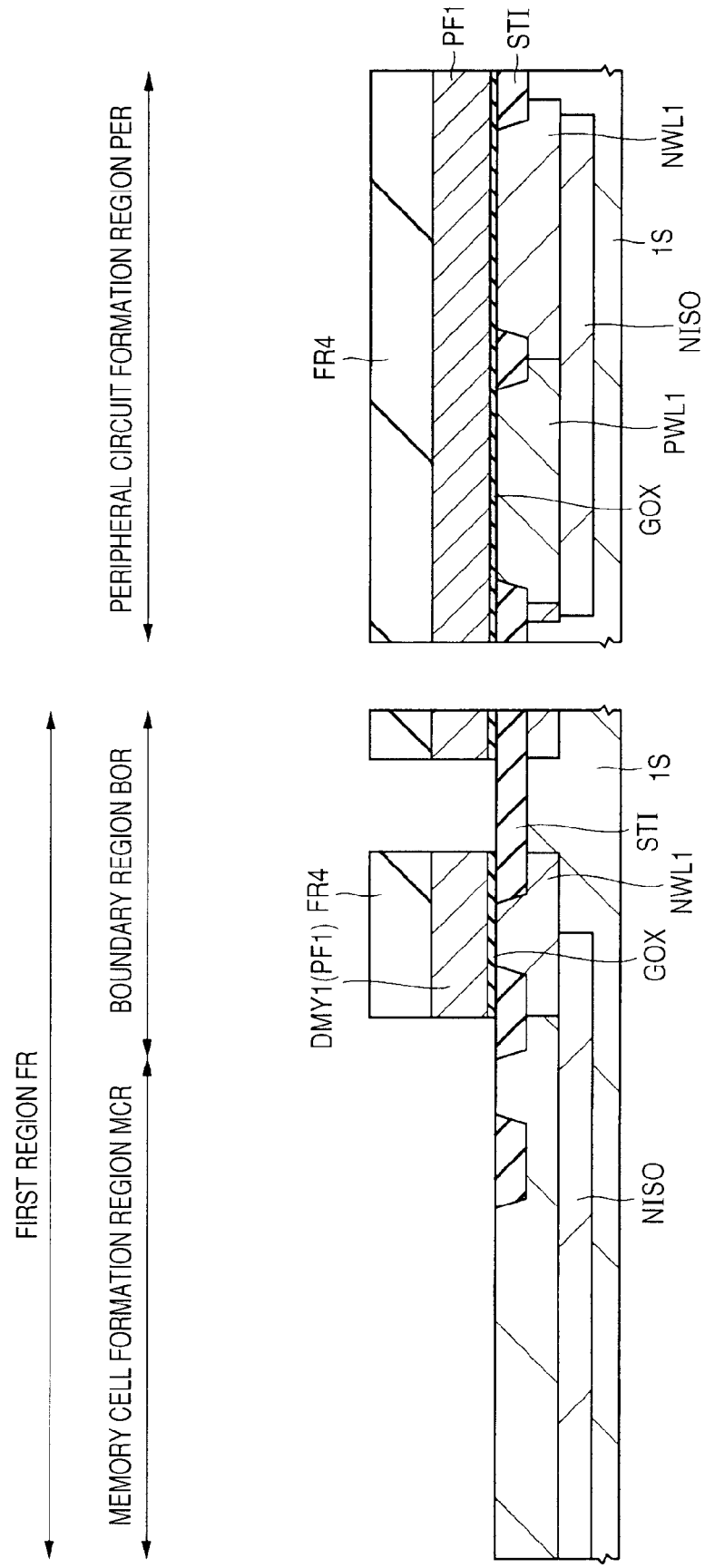
FIG. 16 is a cross-sectional view showing a manufacturing step of the semiconductor device subsequent to FIG. 15.

Subsequently, over the gate oxide film GOX, the polysilicon film PF1 is formed. The polysilicon film PF1 can be formed by using, for example, a CVD process. The polysilicon film PF1 is formed over the semiconductor substrate 1S including the first region FR and the peripheral circuit formation region PER. Then, as shown in FIG. 16, over the polysilicon film PF1, the resist film FR4 is formed. The resist film FR4 is subjected to exposure and development processings, so that the resist film FR4 is patterned. Patterning of the resist film FR4 is performed so that the resist film FR4 remains in the dummy gate electrode formation region of the boundary region BOR, and the peripheral circuit formation region PER, and so that the resist film FR4 does not remain in other regions. Then, with the etching technology using the patterned resist film FR4 as a mask, the polysilicon film PF1 is processed. As a result, the dummy gate electrode DMY1 can be formed in the boundary region BOR.

Figure 17:
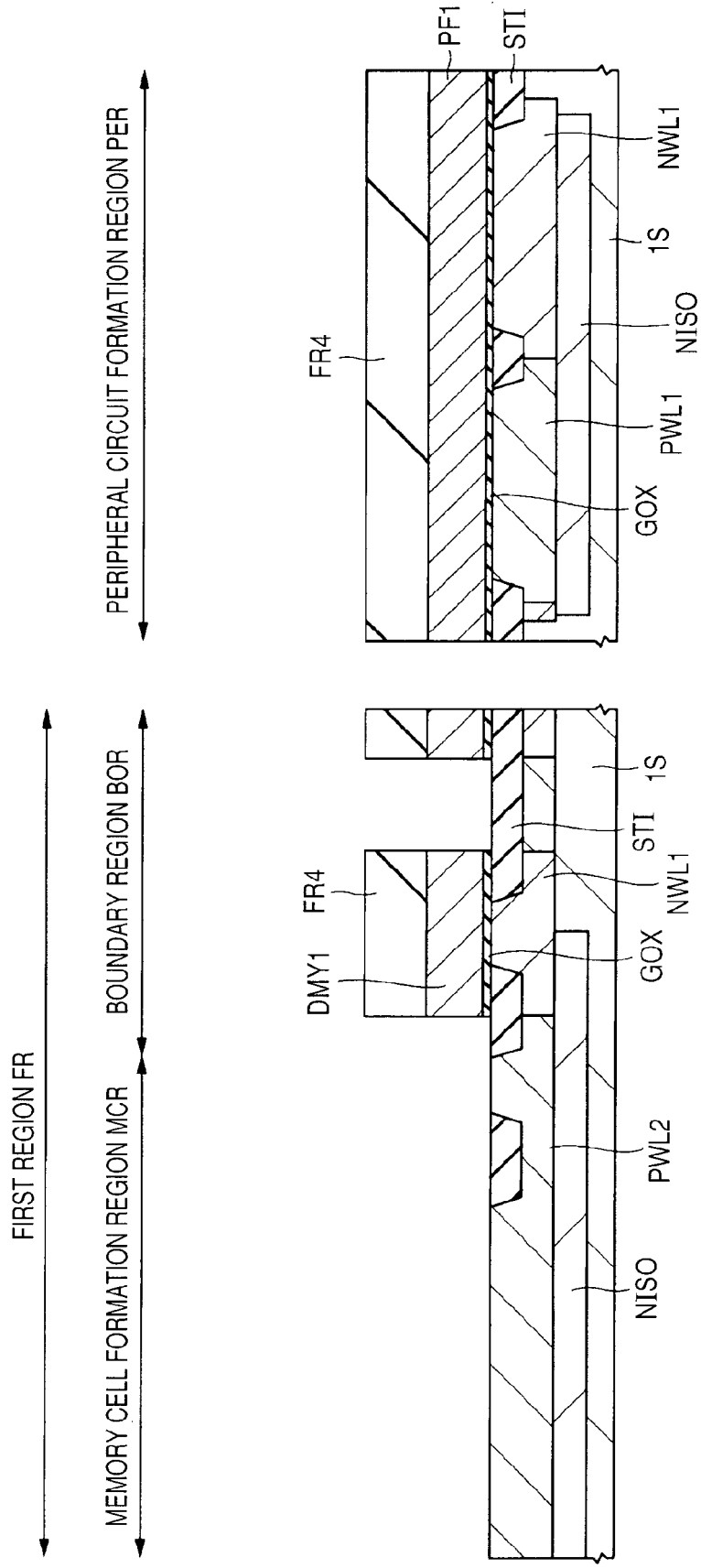
FIG. 17 is a cross-sectional view showing a manufacturing step of the semiconductor device subsequent to FIG. 16.

Then, as shown in FIG. 17, using the resist film FR4 used for forming the dummy gate electrode DMY1 as it is as a mask, an ion implantation method is carried out. As a result, the p type well PWL2 is formed in the memory cell formation region MCR. The p type well PWL2 is a semiconductor region formed by introducing p type impurities such as boron into the semiconductor substrate 1S. In Embodiment 1, by using the mask (the resist film FR4) used for forming the dummy gate electrode DMY1 as it is as a mask for the ion implantation method, it is possible to reduce masks.

Figure 18:
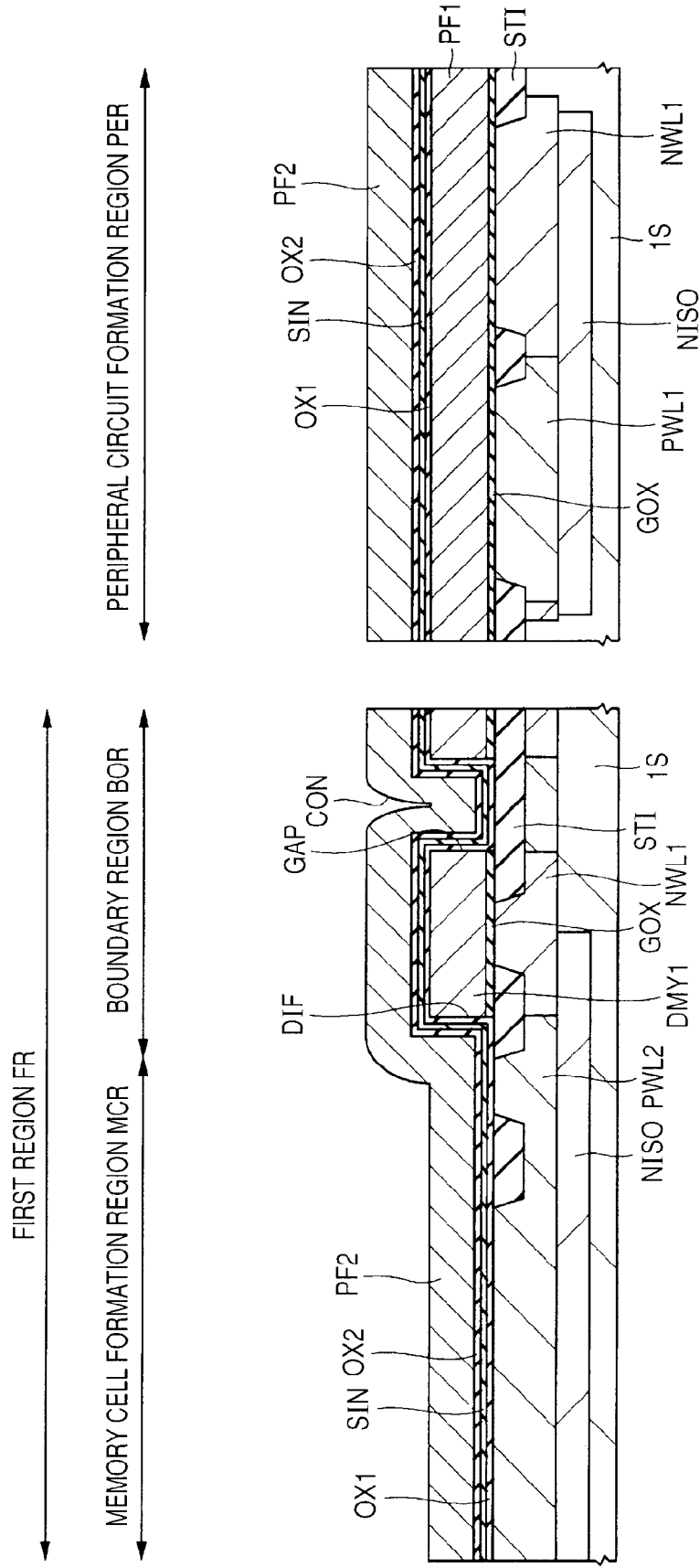
FIG. 18 is a cross-sectional view showing a manufacturing step of the semiconductor device subsequent to FIG. 17.

Subsequently, after removing the patterned resist film RF4, as shown in FIG. 18, entirely over the main surface of the semiconductor substrate 1S, a silicon oxide film OX1, a silicon nitride film SIN, and a silicon oxide film OX2 are successively formed. The silicon oxide film OX1 can be formed using, for example, a thermal oxidation method; the silicon oxide film OX2 can be formed using, for example, an ISSG (In situ Steam Generation) oxidation method; and the silicon nitride film SIN can be formed using, for example a CVD process. Then, over the silicon oxide film OX2, the polysilicon film PF2 is formed. The polysilicon film PF2 can be formed with, for example, a CVD process. The polysilicon film PF1 is formed reflecting the shapes of the step difference portion DIF and the gap groove GAP due to the formation of the dummy gate electrode DMY1. Specifically, the polysilicon film PF2 is formed in such a manner as to fill the gap groove GAP, and hence the concave part CON of the polysilicon film PF2 is formed over the gap groove GAP.

Figure 19:
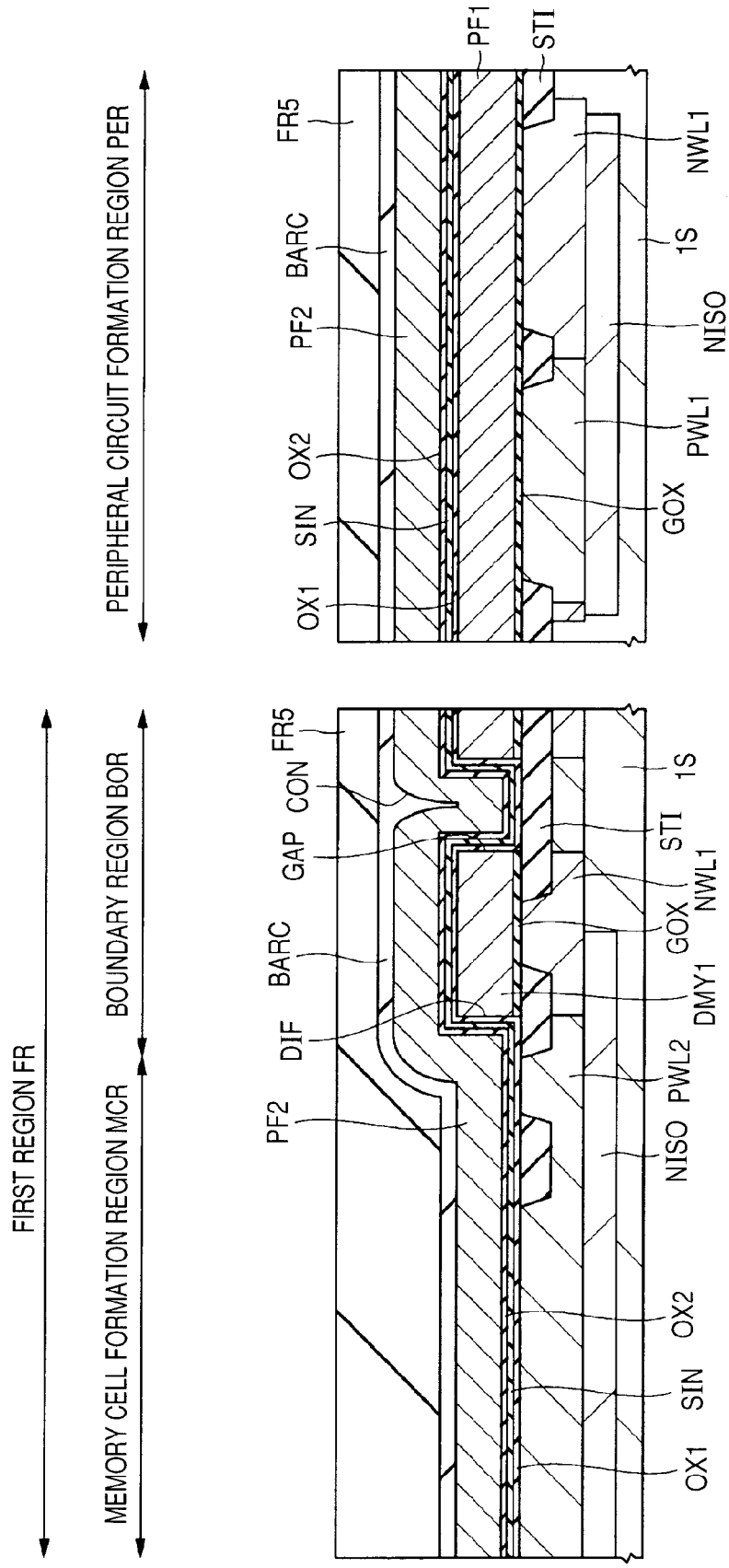
FIG. 19 is a cross-sectional view showing a manufacturing step of the semiconductor device subsequent to FIG. 18.

Then, as shown in FIG. 19, over the polysilicon film PF2, the antireflection film BARC is formed. The antireflection film BARC can be formed by, for example, a coating process. Then, over the antireflection film BARC, the resist film FR5 is formed. At this step, the feature of Embodiment 1 resides in that the antireflection film BARC is almost uniformly formed over the polysilicon film PF2. In more details, in Embodiment 1, the dummy gate electrode DMY1 including the polysilicon film PF1 is formed. Accordingly, the step difference portion DIF due to the polysilicon film PF1 is formed at the boundary between the memory cell formation region MCR and the boundary region BOR. In addition, the gap groove GAP is formed in the boundary region BOR. In other words, the formation of the dummy gate electrode DMY1 results in the formation of the gap groove GAP between the dummy gate electrode DMY1 and a portion of the polysilicon film PF1 covering the peripheral circuit formation region PER. As a result, the polysilicon film PF2 formed in such a manner as to cover the polysilicon film PF1 including the dummy gate electrode DMY1 is formed reflecting the shapes of the step difference portion DIF due to the end of the dummy gate electrode DMY1 and the gap groove GAP in the inside of the boundary region BOR. For this reason, the polysilicon film PF2 is in the shape of a step at the step difference portion DIF, and includes the concave part CON filling the gap groove GAP formed therein. Thus, the polysilicon film PF2 is formed in such a shape. This results in that the antireflection film BARC to be formed over the polysilicon film PF2 can be formed almost uniformly entirely over the semiconductor substrate is.

The reason for this will be described. The polysilicon film PF2 is also formed in the shape of a step reflecting the shape of the step difference portion DIF. Therefore, for the antireflection film BARC having a high flowability formed over the polysilicon film PF2 in the shape of a step, a portion of the antireflection film BARC formed in the higher region in the vicinity of the step difference portion DIF flows to the lower region. This results in a situation in which at the upper part of the step difference portion DIF, the antireflection film BARC is not being formed despite the antireflection film BARC has been formed. However, in Embodiment 1, the dummy gate electrode DMY1 is formed by processing the polysilicon film PF1. The formation of the dummy gate electrode DMY1 results in the formation of the gap groove GAP between the dummy gate electrode DMY1 and the polysilicon film PF1. The formation of the gap groove GAP results in the formation of the concave part CON in the polysilicon film PF2 in such a manner as to cover the dummy gate electrode DMY1 and the polysilicon film PF1. In the concave part CON, the antireflection film BARC is embedded. Consequently, in Embodiment 1, even when a portion of the antireflection film BARC formed in the higher region in the vicinity of the step difference portion DIF flows to the lower region, a portion of the antireflection film BARC having a high flowability (the material forming the antireflection film BARC) stored in the concave part CON is fed to the higher region in the vicinity of the step difference portion DIF. As a result, even when, in the higher region in the vicinity of the step difference portion DIF, a portion of the antireflection film BARC flows to the lower region, a portion of the antireflection film BARC is successively supplied from the concave part CON. For this reason, even in the higher region in the vicinity of the step difference portion DIF, the antireflection film BARC is not eliminated, and the antireflection film BARC with a prescribed film thickness can be ensured. Accordingly, it is possible to form the antireflection film BARC with a film thickness enough for inhibiting reflection in the region in the vicinity of the step difference portion DIF.

Figure 20:
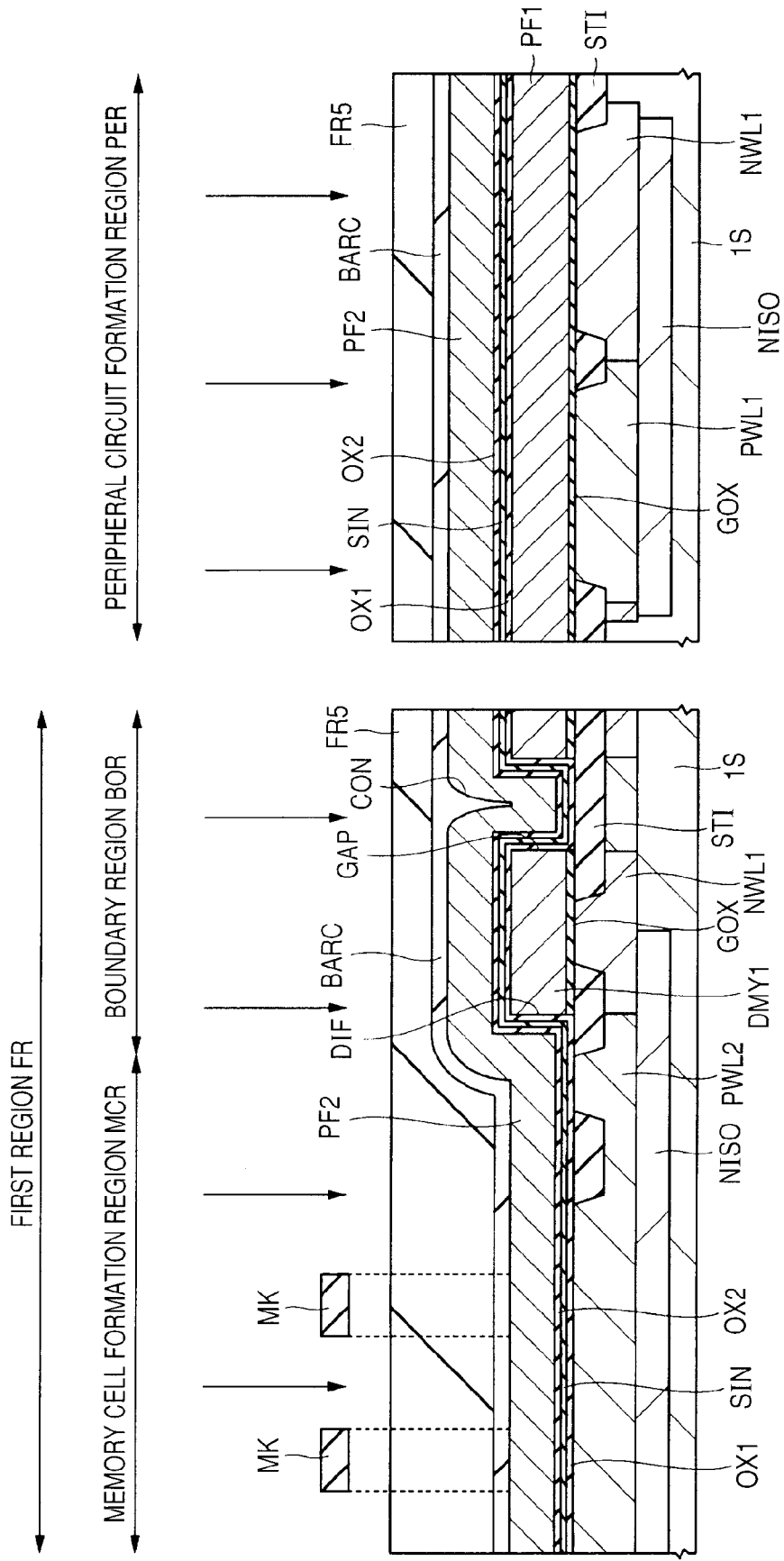
FIG. 20 is a cross-sectional view showing a manufacturing step of the semiconductor device subsequent to FIG. 19.

Then, as shown in FIG. 20, an exposure processing is carried out on the resist film FR5 via the mask MK. At this step, to a portion of the resist film FR5 in the region including the mask MK formed therein, the application of an exposure light is blocked. On the other hand, to a portion of the resist film FR5 in the region including no mask MK formed therein, an exposure light is applied. Then, the portion of the resist film FR5 irradiated with an exposure light is photosensitized, however, a part of the exposure light passes through the resist film FR5. The exposure light which has passed through the resist film FR5 is irregularly reflected by the underlayer film (polysilicon film PF2). This results in that a portion of the resist film FR5 in the region covered with the mask MK also undergoes unintended exposure. However, in Embodiment 1, the antireflection film BARC is formed between the resist film FR5 and the polysilicon film PF2 which is the underlayer film. This can inhibit the irregular reflection of the exposure light which has passed through the resist film FR5 by the underlayer film. Particularly, in Embodiment 1, the dummy gate electrode DMY1 is formed, and the polysilicon film PF2 is formed in such a manner as to cover the dummy gate electrode DMY1. Therefore, the polysilicon film PF2 is formed in the shape of a step reflecting the step difference portion DIF, and includes the concave part CON formed therein reflecting the gap groove GAP. Therefore, even when a portion of the antireflection film BARC flows from the higher region in the vicinity of the step difference portion DIF to the lower region due to the step difference portion DIF, the antireflection film BARC is supplied from the concave part CON in an amount enough to compensate for the amount of antireflection film BARC eliminated in the vicinity of the step difference portion DIF because a portion of the antireflection film BARC is stored in the concave part CON. For this reason, according to Embodiment 1, it is possible to form the antireflection film BARC with a film thickness to such a degree as to sufficiently inhibit irregular reflection of exposure light even at the step difference portion DIF. As a result, according to Embodiment 1, it is possible to inhibit unintended irregular reflection of exposure light, which can improve the patterning precision of the resist film FR5.

Figure 21:
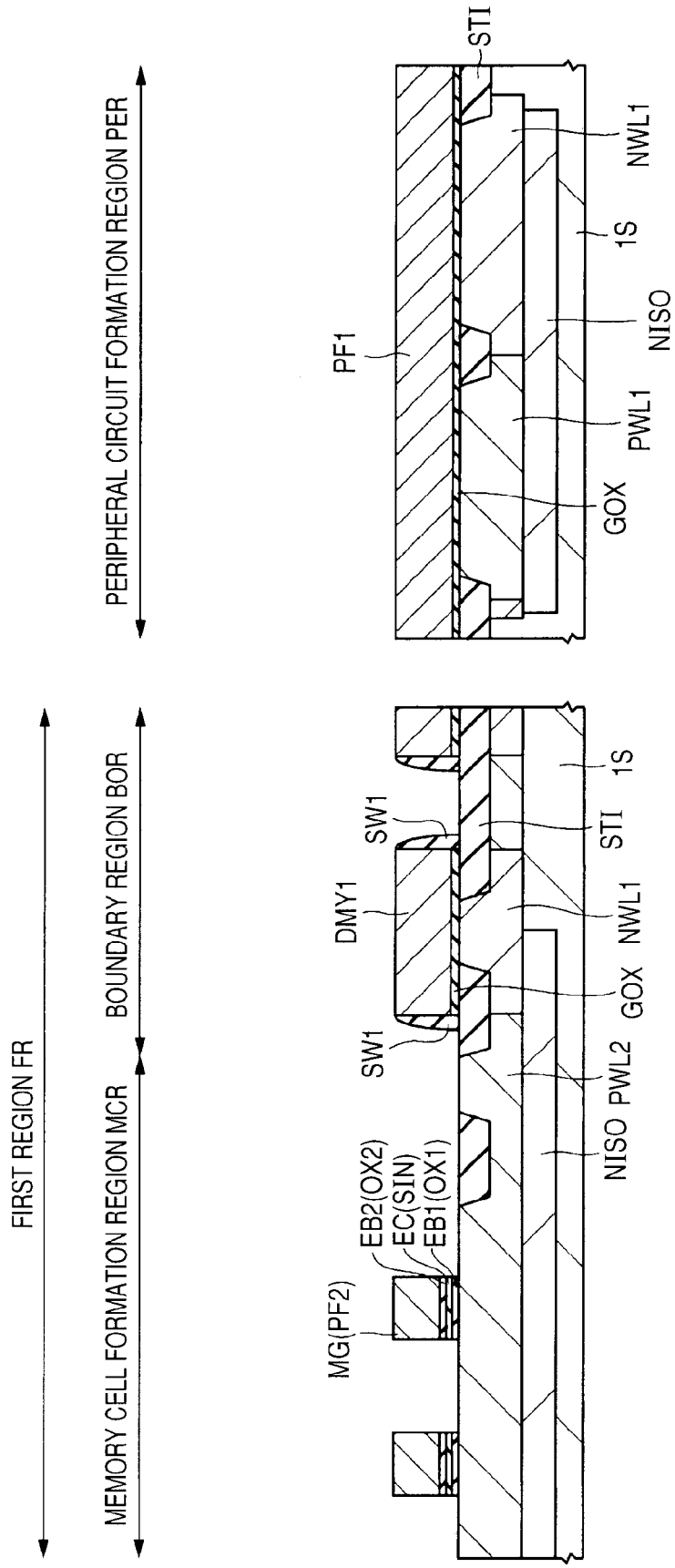
FIG. 21 is a cross-sectional view showing a manufacturing step of the semiconductor device subsequent to FIG. 20.

Subsequently, as shown in FIG. 21, the polysilicon film PF2 is processed using the patterned resist film FR5 as a mask, so that the memory gate electrodes MG are formed in the memory cell formation region MCR. At this step, the patterning precision of the resist film FR5 has been improved, which can also improve the processing precision of the memory gate electrodes MG. In other words, the memory gate electrode MG formed on the outermost periphery of the memory cell formation region MCR can also be prevented from becoming smaller in gate width than other memory gate electrodes MG. As a result, according to Embodiment 1, it is possible to improve the deterioration of the patterning precision of the resist film FR5 caused by elimination of the antireflection film BARC due to the step difference. This can improve the processing precision of the memory gate electrodes MG. Incidentally, as shown in FIG. 21, after processing the memory gate electrodes MG, the silicon oxide film OX2, the silicon nitride film SIN, and the silicon oxide film OX1 in layers underlying the memory gate electrode MG are also processed. Accordingly, in a layer underlying the memory gate electrode MG, there can be formed the first potential barrier film EB1 including the silicon oxide film OX1, and there can be formed the electric charge storage film EC including the silicon nitride film formed over the first potential barrier film EB1. Further, over the electric charge storage film EC, there can be formed the second potential barrier film EB2 including the silicon oxide film OX2. In the step of processing the memory gate electrode MG, the sidewall SW1 is formed on the sidewall of the dummy gate electrode DMY1. In this step, it is necessary to leave a space required for ensuring the processing precision of the memory gate electrode MG on the outer periphery side of the memory cell formation region MCR.

Figure 22:
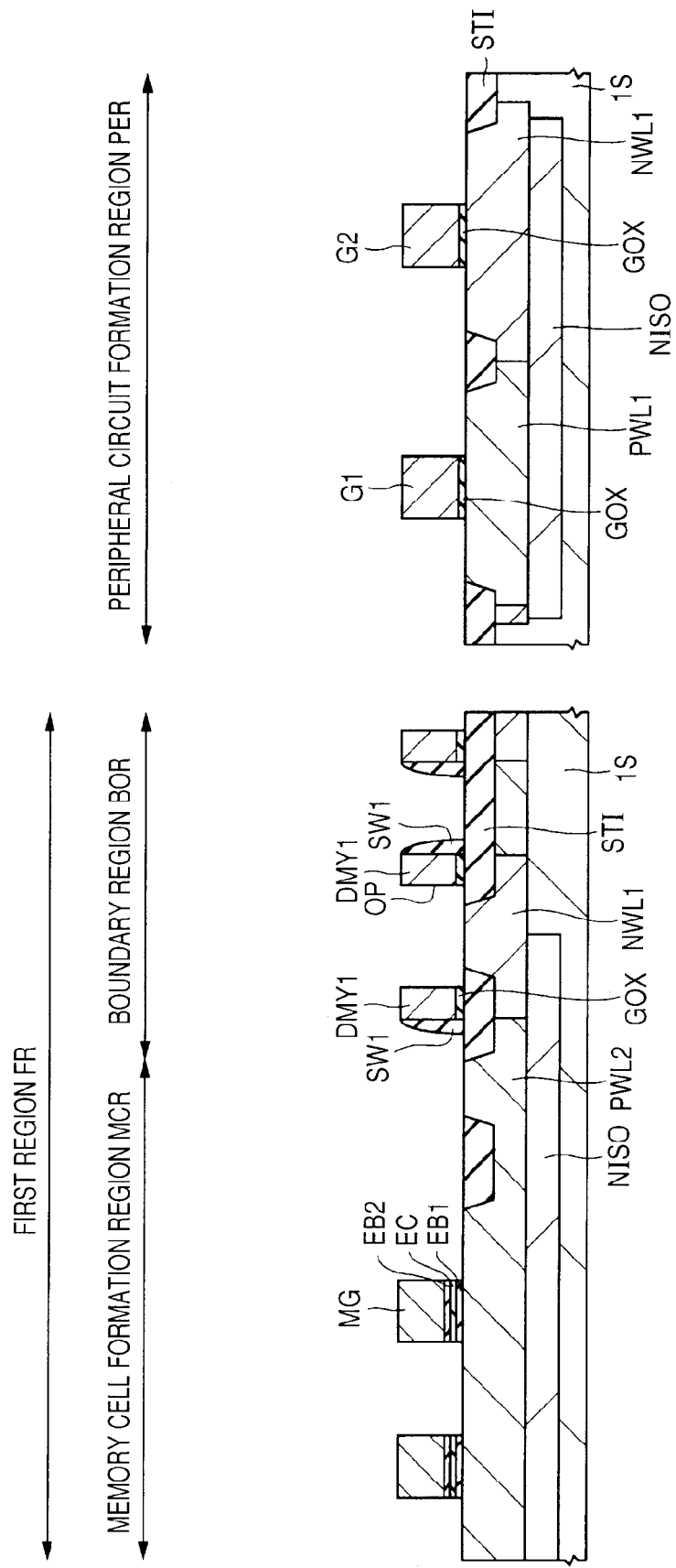
FIG. 22 is a cross-sectional view showing a manufacturing step of the semiconductor device subsequent to FIG. 21.

Then, as shown in FIG. 22, by using the photolithography technology and the etching technology, the polysilicon film PF1 formed in the peripheral circuit formation region PER is processed. As a result, in the peripheral circuit formation region PER, the gate electrode G1 and the gate electrode G2 including the polysilicon film PF1 are formed. At this step, simultaneously, the dummy gate electrode DMY1 formed in the boundary region BOR is also processed, thereby to form an opening OP in the central part of the dummy gate electrode DMY1. Through the opening OP, the n type well NWL1 formed in the semiconductor substrate 1S is exposed.

Figure 23:
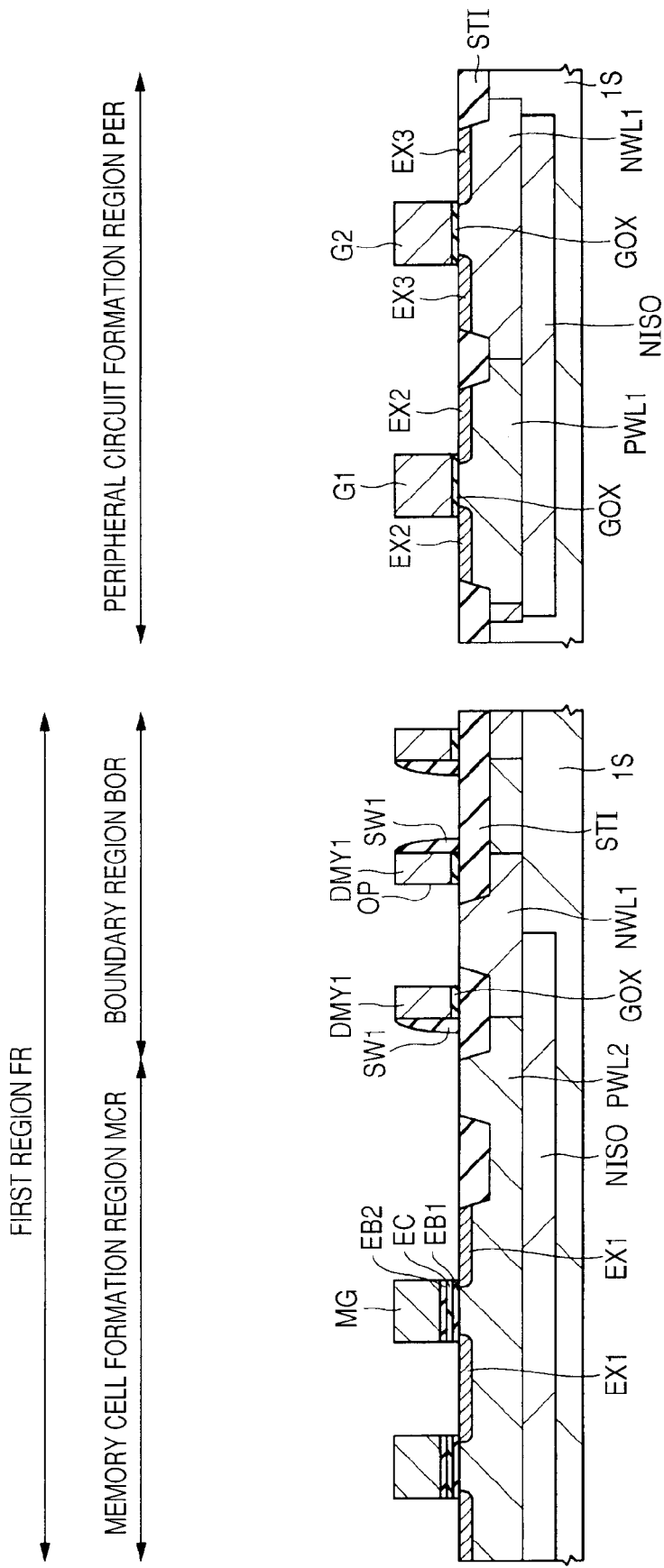
FIG. 23 is a cross-sectional view showing a manufacturing step of the semiconductor device subsequent to FIG. 22.

Subsequently, as shown in FIG. 23, in the memory cell formation region MCR, by using the photolithography technology and the ion implantation method, the shallow n type impurity diffusion regions EX1 are formed in portions of the semiconductor substrate 1S in alignment with the memory gate electrodes MG. Each shallow n type impurity diffusion region EX1 is a semiconductor region formed by introducing n type impurities such as phosphorus or arsenic into the semiconductor substrate 1S. Similarly, in the peripheral circuit formation region PER, by using the photolithography technology and the ion implantation method, the shallow n type impurity diffusion regions EX2 are formed in portions of the semiconductor substrate 1S in alignment with the gate electrode G1. Each shallow n type impurity diffusion region EX2 is also a semiconductor region formed by introducing n type impurities such as phosphorus or arsenic into the semiconductor substrate 1S. Further, in the peripheral circuit formation region PER, by using the photolithography technology and the ion implantation method, the shallow p type impurity diffusion regions EX3 are formed in portions of the semiconductor substrate 1S in alignment with the gate electrode G2. Each shallow p type impurity diffusion region EX3 is a semiconductor region formed by introducing p type impurities such as boron into the semiconductor substrate 1S.

Figure 24:
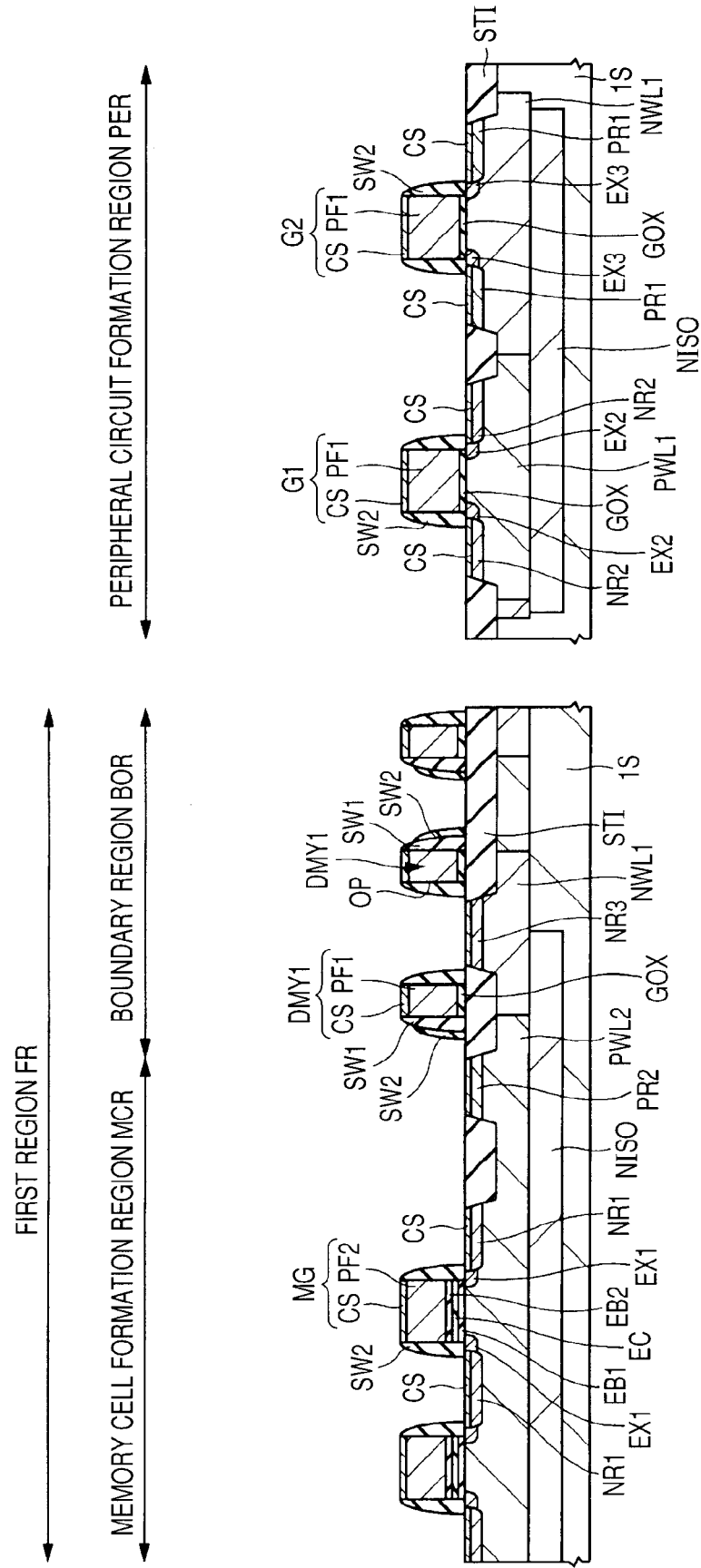
FIG. 24 is a cross-sectional view showing a manufacturing step of the semiconductor device subsequent to FIG. 23.

Then, as shown in FIG. 24, over the semiconductor substrate 1S, an insulation film including, for example, a silicon oxide film is formed. Then, the insulation film is subjected to anisotropic etching, thereby to form the sidewalls SW2. Specifically, the sidewalls SW2 are formed over the sidewalls on opposite sides of the memory gate electrodes MG. The sidewalls SW2 are also formed on opposite sides of the dummy gate electrodes DMY1. Further, also in the peripheral circuit formation region PER, the sidewalls SW2 are formed over the sidewalls of the gate electrode G1 and the gate electrode G2.

Then, in the memory cell formation region MCR, by using the photolithography technology and the ion implantation method, deep n type impurity diffusion regions NR1 are formed in portions of the semiconductor substrate 1S in alignment with the sidewalls SW2 formed over the sidewalls of the memory gate electrode MG. Each deep n type impurity diffusion region NR1 is a semiconductor region formed by introducing n type impurities such as phosphorus or arsenic into the semiconductor substrate 1S. At this step, into the deep n type impurity diffusion region NR1, n type impurities are introduced in a higher concentration than into the shallow n type impurity diffusion region EX1. The shallow n type impurity diffusion regions EX1 and the deep n type impurity diffusion regions NR1 form the source region and the drain region of the MONOS type transistor.

Similarly, in the peripheral circuit formation region PER, by using the photolithography technology and the ion implantation method, deep n type impurity diffusion regions NR2 are formed in portions of the semiconductor substrate 1S in alignment with the sidewalls SW2 formed over the sidewalls of the gate electrode G1. Each deep n type impurity diffusion region NR2 is also a semiconductor region formed by introducing n type impurities such as phosphorus or arsenic into the semiconductor substrate 1S. At this step, into the deep n type impurity diffusion region NR2, n type impurities are introduced in a higher concentration than into the shallow n type impurity diffusion region EX2. The shallow n type impurity diffusion regions EX2 and the deep n type impurity diffusion regions NR2 form the source region and the drain region of the n channel type MISFET.

Similarly, in the peripheral circuit formation region PER, by using the photolithography technology and the ion implantation method, deep p type impurity diffusion regions PR1 are formed in portions of the semiconductor substrate 1S in alignment with the sidewalls SW2 formed over the sidewalls of the gate electrode G2. Each deep p type impurity diffusion region PR1 is a semiconductor region formed by introducing p type impurities such as boron into the semiconductor substrate 1S. At this step, into the deep p type impurity diffusion region PR1, p type impurities are introduced in a higher concentration than into the shallow p type impurity diffusion region EX3. The shallow p type impurity diffusion regions EX3 and the deep p type impurity diffusion regions PR1 form the source region and the drain region of the p channel type MISFET.

Further, in the memory cell formation region MCR, the p type semiconductor region PR2 is formed over the surface of the p type well PWL2 exposed to the outside of the memory gate electrode MG formed in the outermost periphery. Then, in the boundary region BOR, over the surface of the n type well NWL1 exposed through the opening formed in the central part of the dummy gate electrode DMY1, the n type semiconductor region NR3 is formed.

Then, the silicide step will be described by reference to FIG. 24. Over the semiconductor substrate 1S, a cobalt film is formed. At this step, in the memory cell formation region MCR, the cobalt film is also in direct contact with the exposed memory gate electrode MG, and the deep n type impurity diffusion regions NR1 exposed at the semiconductor substrate 1S. Further, the cobalt film is also in direct contact with the p type semiconductor region PR2 formed in the surface of the semiconductor substrate 1S. Whereas, also in the boundary region BOR, the cobalt film is also in direct contact with the dummy gate electrode DMY1, and the n type semiconductor region NR3 formed in the surface of the semiconductor substrate 1S. On the other hand, also in the peripheral circuit formation region PER, the cobalt film is also in direct contact with the gate electrodes G1 and G2, the deep n type impurity diffusion regions NR2, and the deep p type impurity diffusion regions PR1.

Then, the semiconductor substrate 1S is subjected to a heat treatment. As a result, in the memory cell formation region MCR, the cobalt silicide film CS is formed over the memory gate electrodes MG, the deep n type impurity diffusion regions NR1, and the p type semiconductor region PR2. As a result, each memory gate electrode MG is in a lamination structure of the polysilicon film PF2 and the cobalt silicide film CS. The cobalt silicide film CS is formed in order to reduce the resistance of the memory gate electrodes MG. Similarly, by the foregoing heat treatment, also at the surfaces of the p type semiconductor region PR2 and the deep n type impurity diffusion regions NR1, silicon and the cobalt film react with each other to form the cobalt silicide film CS. For this reason, it is also possible to reduce the resistance in the p type semiconductor region PR2 and the deep n type impurity diffusion regions NR1.

Similarly, also in the boundary region BOR, the cobalt silicide film CS is formed over the dummy gate electrode DMY1, and the n type semiconductor region NR3. As a result, the dummy electrode DMY1 is in a lamination structure of the polysilicon film PF1 and the cobalt silicide film CS. By the foregoing heat treatment, also at the surface of the n type semiconductor region NR3, silicon and the cobalt film react with each other to form the cobalt silicide film CS. For this reason, it is also possible to reduce the resistance in the n type semiconductor region NR3.

Further, also in the peripheral circuit formation region PER, the polysilicon film PF1 forming the gate electrodes G1 and G2 and the cobalt film are allowed to react with each other, thereby to form the cobalt silicide film CS. As a result, the gate electrodes G1 and G2 are each in a lamination structure of the polysilicon film PF1 and the cobalt silicide film CS. The cobalt silicide film CS is formed in order to reduce the resistance of the gate electrodes G1 and G2. By the foregoing heat treatment, also at the surfaces of the deep n type impurity diffusion regions NR2 and the deep p type impurity diffusion regions PR1, silicon and the cobalt film react with each other to form the cobalt silicide film CS. For this reason, it is also possible to reduce the resistance in the deep n type impurity diffusion regions NR2 and the deep p type impurity diffusion regions PR1.

Then, the unreacted portions of the cobalt film are removed from over the semiconductor substrate 1S. Incidentally, in Embodiment 1, the cobalt silicide film CS is formed. However, for example, a nickel silicide film or a titanium silicide film may be formed in place of the cobalt silicide film CS. In the foregoing manner, in the memory cell formation region MCR of the semiconductor substrate 1S, a plurality of memory cells (MONOS type transistors), and the p type well power supply region can be formed. In the peripheral circuit formation region PER, the n channel type MISFET and the p channel type MISFET can be formed. Then, in the boundary region BOR, the n type well power supply region can be formed.

Then, the wiring step will be described by reference to FIG. 4. As shown in FIG. 4, over the main surface of the semiconductor substrate 1S, the interlayer insulation film IL1 is formed. The interlayer insulation film IL1 is formed of, for example, a silicon oxide film, and can be formed by using a CVD process using TEOS (tetraethylorthosilicate) as a raw material. Then, the surface of the interlayer insulation film IL1 is planarized by using, for example, a CMP (Chemical Mechanical Polishing) process. Incidentally, the interlayer insulation film IL1 may be formed of a lamination film of a silicon nitride film and a silicon oxide film. In other words, the silicon nitride film can also be used as an etching stopper film for forming contact holes in the interlayer insulation film IL1 (SAC (Self Align Contact)).

Subsequently, by using the photolithography technology and the etching technology, in the interlayer insulation film IL1, contact holes CNT1 to CNT4 are formed. The contact holes CNT1 and CNT2 are formed in the memory cell formation region MCR; the contact hole CNT3 is formed in the boundary region BOR; and the contact hole CNT4 is formed in the peripheral circuit formation region PER.

Herein, the contact hole CNT2 is formed in the space necessary for ensuring the processing precision of the memory gate electrodes MG in the memory cell formation region MCR. However, the contact hole CNT2 can also be formed on the outside of the dummy gate electrode DMY1 formed in the boundary region BOR on the outside of the memory cell formation region MCR. However, in that case, the area of the semiconductor chip unfavorably increases. For this reason, in Embodiment 1, the contact hole CNT2 is formed in a region left as a space necessary for ensuring the processing precision of the memory gate electrodes MG in the memory cell formation region MCR. This allows a layout such as to prevent an increase in area of the semiconductor chip.

Then, over portions of the interlayer insulation film IL1 including the bottoms and the inner walls of the contact holes CNT1 to CNT4, a titanium/titanium nitride film is formed. The titanium/titanium nitride film includes a lamination film of a titanium film and a titanium nitride film, and can be formed by using, for example, a sputtering process. The titanium/titanium nitride film has a so-called barrier property of preventing diffusion of, for example, tungsten which is a material of a film to be embedded in the subsequent step into silicon.

Subsequently, a tungsten film is formed entirely over the main surface of the semiconductor substrate 1S in such a manner as to fill the contact holes CNT1 to CNT4. The tungsten film can be formed by using, for example, a CVD process. Then, unnecessary portions of the titanium/titanium nitride film and the tungsten film formed over the interlayer insulation film IL1 are removed by using, for example, a CVD process. As a result, plugs PLG1 to PLG4 can be formed.

Then, as shown in FIG. 4, over the interlayer insulation film IL1 including the plugs PLG1 to PLG4 formed therein, the interlayer insulation film IL2 is formed. Then, by using the photolithography technology and the etching technology, grooves are formed in the interlayer insulation film IL2. Then, over the interlayer insulation film IL2 including the insides of the grooves, a tantalum/tantalum nitride film is formed. The tantalum/tantalum nitride film can be formed by, for example, a sputtering process. Subsequently, over the tantalum/tantalum nitride film, a seed film including a thin copper film is formed with, for example, a sputtering process. Then, with an electroplating method using the seed film as an electrode, a copper film is formed over the interlayer insulation film IL2 including grooves formed therein. Then, portions of the copper film exposed over the interlayer insulation film IL2 except for the insides of the grooves are polished and removed by, for example, a CMP process. Accordingly, the copper film is left only in the grooves formed in the interlayer insulation film IL2. As a result, the wiring L1 can be formed. Further, a multilayer wire is formed in a layer overlying the wiring L1. However, a description thereon is herein omitted. In this manner, the semiconductor device in Embodiment 1 can be finally manufactured.

In Embodiment 1, the dummy gate electrode DMY1 including the polysilicon film PF1 is formed. Accordingly, the step difference portion DIF due to the polysilicon film PF1 is formed at the boundary between the memory cell formation region MCR and the boundary region BOR. In addition, the gap groove GAP is formed in the boundary region BOR. In other words, the formation of the dummy gate electrode DMY1 results in the formation of the gap groove GAP between the dummy gate electrode DMY1 and a portion of the polysilicon film PF1 covering the peripheral circuit formation region PER. As a result, the polysilicon film PF2 formed in such a manner as to cover the polysilicon film PF1 including the dummy gate electrode DMY1 is formed reflecting the shapes of the step difference portion DIF due to the end of the dummy gate electrode DMY1 and the gap groove GAP in the inside to the boundary region BOR. For this reason, the polysilicon film PF2 is in the shape of a step at the step difference portion DIF, and includes the concave part CON filling the gap groove GAP formed therein. Thus, the polysilicon film PF2 is formed in such a shape. Consequently, even when, a portion of the antireflection film BARC formed in the higher region in the vicinity of the step difference portion DIF flows to the lower region, a portion of the antireflection film BARC stored in the concave part CON is fed to the higher region in the vicinity of the step difference portion DIF. As a result, even when, in the higher region in the vicinity of the step difference portion DIF, a portion of the antireflection film BARC flows to the lower region, a portion of the antireflection film BARC is successively supplied from the concave part CON. For this reason, even in the higher region in the vicinity of the step difference portion DIF, the antireflection film BARC is not eliminated, and the antireflection film BARC with a prescribed film thickness can be ensured. Accordingly, it is possible to form the antireflection film BARC with a film thickness enough for inhibiting reflection in the region in the vicinity of the step difference portion DIF. As a result, according to Embodiment 1, it is possible to inhibit unintended irregular reflection of exposure light, which can improve the patterning precision of the resist film FR5. Therefore, the patterning precision of the resist film FR5 has been improved. This can provide a remarkable effect of being capable of improving the processing precision of the memory gate electrodes MG.

Further, in Embodiment 1, at the central part of the dummy gate electrode DMY1, the opening OP is formed. Thus, an electric power is supplied to the n type well NWL1 exposed through the opening OP. In other words, the dummy gate electrode DMY1 is mainly formed for the purpose of inhibiting flowing of the antireflection film BARC during the manufacturing process. However, after implementing the purpose, the dummy gate electrode DMY1 functions as a power supply region to the n type well NWL1 and the well isolation layer NISO (deep well). Namely, the formation of the dummy gate electrode DMY1 results in the formation of the n type well NWL1 to be coupled with the well isolation layer NISO in a portion of the semiconductor substrate 1S immediately under the dummy gate electrode DMY1. Therefore, the boundary region BOR including the dummy gate electrode DMY1 formed therein is utilized as a power supply region to the n type well NWL1. This eliminates the necessity of providing another power supply region to the n type well NWL1 and the well isolation layer NISO, which allows reduction in size of the semiconductor device.

Incidentally, in Embodiment 1, the formation of the dummy gate electrode DMY1 can improve the processing precision of the memory gate electrodes MG. Particularly, it is possible to inhibit bad processing of the memory gate electrode formed in the outermost peripheral region of the memory cell formation region MCR. However, the formation of the dummy gate electrode DMY1 can reduce bad processing of the memory gate electrode MG formed in the outermost periphery of the memory cell formation region MCR. When the processing precision of the memory gate electrode MG is further required, it is also acceptable that the memory gate electrode MG formed on the outermost periphery is not used. Namely, the processing precision of the memory gate electrode MG formed on the outermost periphery of the memory cell formation region MCR becomes a problem. Therefore, it is also effective that the memory gate electrode MG is not allowed to function as a memory cell.

(Embodiment 2) In Embodiment 1, as shown in FIG. 4, there was shown an example in which by providing an opening at the central part of the dummy gate electrode DMY1, a plug PLG3 for feeding an electric potential to the n type well NWL1 formed under the dummy gate electrode DMY1 is formed. In Embodiment 2, a description will be given to an example in which the dummy gate electrode DMY1 is left as it is. Namely, in Embodiment 2, a description will be given to an example in which an opening is not provided at the central part of the dummy gate electrode DMY1.

Figure 25:
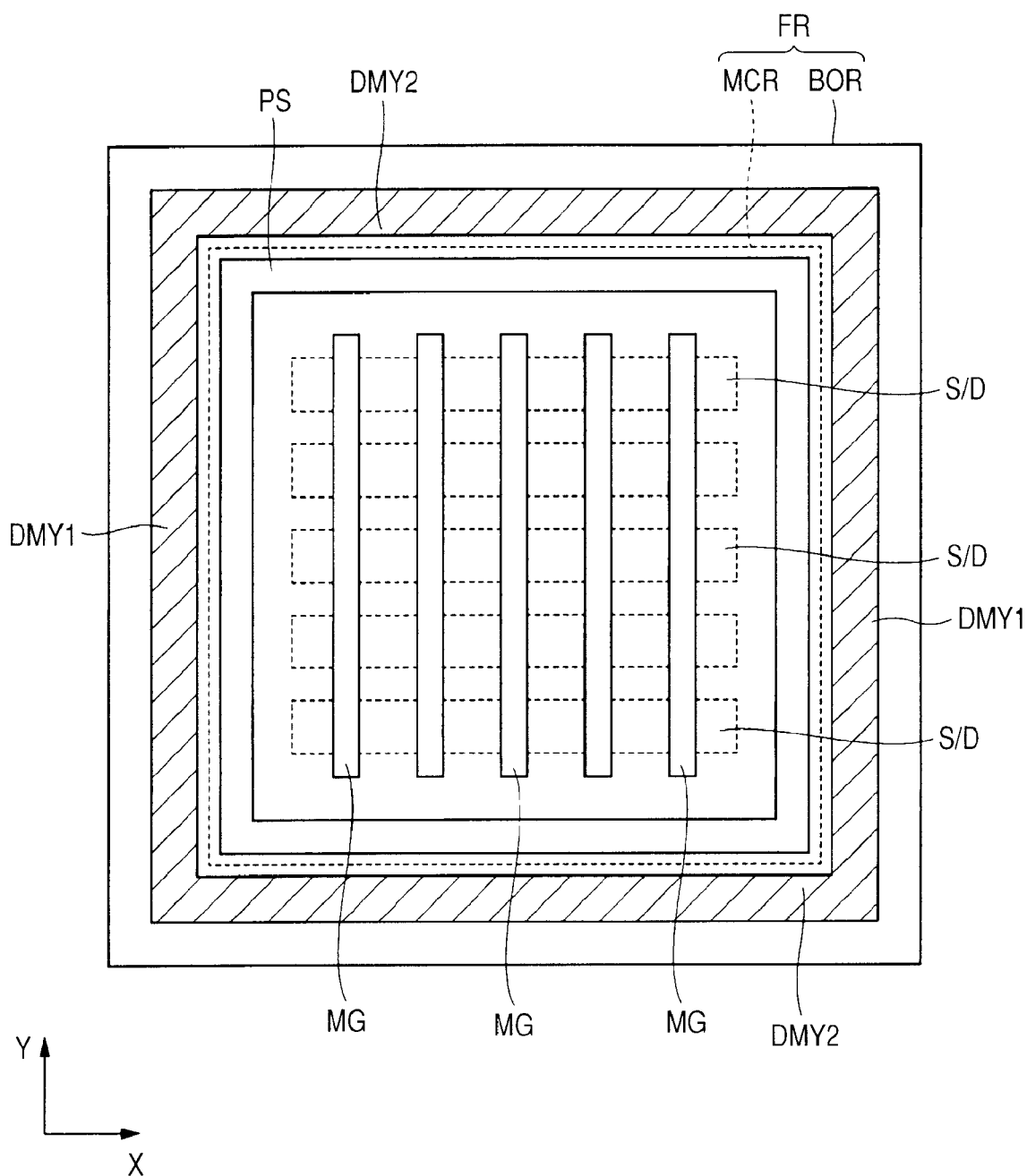
FIG. 25 is a view schematically showing a memory cell array in Embodiment 2.

FIG. 25 is a view schematically showing a memory cell array in Embodiment 2. In FIG. 25, there are shown the memory cell formation region MCR, and the boundary region BOR formed on the outside of the memory cell formation region MCR. A combined region of the memory cell formation region MCR and the boundary region BOR is defined as a first region FR. Then, although not shown in FIG. 25, there exists a peripheral circuit formation region including a peripheral circuit formed therein on the outside of the first region FR.

First, in FIG. 25, in the memory cell formation region MCR, a plurality of memory cells are formed. Specifically, there exist a plurality of memory gate electrodes MG (word lines) along a Y axis direction. Then, there exist a plurality of source regions/drain regions S/D in an X axis direction orthogonal to the Y axis direction. A memory cell is formed in each region of intersection of the memory gate electrodes MG and the source regions/drain region S/D. Therefore, in FIG. 25, a plurality of memory cells are arranged in an array (in a matrix). The region including a plurality of memory cells arranged in an array therein corresponds to the storage unit of the flash memory. Each individual memory cell is a circuit for storing 1 bit of unit information, and includes a MONOS type transistor serving as a storage unit. On the outside of the region including a plurality of memory cells formed therein, a power supply region PS is formed. From the power supply region PS, a potential is fed to a well (not shown) common to respective memory cells.

Then, on the outside of the memory cell formation region MCR, the boundary region BOR is formed. In Embodiment 2, in the boundary region BOR, there are formed dummy gate electrodes (dummy gates) DMY1 and dummy gate electrodes DMY2. The dummy gate electrodes DMY1 and the dummy gate electrodes DMY2 show a dummy pattern not functioning as a gate electrode. In FIG. 25, a pair of the dummy gate electrodes DMY1 are formed in such a manner as to interpose the memory cell formation region MCR therebetween. Namely, the dummy gate electrodes DMY1 are formed in one pair in such a manner as to interpose the memory cell formation region MCR therebetween from left and right sides. Similarly, a pair of the dummy gate electrodes DMY2 are formed in such a manner as to interpose the memory cell formation region MCR therebetween from top and bottom. The dummy gate electrodes DMY1 and the dummy gate electrodes DMY2 are coupled to each other. Thus, the periphery of the memory cell formation region MCR is surrounded by the mutually coupled dummy gate electrodes DMY1 and dummy gate electrodes DMY2.

Figure 26:
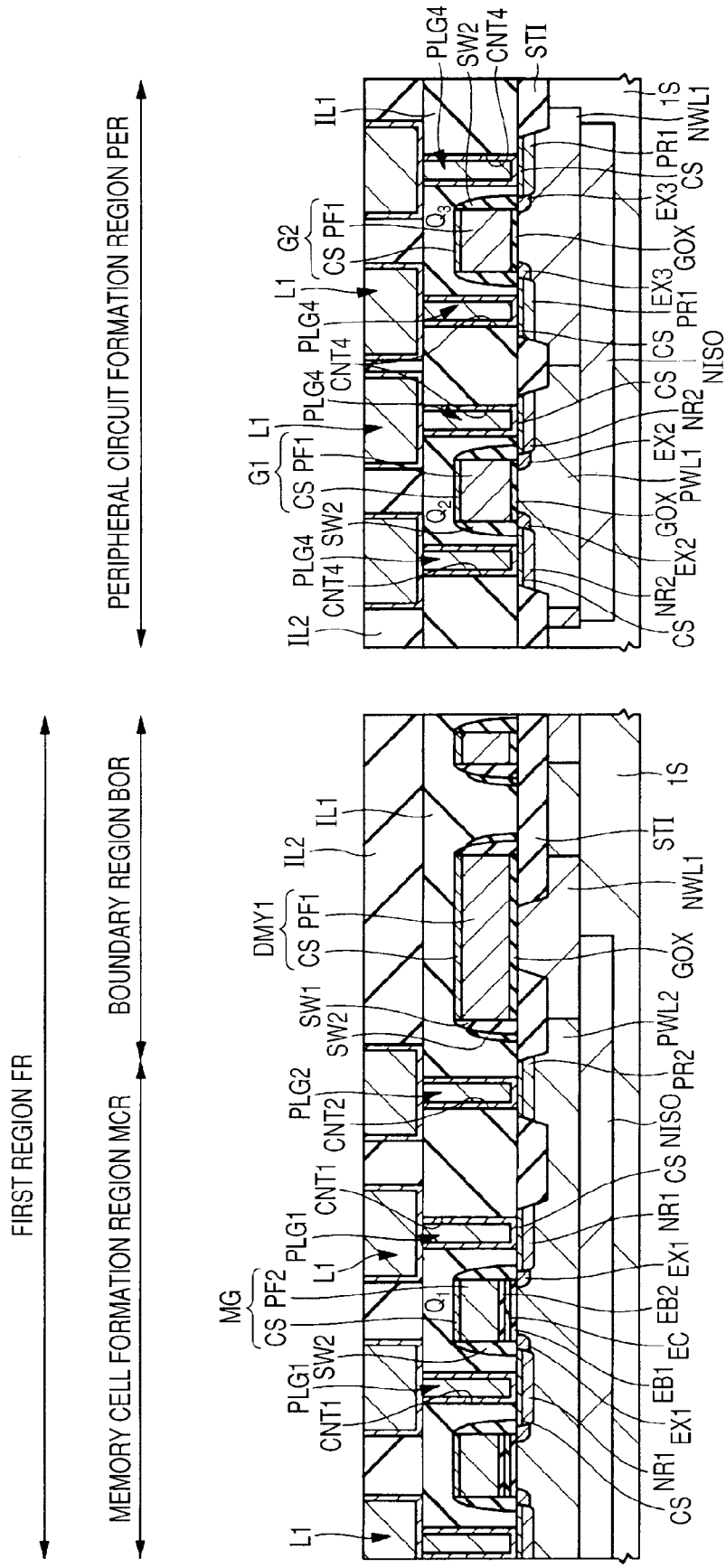
FIG. 26 is a cross-sectional view showing a configuration of a semiconductor device in Embodiment 2.

Subsequently, FIG. 26 is a view showing a configuration of a MONOS type transistor $Q_1$ formed in the memory cell formation region MCR in the first region FR, the dummy gate electrode DMY1 formed in the boundary region BOR in the first region FR, and an n channel type MISFET $O_2$ and a p channel type MISFET $Q_3$ formed in the peripheral circuit formation region PER. The configuration of the semiconductor device shown in FIG. 26 is almost equivalent to the configuration of the semiconductor device in Embodiment 1 shown in FIG. 4. A different point therebetween resides in the configuration of the dummy gate electrodes DMY1. In Embodiment 1, the opening is provided in the central part of the dummy gate electrode DMY1, and the plug PLG3 is formed in the opening. In contrast, in Embodiment 2, no opening is provided in the dummy gate electrode DMY1. In other words, the dummy gate electrode DMY1 is in a simpler structure than that of the dummy gate electrode DMY1 in Embodiment 1.

The semiconductor device in Embodiment 2 is configured as described above. Below, a manufacturing method thereof will be described by reference to the accompanying drawings. The steps shown in FIGS. 11 through 21 are the same as those in Embodiment 1. As a result, Embodiment 2 can also provide the same effects as Embodiment 1. Namely, also in Embodiment 2, as shown in FIGS. 19 and 20, the dummy gate electrode DMY1 including the polysilicon film PF1 is formed. Accordingly, the step difference portion DIF due to the polysilicon film PF1 is formed at the boundary between the memory cell formation region MCR and the boundary region BOR. In addition, the gap groove GAP is formed in the boundary region BOR. In other words, the formation of the dummy gate electrode DMY1 results in the formation of the gap groove GAP between the dummy gate electrode DMY1 and a portion of the polysilicon film PF1 covering the peripheral circuit formation region PER. As a result, the polysilicon film PF2 formed in such a manner as to cover the polysilicon film PF1 including the dummy gate electrode DMY1 is formed reflecting the shapes of the step difference portion DIF due to the end of the dummy gate electrode DMY1 and the gap groove GAP in the inside of the boundary region BOR. For this reason, the polysilicon film PF2 is in the shape of a step at the step difference portion DIF, and includes the concave part CON filling the gap groove GAP formed therein. Thus, the polysilicon film PF2 is formed in such a shape. Consequently, even when a portion of the antireflection film BARC formed in the higher region in the vicinity of the step difference portion DIF flows to the lower region, a portion of the antireflection film BARC having a high flowability stored in the concave part CON is fed to the higher region in the vicinity of the step difference portion DIF. As a result, even when, in the higher region in the vicinity of the step difference portion DIF, a portion of the antireflection film BARC flows to the lower region, a portion of the antireflection film BARC is successively supplied from the concave part CON. For this reason, even in the higher region in the vicinity of the step difference portion DIF, the antireflection film BARC is not eliminated, and the antireflection film BARC with a prescribed film thickness can be ensured. Accordingly, it is possible to form the antireflection film BARC with a film thickness enough for inhibiting reflection in the region in the vicinity of the step difference portion DIF. As a result, according to Embodiment 2, it is possible to inhibit unintended irregular reflection of exposure light, which can improve the patterning precision of the resist film FR5. Therefore, the patterning precision of the resist film FR5 has been improved. This can provide a remarkable effect of being capable of improving the processing precision of the memory gate electrodes MG.

Figure 27:
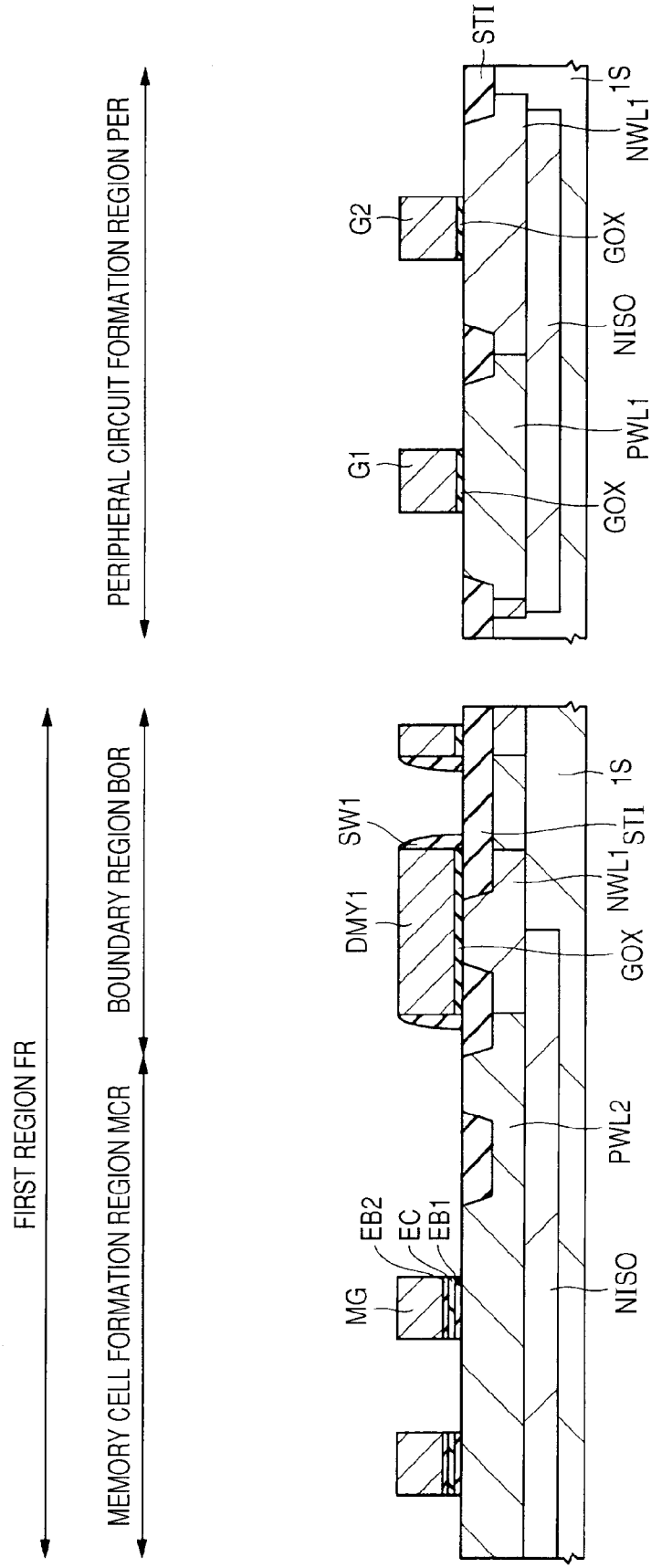
FIG. 27 is a cross-sectional view showing a manufacturing step of the semiconductor device in Embodiment 2.

Subsequently, as shown in FIG. 27, by using the photolithography technology and the etching technology, the polysilicon film PF1 formed in the peripheral circuit formation region PER is processed. As a result, in the peripheral circuit formation region PER, the gate electrode G1 and the gate electrode G2 including the polysilicon film PF1 are formed. At this step, in Embodiment 1 described above, the dummy gate electrode DMY1 formed in the boundary region BOR is also processed, thereby to form an opening. However, in Embodiment 2, the processing of forming an opening in the dummy gate electrode DMY1 is not carried out. This can simplify the manufacturing process.

Figure 28:
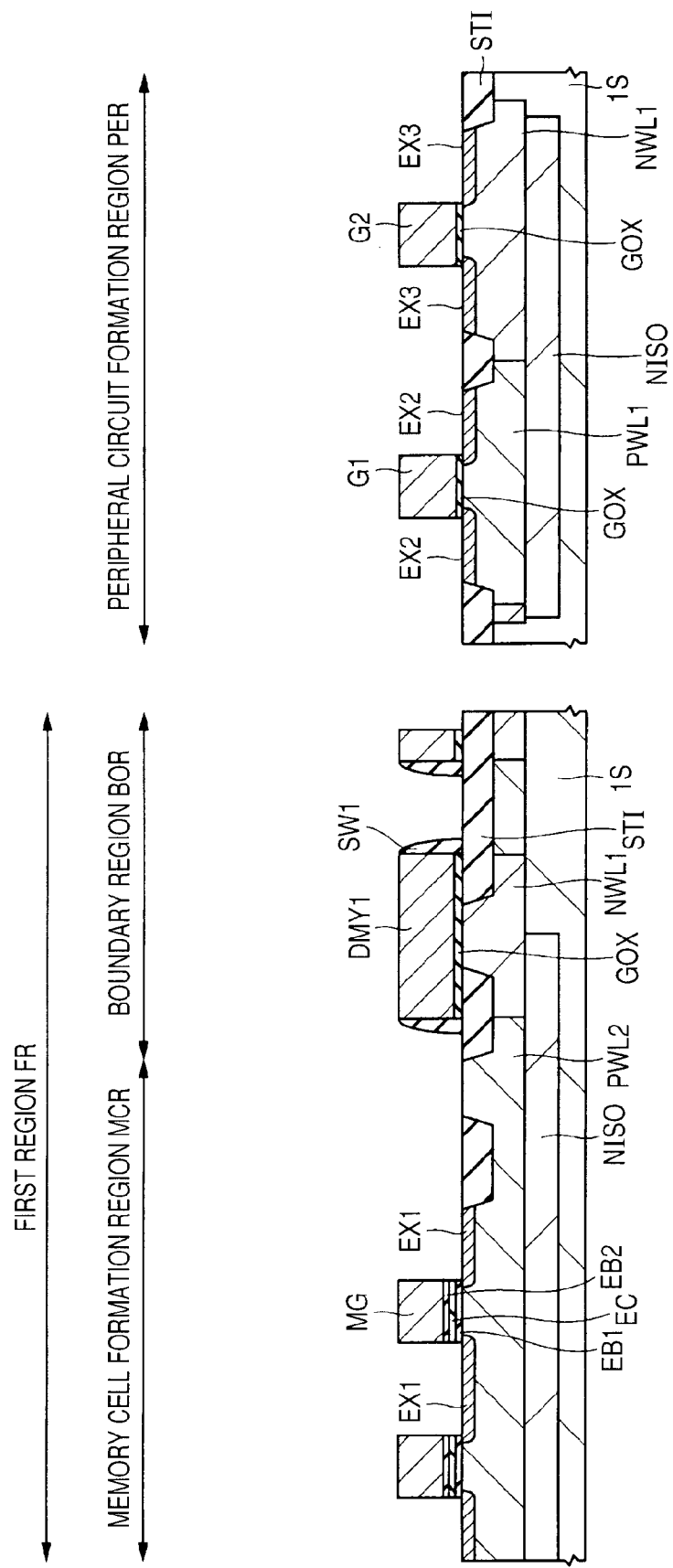
FIG. 28 is a cross-sectional view showing a manufacturing step of the semiconductor device subsequent to FIG. 27.

Then, as shown in FIG. 28, by using the photolithography technology and the ion implantation method, in the memory cell formation region MCR, the shallow n type impurity diffusion regions EX1 are formed in alignment with the memory gate electrodes MG. Similarly, in the peripheral circuit formation region PER, the shallow n type impurity diffusion regions EX2 are formed in alignment with the gate electrode G1, and the shallow p type impurity diffusion regions EX3 are formed in alignment with the gate electrode G2.

Figure 29:
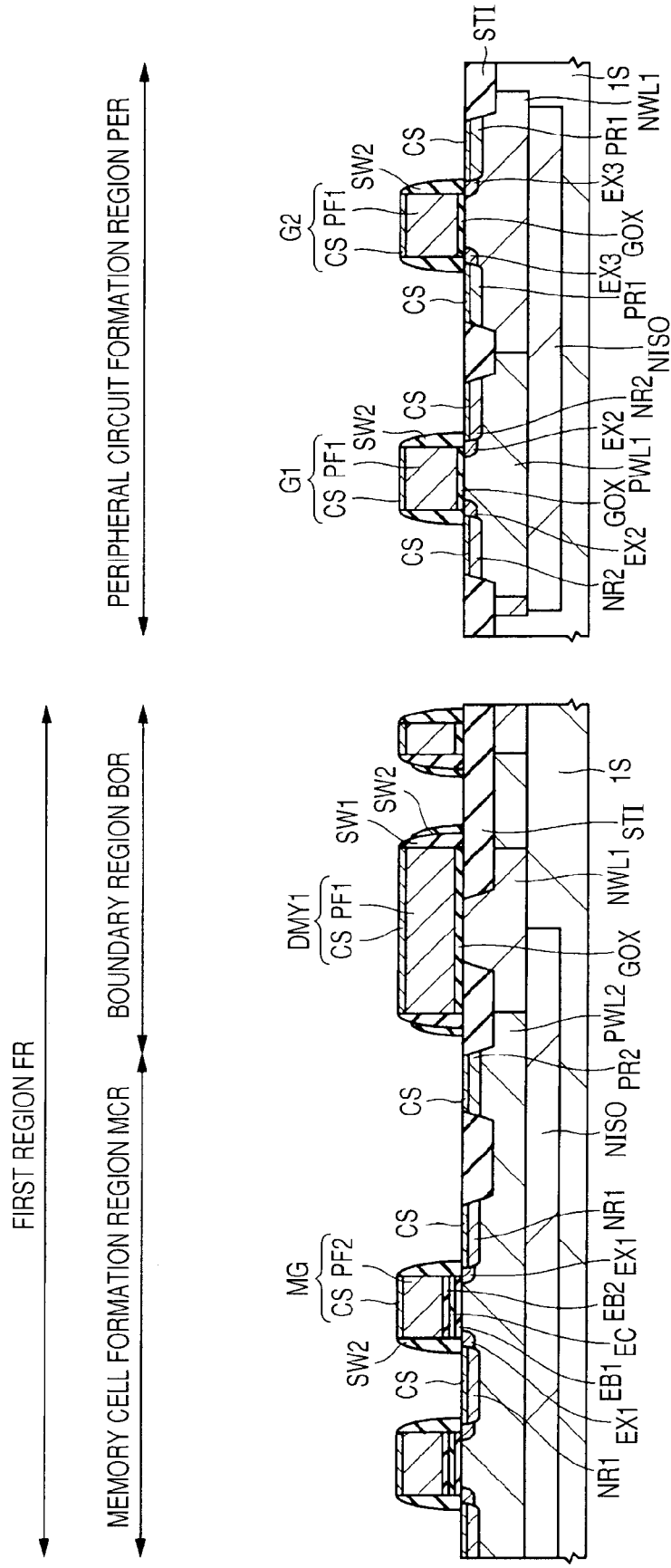
FIG. 29 is a cross-sectional view showing a manufacturing step of the semiconductor device subsequent to FIG. 28.

Subsequently, as shown in FIG. 29, the sidewalls SW2 are formed over the sidewalls of the memory gate electrodes MG, the dummy gate electrodes DMY1, the gate electrode G1, and the gate electrode G2. Then, in the memory cell formation region MCR, deep n type impurity diffusion regions NR1 are formed in alignment with the sidewalls SW2 formed over the sidewalls of the memory gate electrode MG. Further, the p type semiconductor region PR2 is formed over the surface of the p type well PWL2 exposed to the outside of the memory gate electrode MG formed in the outermost periphery. On the other hand, in the peripheral circuit formation region PER, the deep n type impurity diffusion regions NR2 are formed in alignment with the sidewalls SW2 formed over the sidewalls of the gate electrode G1, and the deep p type impurity diffusion region PR1 are formed in alignment with the sidewalls SW2 formed over the sidewalls of the gate electrode G2.

Then, the cobalt silicide film CS is formed over each surface of the memory gate electrodes MG, the deep n type impurity diffusion regions NR1, the p type semiconductor region PR2, the dummy gate electrodes DMY1, the gate electrode G1, the deep n type impurity diffusion regions NR2, the gate electrode G2, and the deep p type impurity diffusion regions PR1.

Then, a wiring step is carried out in the same manner as in Embodiment 1. In this manner, the semiconductor device in Embodiment 2 as shown in FIG. 26 can be manufactured.

(Embodiment 3) In Embodiments 1 and 2 described above, there were shown examples in which the dummy gate electrodes DMY1 were left. However, in Embodiment 3, a description will be given to an example in which the dummy gate electrode DMY1 is finally removed.

Figure 30:
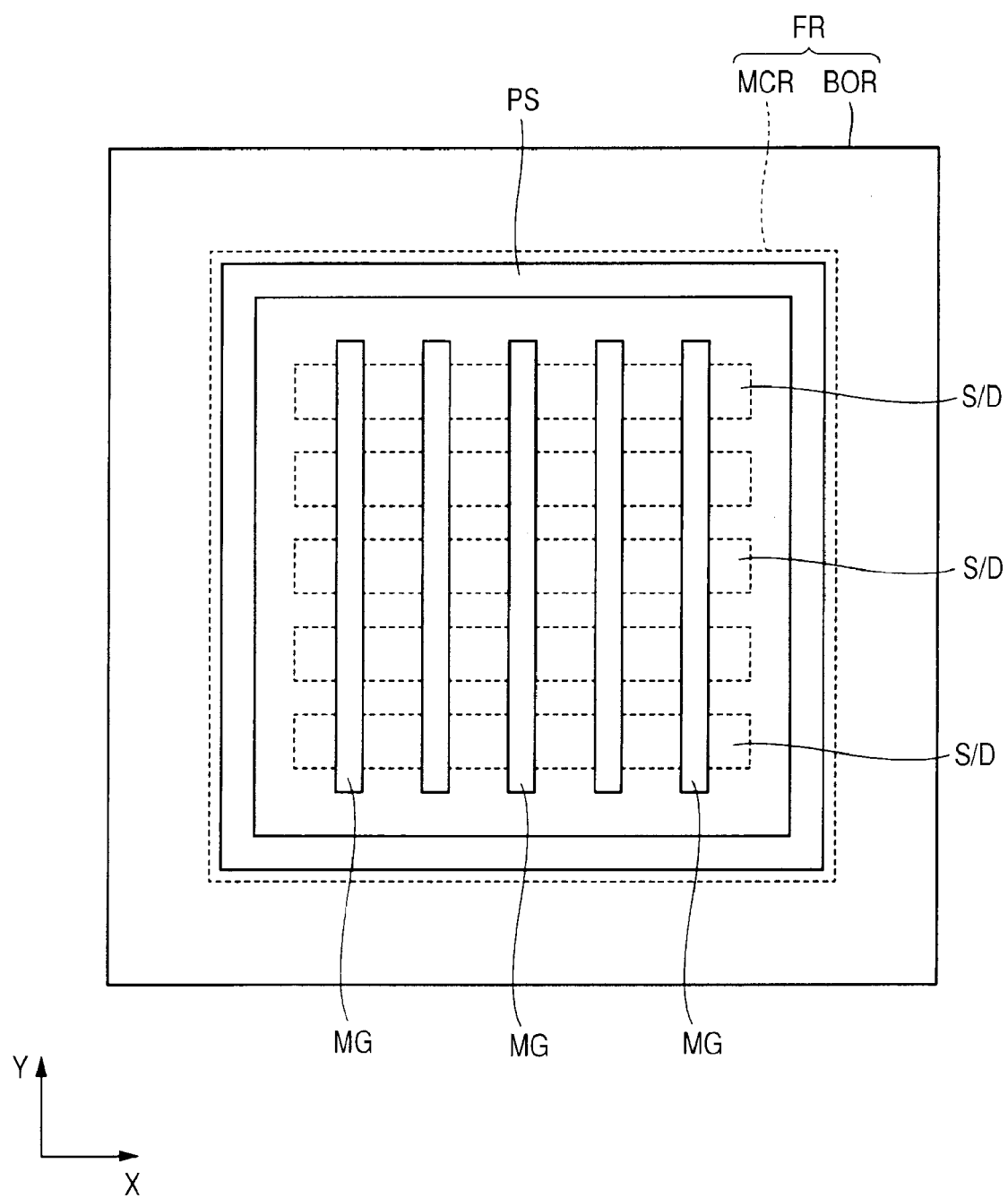
FIG. 30 is a view schematically showing a memory cell array in Embodiment 3.

FIG. 30 is a view schematically showing a memory cell array in Embodiment 3. In FIG. 30, there are shown the memory cell formation region MCR, and the boundary region BOR formed on the outside of the memory cell formation region MCR. A combined region of the memory cell formation region MCR and the boundary region BOR is defined as a first region FR. Then, although not shown in FIG. 30, there exists a peripheral circuit formation region including a peripheral circuit formed therein on the outside of the first region FR.

First, in FIG. 30, in the memory cell formation region MCR, a plurality of memory cells are formed. Specifically, there exist a plurality of memory gate electrodes MG (word lines) along a Y axis direction. Then, there exist a plurality of source regions/drain regions S/D in an X axis direction orthogonal to the Y axis direction. A memory cell is formed in each region of intersection of the memory gate electrodes MG and the source regions/drain region S/D. Therefore, in FIG. 30, a plurality of memory cells are arranged in an array (in a matrix). The region including a plurality of memory cells arranged in an array therein corresponds to the storage unit of the flash memory. Each individual memory cell is a circuit for storing 1 bit of unit information, and includes a MONOS type transistor serving as a storage unit. On the outside of the region including a plurality of the memory cells formed therein, a power supply region PS is formed. From the power supply region PS, a potential is supplied to a well (not shown) common to respective memory cells.

Then, on the outside of the memory cell formation region MCR, the boundary region BOR is formed. In Embodiment 3, in the boundary region BOR, no dummy gate electrode (dummy gate) is formed. In other words, in Embodiment 3, the dummy gate electrode is finally removed.

Figure 31:
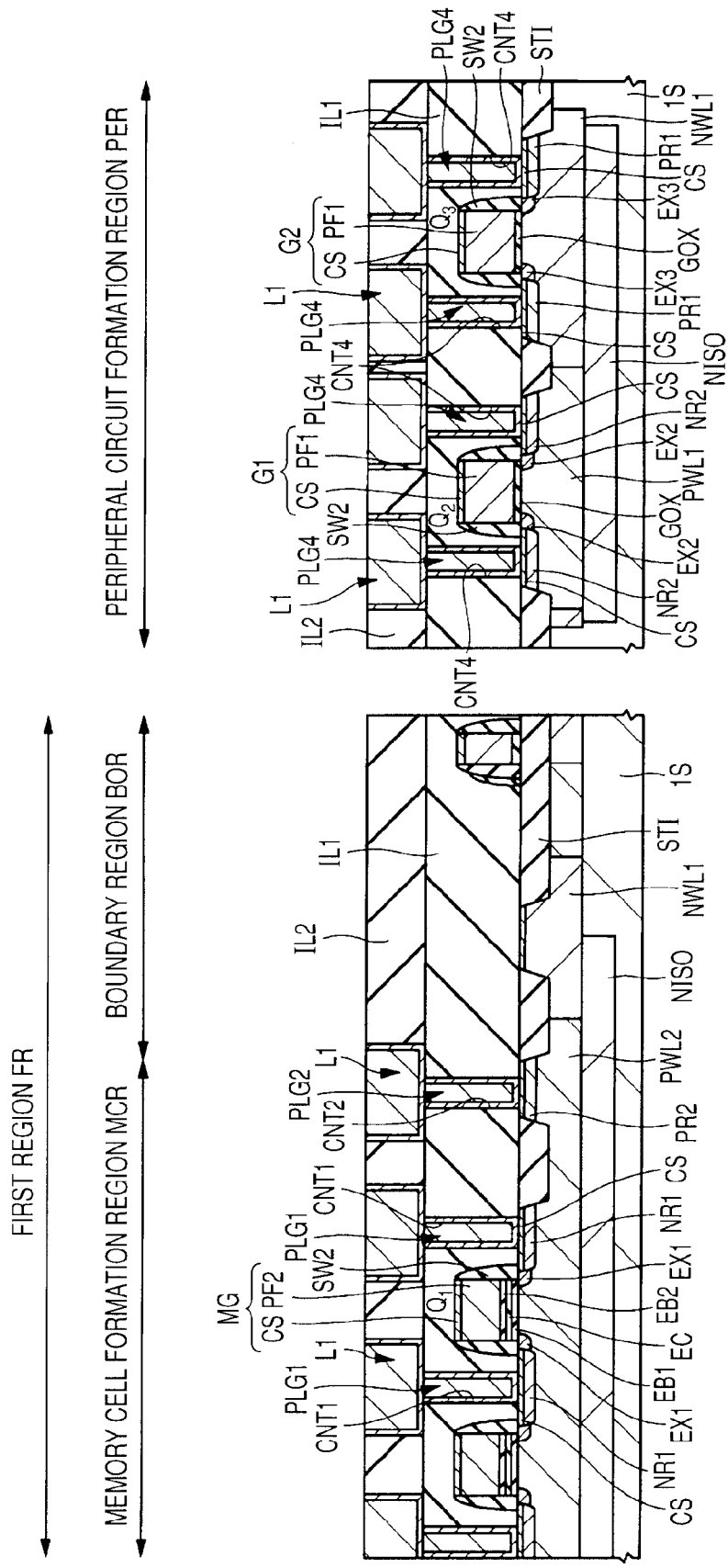
FIG. 31 is a cross-sectional view showing a configuration of a semiconductor device in Embodiment 3.

Subsequently, FIG. 31 is a view showing a configuration of a MONOS type transistor $Q_1$ formed in the memory cell formation region MCR in the first region FR, and an n channel type MISFET $Q_2$ and a p channel type MISFET $Q_3$ formed in the peripheral circuit formation region PER. The configuration of the semiconductor device in Embodiment 3 shown in FIG. 31 is almost equivalent to the configuration of the semiconductor device in Embodiment 1 shown in FIG. 4. A different point therebetween resides in that the dummy gate electrode has been finally removed.

The semiconductor device in Embodiment 3 is configured as described above. Below, a manufacturing method thereof will be described by reference to the accompanying drawings. The steps shown in FIGS. 11 through 21 are the same as those in Embodiment 1. As a result, Embodiment 3 can also provide the same effects as Embodiment 1. Namely, also in Embodiment 3, as shown in FIGS. 19 and 20, the dummy gate electrode DMY1 including the polysilicon film PF1 is formed. Accordingly, the step difference portion DIF due to the polysilicon film PF1 is formed at the boundary between the memory cell formation region MCR and the boundary region BOR. In addition, the gap groove GAP is formed in the boundary region BOR. In other words, the formation of the dummy gate electrode DMY1 results in the formation of the gap groove GAP between the dummy gate electrode DMY1 and a portion of the polysilicon film PF1 covering the peripheral circuit formation region PER. As a result, the polysilicon film PF2 formed in such a manner as to cover the polysilicon film PF1 including the dummy gate electrode DMY1 is formed reflecting the shapes of the step difference portion DIF due to the end of the dummy gate electrode DMY1 and the gap groove GAP in the inside to the boundary region BOR. For this reason, the polysilicon film PF2 is in the shape of a step at the step difference portion DIF, and includes the concave part CON filling the gap groove GAP formed therein. Thus, the polysilicon film PF2 is formed in such a shape. Consequently, even when a portion of the antireflection film BARC formed in the higher region in the vicinity of the step difference portion DIF flows to the lower region, a portion of the antireflection film BARC having a high flowability stored in the concave part CON is fed to the higher region in the vicinity of the step difference portion DIF. As a result, even when, in the higher region in the vicinity of the step difference portion DIF, a portion of the antireflection film BARC flows to the lower region, a portion of the antireflection film BARC is successively supplied from the concave part CON. For this reason, even in the higher region in the vicinity of the step difference portion DIF, the antireflection film BARC is not eliminated, and the antireflection film BARC with a prescribed film thickness can be ensured. Accordingly, it is possible to form the antireflection film BARC with a film thickness enough for inhibiting reflection in the region in the vicinity of the step difference portion DIF. As a result, according to Embodiment 3, it is possible to inhibit unintended irregular reflection of exposure light, which can improve the patterning precision of the resist film FR5. Therefore, the patterning precision of the resist film FR5 has been improved. This can provide a remarkable effect of being also capable of improving the processing precision of the memory gate electrodes MG.

Figure 32:
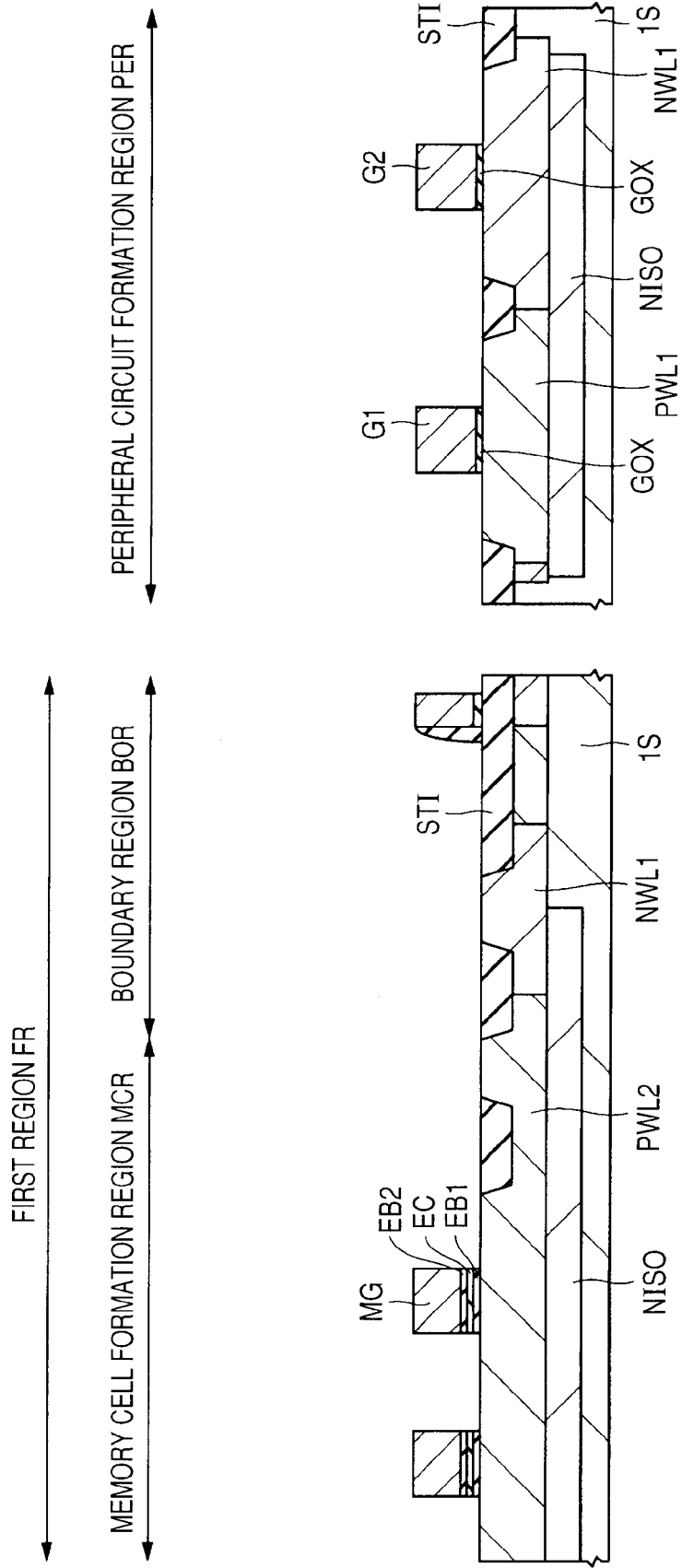
FIG. 32 is a cross-sectional view showing a manufacturing step of the semiconductor device in Embodiment 3.

Subsequently, as shown in FIG. 32, by using the photolithography technology and the etching technology, the polysilicon film PF1 formed in the peripheral circuit formation region PER is processed. As a result, in the peripheral circuit formation region PER, the gate electrode G1 and the gate electrode G2 including the polysilicon film PF1 are formed. At this step, in Embodiment 1 described above, the dummy gate electrode DMY1 formed in the boundary region BOR is also processed, thereby to form an opening. However, in Embodiment 3, the dummy gate electrode DMY1 is removed.

Figure 33:
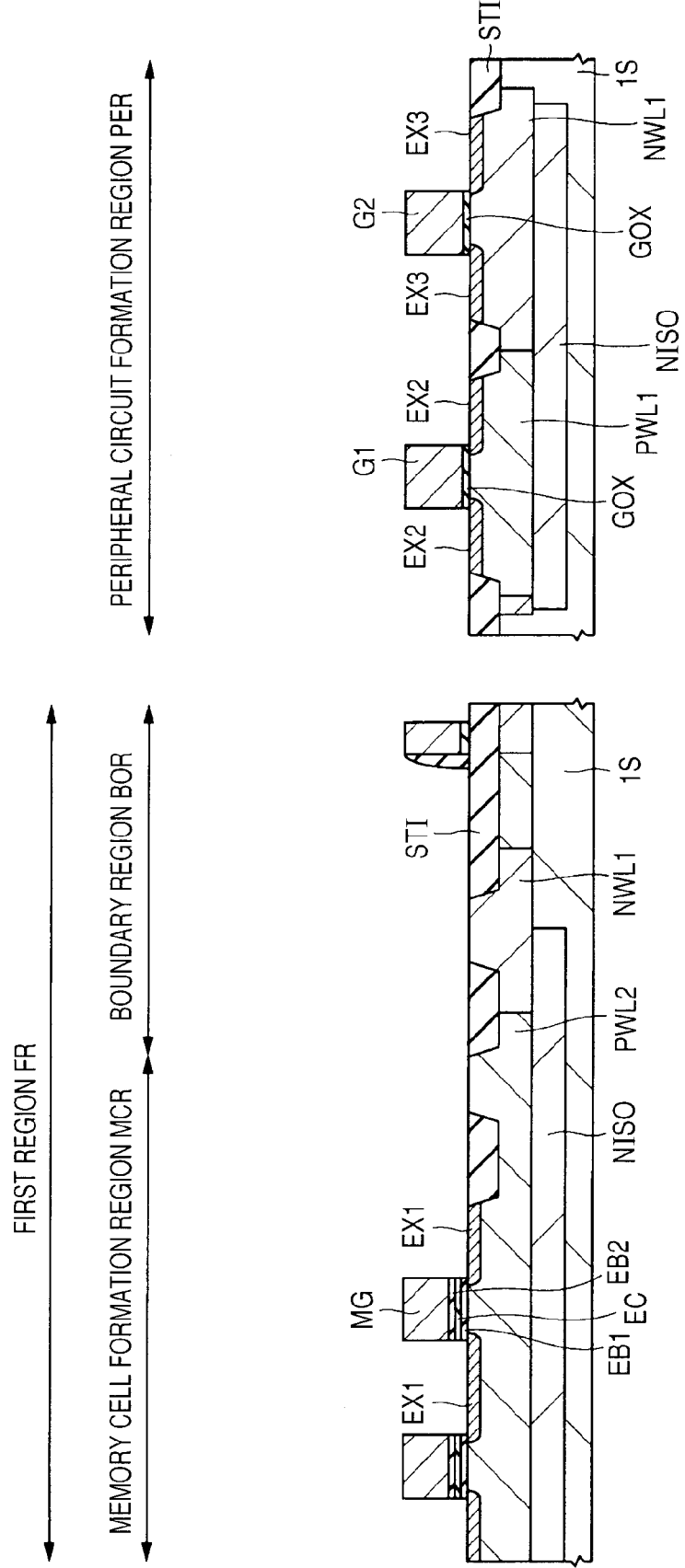
FIG. 33 is a cross-sectional view showing a manufacturing step of the semiconductor device subsequent to FIG. 32.

Then, as shown in FIG. 33, by using the photolithography technology and the ion implantation method, in the memory cell formation region MCR, the shallow n type impurity diffusion regions EX1 are formed in alignment with the memory gate electrode MG. Similarly, in the peripheral circuit formation region PER, the shallow n type impurity diffusion regions EX2 are formed in alignment with the gate electrode G1, and the shallow p type impurity diffusion regions EX3 are formed in alignment with the memory gate electrode G2.

Figure 34:
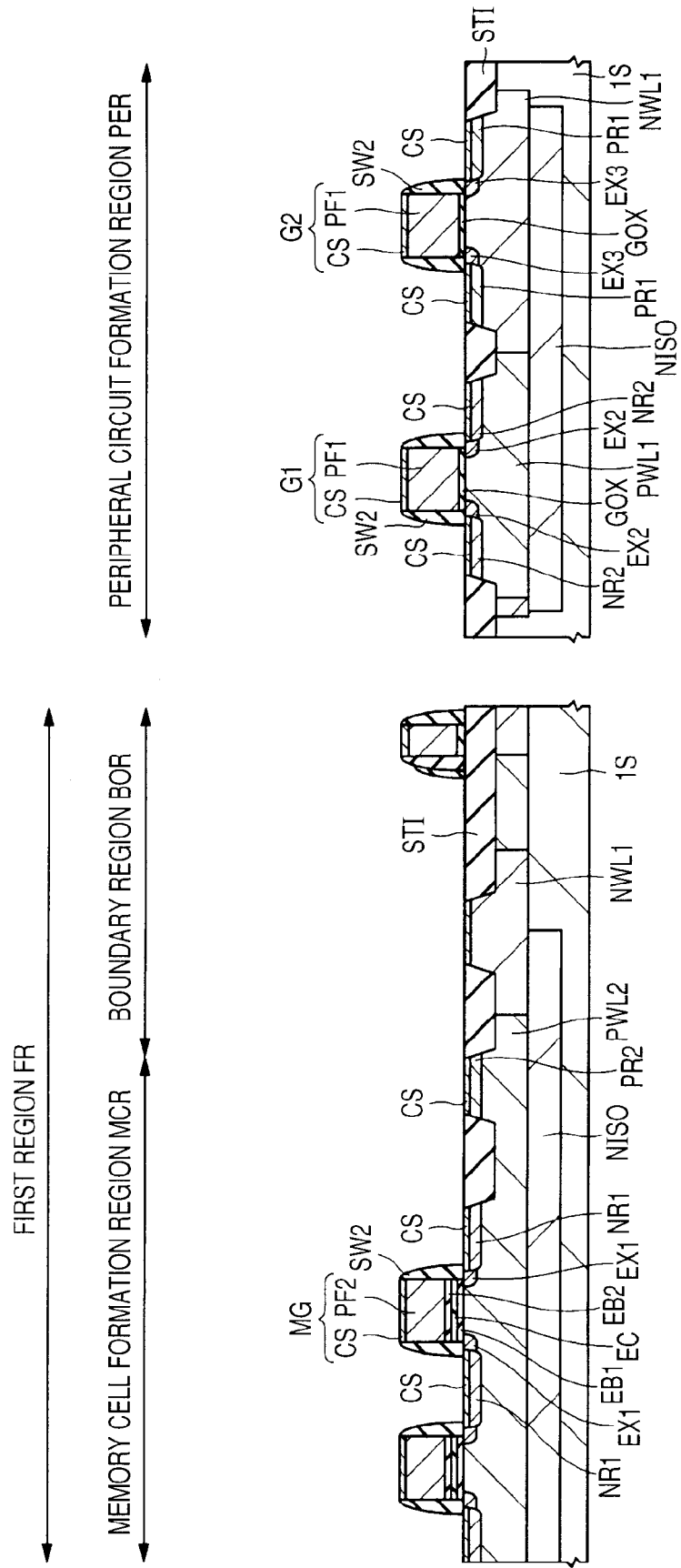
FIG. 34 is a cross-sectional view showing a manufacturing step of the semiconductor device subsequent to FIG. 33.

Subsequently, as shown in FIG. 34, the sidewalls SW2 are formed over the sidewalls of the memory gate electrodes MG, the gate electrode G1, and the gate electrode G2. Then, in the memory cell formation region MCR, deep n type impurity diffusion regions NR1 are formed in alignment with the sidewalls SW2 formed over the sidewalls of the memory gate electrode MG. Further, the p type semiconductor region PR2 is formed over the surface of the p type well PWL2 exposed to the outside of the memory gate electrode MG formed in the outermost periphery. On the other hand, in the peripheral circuit formation region PER, the deep n type impurity diffusion regions NR2 are formed in alignment with the sidewalls SW2 formed over the sidewalls of the gate electrode G1, and the deep p type impurity diffusion regions PR1 are formed in alignment with the sidewalls SW2 formed over the sidewalls of the gate electrode G2.

Then, the cobalt silicide film CS is formed over each surface of the memory gate electrodes MG, the deep n type impurity diffusion regions NR1, the p type semiconductor region PR2, the gate electrode G1, the deep n type impurity diffusion regions NR2, the gate electrode G2, and the deep p type impurity diffusion regions PR1.

Then, a wiring step is carried out in the same manner as in Embodiment 1. In this manner, the semiconductor device in Embodiment 3 as shown in FIG. 31 can be manufactured.

Figure 35:
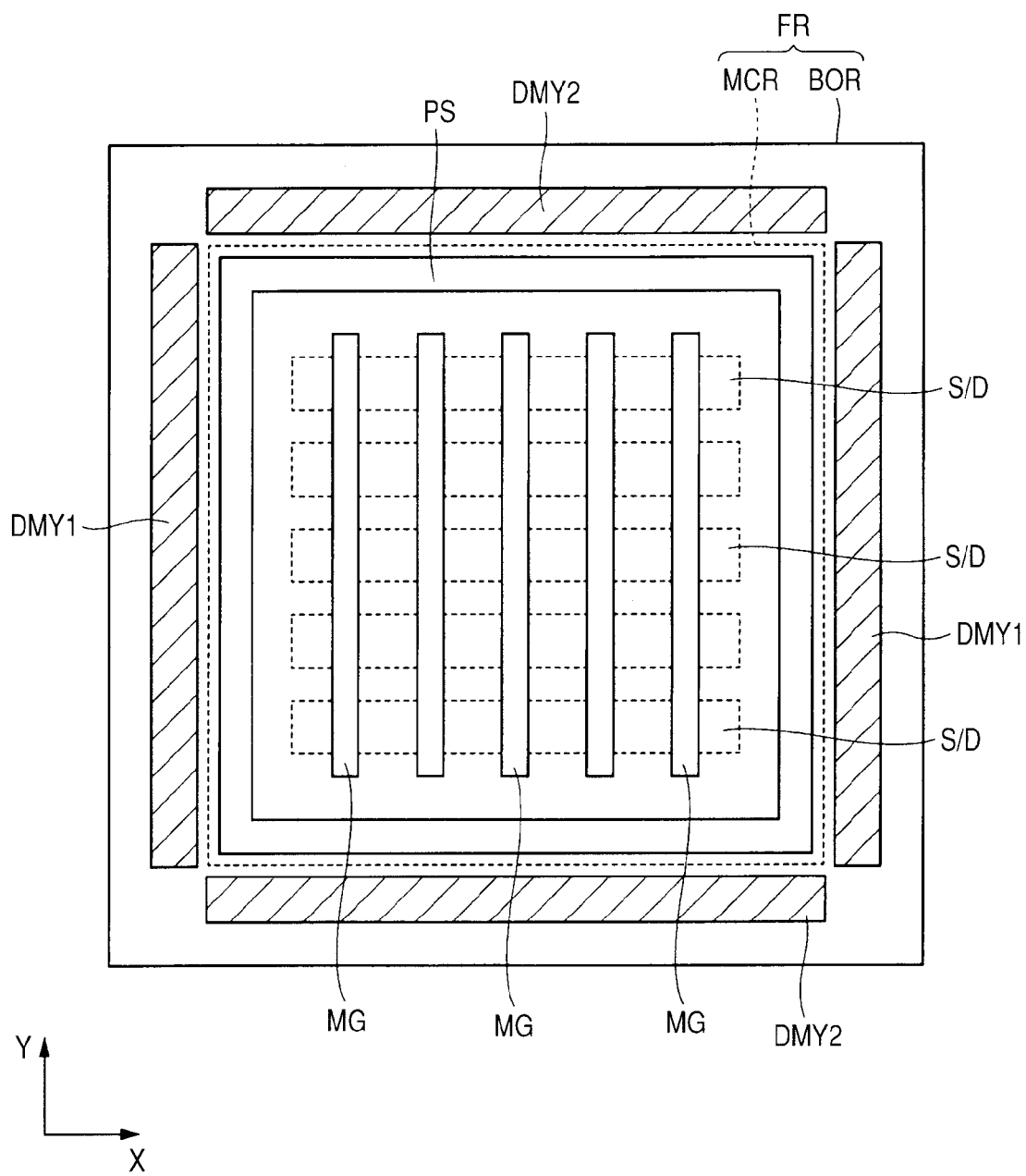
FIG. 35 is a view showing one example of a layout configuration of a memory cell array in Embodiment 4.

(Embodiment 4) In Embodiment 4, various layouts of a flash memory will be described. FIG. 35 is a view showing a layout example of the flash memory in Embodiment 4. FIG. 35 shows almost the same layout as that in FIG. 25. A different point therebetween resides in that, in FIG. 35, the dummy gate electrodes DMY1 extending in the Y axis direction are not coupled with the dummy gate electrodes DMY2 extending in the X axis direction. Even when the dummy gate electrodes DMY1 and the dummy gate electrodes DMY2 are thus arranged, the processing precision of the memory gate electrodes can be improved as with Embodiments 1 to 3.

Figure 36:
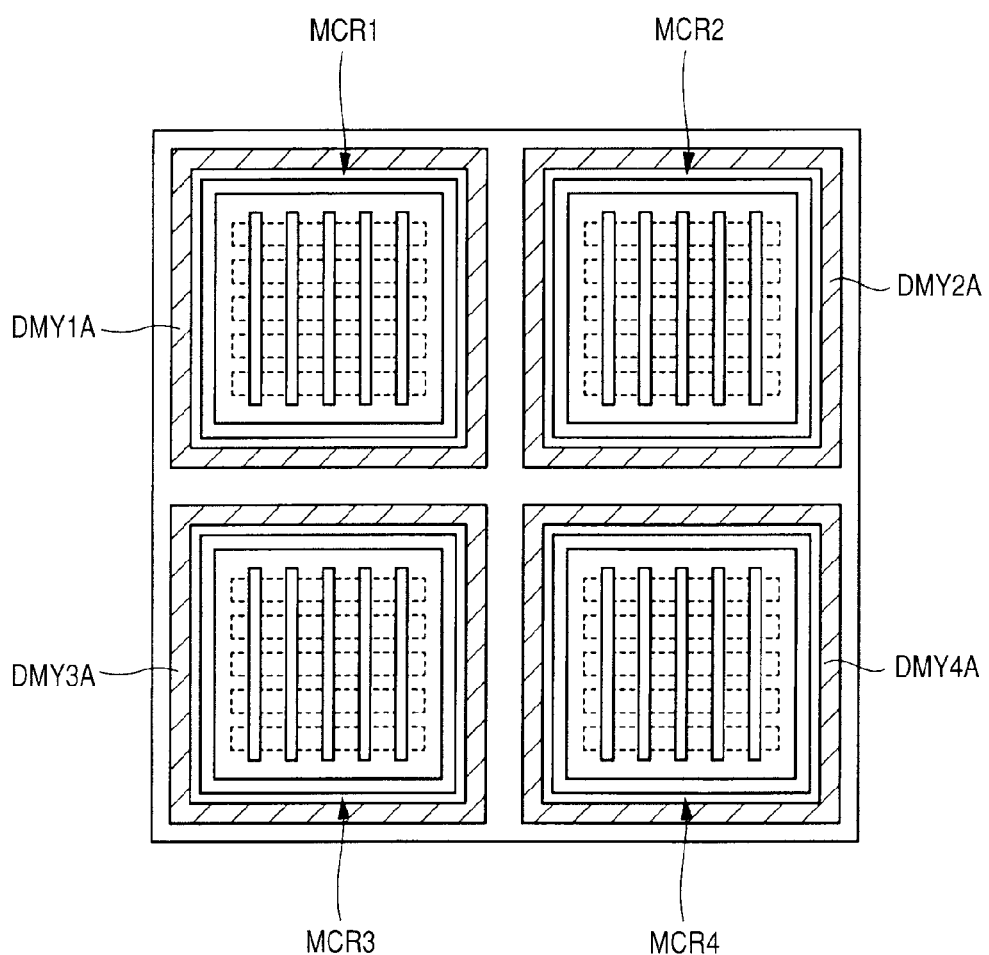
FIG. 36 is a view showing one example of a layout configuration of the memory cell array in Embodiment 4.

FIG. 36 is a view showing a layout example of the flash memory in Embodiment 4. In FIG. 36, as distinct from FIG. 25, a plurality of memory cell formation regions MCR1 to MCR4 are formed in the flash memory formation region. The memory cell array formed in each of the memory cell formation regions MCR1 to MCR4 has the same configuration as in FIG. 25. In FIG. 36, in respective memory cell formation regions MCR1 to MCR4, p type wells (not shown) are respectively formed. However, respective p type wells are electrically independent of each other. Thus, in Embodiment 4, a plurality of memory cell formation regions MCR1 to MCR4 are formed in the flash memory formation region. Thus, dummy gate electrodes DMY1A to DMY4A are formed in such a manner as to surround their corresponding memory cell formation regions MCR1 to MCR4, respectively. This can improve the processing precision of the memory gate electrodes formed in respective memory cell formation regions MCR1 to MCR4.

Figure 37:
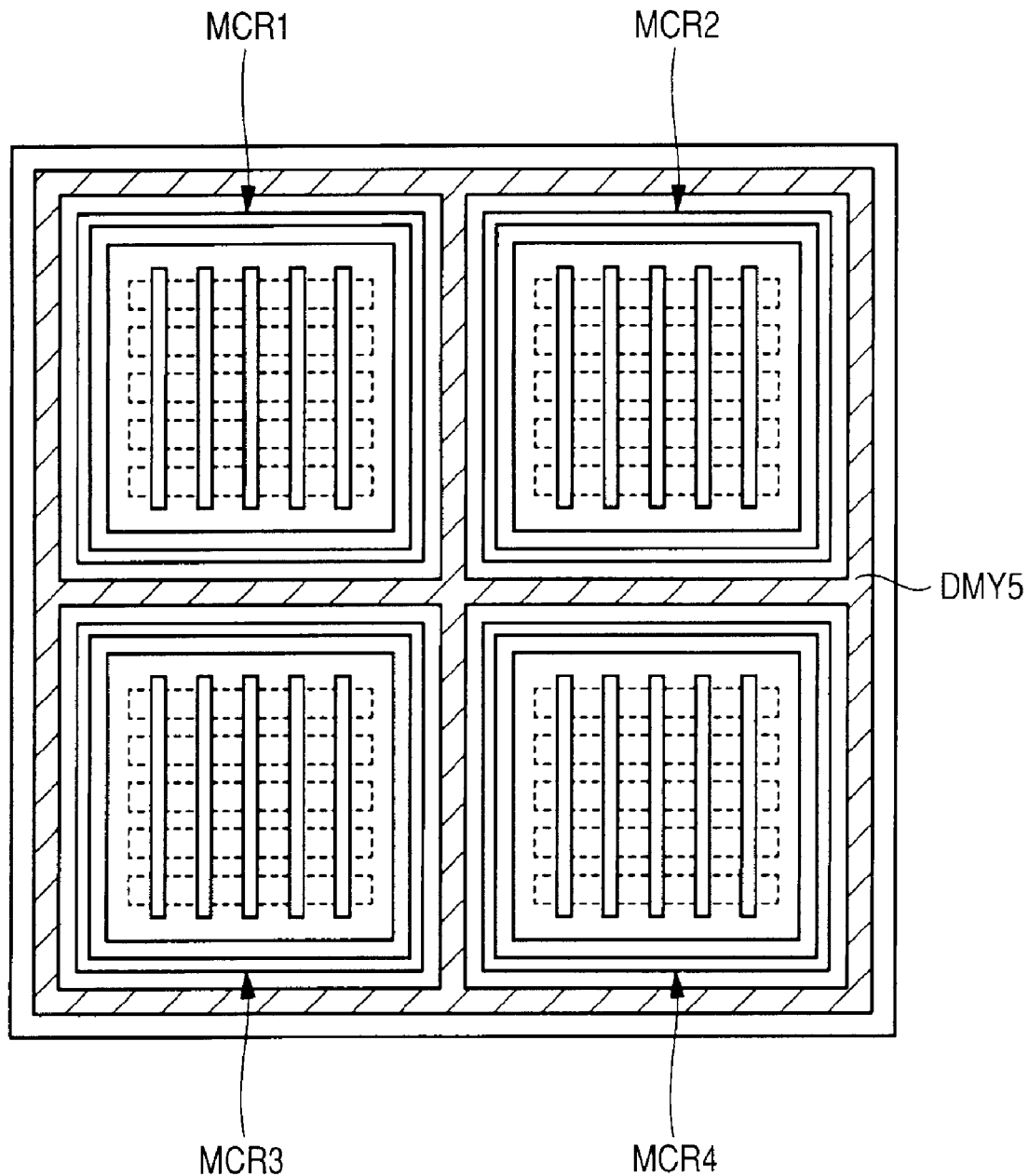
FIG. 37 is a view showing one example of a layout configuration of the memory cell array in Embodiment 4.

FIG. 37 is a view showing a modified example of FIG. 36. Also in FIG. 37, a plurality of memory cell formation regions MCR1 to MCR4 are formed in the flash memory formation region. A dummy gate electrode DMY5 is formed in such a manner as to surround respective memory cell formation regions MCR1 to MCR4. Also in this case, it is possible to improve the processing precision of the memory gate electrodes formed in respective memory cell formation regions MCR1 to MCR4.

Figure 38:
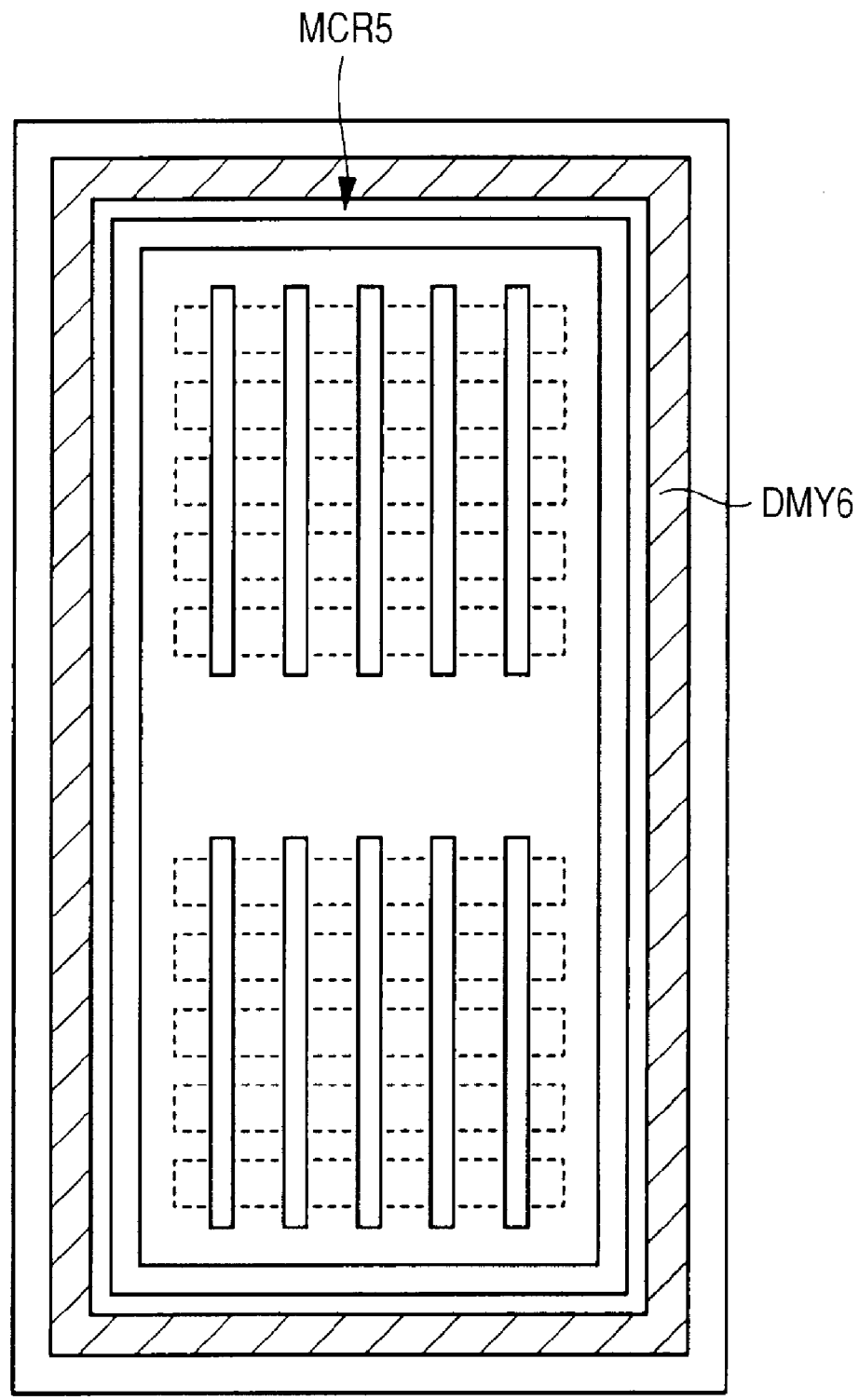
FIG. 38 is a view showing one example of a layout configuration of the memory cell array in Embodiment 4.

FIG. 38 is a view showing a layout example of the flash memory in Embodiment 4. In FIG. 38, in a memory cell formation region MCR5, two independent memory cell arrays are formed. Then, a dummy gate electrode DMY6 is formed in such a manner as to surround the two independent memory cell arrays. Also in this case, it is possible to improve the processing precision of the memory gate electrodes formed in the memory cell formation region MCR5.

Up to this point, the invention made by the present inventors was specifically described by way of embodiments. However, the present invention is not limited to the embodiments. It is naturally understood that various changes may be made within the scope not departing from the gist thereof.

The present invention can be widely utilized in manufacture for manufacturing semiconductor devices.

What is claimed is:

1. A semiconductor device comprising a plurality of memory cells over a semiconductor substrate,
   wherein a first well of a first conductivity type is formed in the semiconductor substrate,
   wherein the plurality of memory cells are formed over the first well,
   wherein each of the memory cells comprises:
   a gate insulating film formed over the first well, the gate insulating film including an electric charge storage film; and
   a gate electrode formed over the gate insulating film, the gate electrode being formed of a first conductive film,
   wherein the gate electrodes of the memory cells extend in a first direction and are arranged in a second direction perpendicular to the first direction such that the plurality of memory cells are arranged in an array,
   wherein a pair of first dummy gate pairs extend in the first direction with the array being interposed therebetween,
   wherein a pair of second dummy gate pairs extend in the second direction with the array being interposed therebetween,
   wherein a second well of a second conductivity type opposite to the first conductivity type is formed in the semiconductor substrate, the second well being formed deeper than the first well,
   wherein a third well of the second conductivity type is formed in the semiconductor substrate, the third well being formed so as to be electrically coupled to the second well and to be overlapped in plan view with a first region including the pair of first dummy gate pairs formed therein,
   wherein an interlayer insulating film is formed over the plurality of gate electrodes, the pair of first dummy gate pairs and the pair of second dummy gate pairs, and
   wherein a first plug is formed in the interlayer insulating film so as to be electrically coupled to the third well.

2. A semiconductor device according to claim 1,
   wherein a second plug is formed in the interlayer insulating film so as to be electrically coupled to the first well, and wherein the second plug is arranged in a second region interposed between the pair of first dummy gate pairs and between the pair of second dummy gate pairs.

3. A semiconductor device according to claim 1, wherein the second well is formed for isolating the first well from the semiconductor substrate.

4. A semiconductor device according to claim 1, wherein the pair of first dummy gate pairs and the pair of second dummy gate pairs are coupled with each other, and are formed in such a manner as to surround the array.

5. A semiconductor device according to claim 1, wherein on the semiconductor substrate, a plurality of arrays are formed, and each of the arrays is interposed between a pair of the first dummy gate pairs and between a pair of the second dummy gate pairs.

6. A semiconductor device according to claim 1, wherein a plurality of element isolation regions are formed over the semiconductor substrate, wherein the pair of first dummy gate pairs and the pair of second dummy gate pairs are formed over the element isolation regions.

7. A semiconductor device according to claim 1, wherein the electric charge storage film is a silicon nitride film.

8. A semiconductor device according to claim 1, wherein the first conductivity type is a p-type, and the second conductivity type is an n-type.

* * * * *